(12) United States Patent
Na et al.

(10) Patent No.: US 11,966,077 B2
(45) Date of Patent: Apr. 23, 2024

(54) LIGHT EMISSION APPARATUS

(71) Applicant: ARTILUX, INC., Menlo Park, CA (US)

(72) Inventors: Yun-Chung Na, Hsinchu (TW); Chien-Lung Chen, Taoyuan (TW); Chieh-Ting Lin, Zhubei (TW); Yu-Yi Hsu, Zhubei (TW); Hui-Wen Chen, Zhubei (TW); Bo-Jiun Chen, Menlo Park, CA (US); Shih-Tai Chuang, Menlo Park, CA (US)

(73) Assignee: Artilux, Inc., Menlo Park, CA (US)

( * ) Notice: Subject to any disclaimer, the term of this patent is extended or adjusted under 35 U.S.C. 154(b) by 616 days.

(21) Appl. No.: 17/258,675

(22) PCT Filed: Jul. 8, 2019

(86) PCT No.: PCT/US2019/040873
§ 371 (c)(1),
(2) Date: Jan. 7, 2021

(87) PCT Pub. No.: WO2020/014154
PCT Pub. Date: Jan. 16, 2020

(65) Prior Publication Data
US 2021/0271022 A1    Sep. 2, 2021

Related U.S. Application Data

(60) Provisional application No. 62/751,602, filed on Oct. 27, 2018, provisional application No. 62/700,688, (Continued)

(51) Int. Cl.
*G02B 6/12* (2006.01)
*G01S 7/481* (2006.01)
(Continued)

(52) U.S. Cl.
CPC ........ *G02B 6/12004* (2013.01); *G01S 7/4817* (2013.01); *G01S 7/484* (2013.01);
(Continued)

(58) Field of Classification Search
CPC ...... G02B 6/12004; G02B 6/124; G02B 6/34; G02B 6/42; G01S 7/4817; G01S 7/484; H01S 5/0071; H01S 5/0085; H01S 5/3211
See application file for complete search history.

(56) References Cited

U.S. PATENT DOCUMENTS

| | | | |
|---|---|---|---|
| 5,673,284 | A | 9/1997 | Congdon et al. |
| 6,038,243 | A | 3/2000 | Mogi |

(Continued)

FOREIGN PATENT DOCUMENTS

| | | |
|---|---|---|
| CN | 102498424 | 6/2012 |
| CN | 104570202 | 4/2015 |

(Continued)

OTHER PUBLICATIONS

International Preliminary Report on Patentability in International Appln. No. PCT/US2019/040873, dated Jan. 21, 2021, 8 pages.

(Continued)

*Primary Examiner* — Michael P Mooney
(74) *Attorney, Agent, or Firm* — Fish & Richardson P.C.

(57) ABSTRACT

A light emission apparatus includes a laser diode configured to emit a light; a laser driver electrically coupled to the laser diode, the laser driver being configured to drive the laser diode to generate the light; and an optical module arranged to receive the light emitted by the laser diode, the optical module comprising at least one optical element and being configured to adjust the light and emits a transmitting light; wherein the transmitting light emits from the optical module (Continued)

with an illumination angle and the optical module adjusts the light to vary the illumination angle.

14 Claims, 99 Drawing Sheets

Related U.S. Application Data filed on Jul. 19, 2018, provisional application No. 62/695,062, filed on Jul. 8, 2018.

(51) Int. Cl.
*G01S 7/484* (2006.01)
*G02B 6/124* (2006.01)
*G02B 6/34* (2006.01)
*G02B 6/42* (2006.01)
*H01S 5/00* (2006.01)
*H01S 5/32* (2006.01)

(52) U.S. Cl.
CPC ............ *G02B 6/124* (2013.01); *G02B 6/34* (2013.01); *G02B 6/42* (2013.01); *H01S 5/0071* (2013.01); *H01S 5/0085* (2013.01); *H01S 5/3211* (2013.01); *G02B 2006/12097* (2013.01); *G02B 2006/12147* (2013.01); *G02B 2006/12154* (2013.01)

(56) References Cited

U.S. PATENT DOCUMENTS

| | | | |
|---|---|---|---|
| 7,090,133 | B2 | 8/2006 | Zhu |
| 7,961,301 | B2 | 6/2011 | Earhart et al. |
| 2007/0217469 | A1 | 9/2007 | DeFranza et al. |
| 2011/0052114 | A1 | 3/2011 | Bernasconi et al. |
| 2013/0163632 | A1 | 6/2013 | Arai et al. |
| 2013/0208495 | A1* | 8/2013 | Dau ................ G02B 1/045 362/551 |
| 2014/0000856 | A1 | 1/2014 | Kim et al. |
| 2014/0160745 | A1 | 6/2014 | Mandelboum et al. |

FOREIGN PATENT DOCUMENTS

| | | |
|---|---|---|
| CN | 106873076 | 6/2017 |
| CN | 107765363 | 3/2018 |
| CN | 107783361 | 3/2018 |
| DE | 102016104946 | 9/2017 |
| JP | 2001-339122 | 12/2001 |
| JP | 6332491 | 5/2018 |
| WO | WO 2013/156444 | 10/2013 |
| WO | WO 2016/187566 | 11/2016 |
| WO | WO 2017/148583 | 9/2017 |

OTHER PUBLICATIONS

International Search Report and Written Opinion in International Appln. No. PCT/US2019/040873, dated Nov. 14, 2019, 4 pages.
Search Report in European Appln. No. 19833226.4, dated Jul. 21, 2021, 7 pages.
Search Report in European Appln. No. 19833226.4, dated Oct. 21, 2021, 12 pages.
Office Action in Chinese Appln. No. 201980058512.4, dated Dec. 1, 2021, 15 pages (with English translation).
Search Report in European Appln. No. 22172858.7, dated Aug. 5, 2022, 9 pages.
Office Action in Taiwanese Appln. No. 11220053190, dated Jan. 13, 2023, 13 pages (with machine English translation).
Office Action in Chinese Appln. No. 201980058512.4, dated Jun. 30, 2022, 11 pages (with English translation).
Search Report in Chinese Appln. No. 201980058512.4, dated Jun. 23, 2022, 4 pages (with English translation).

\* cited by examiner

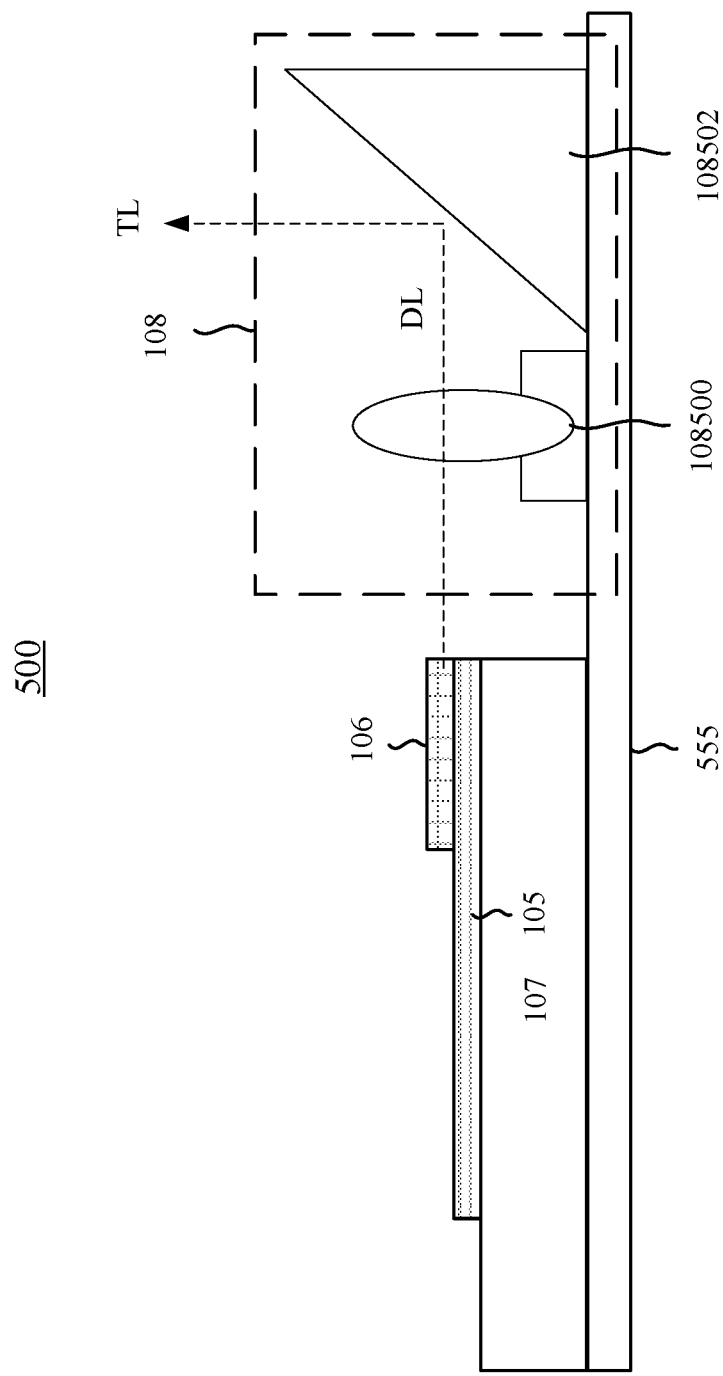

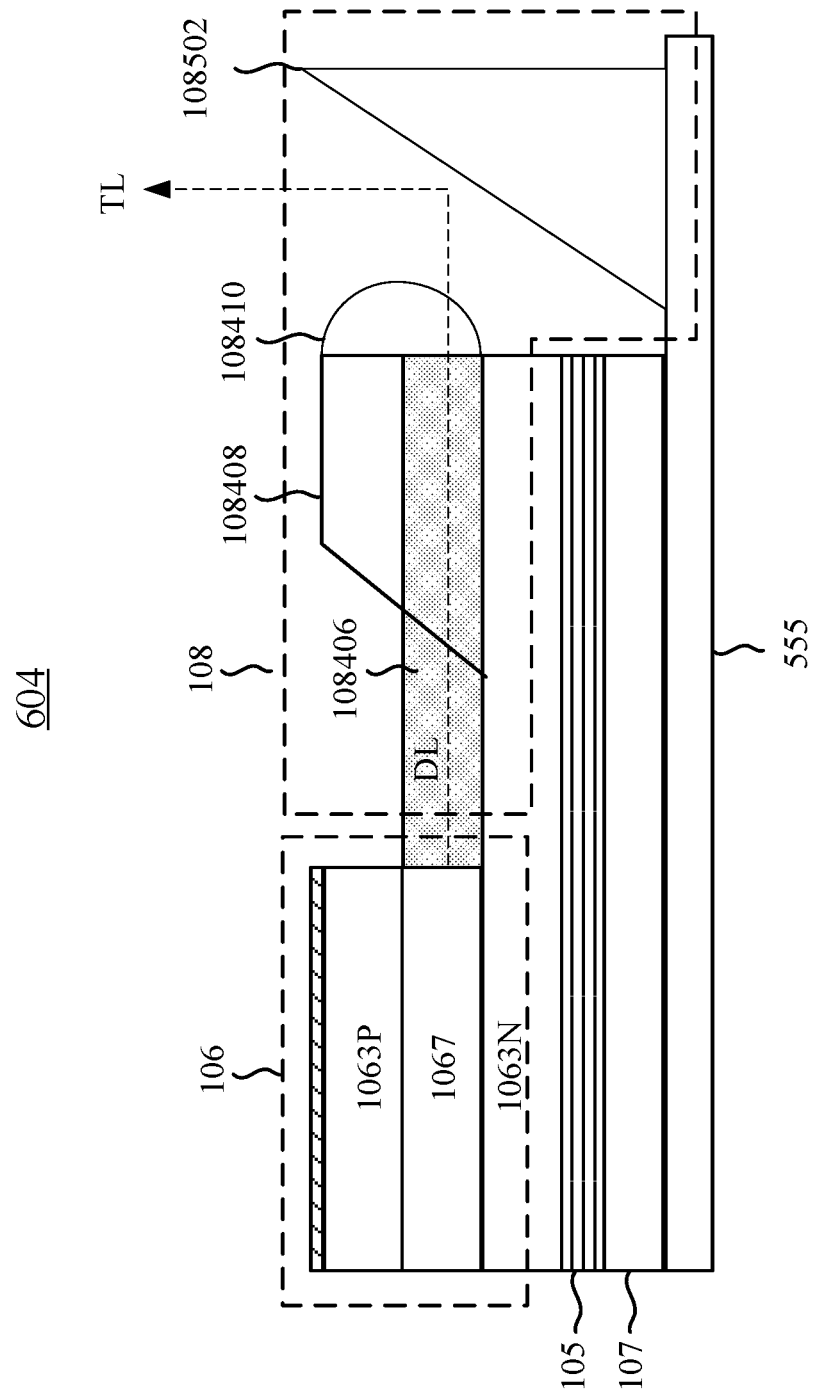

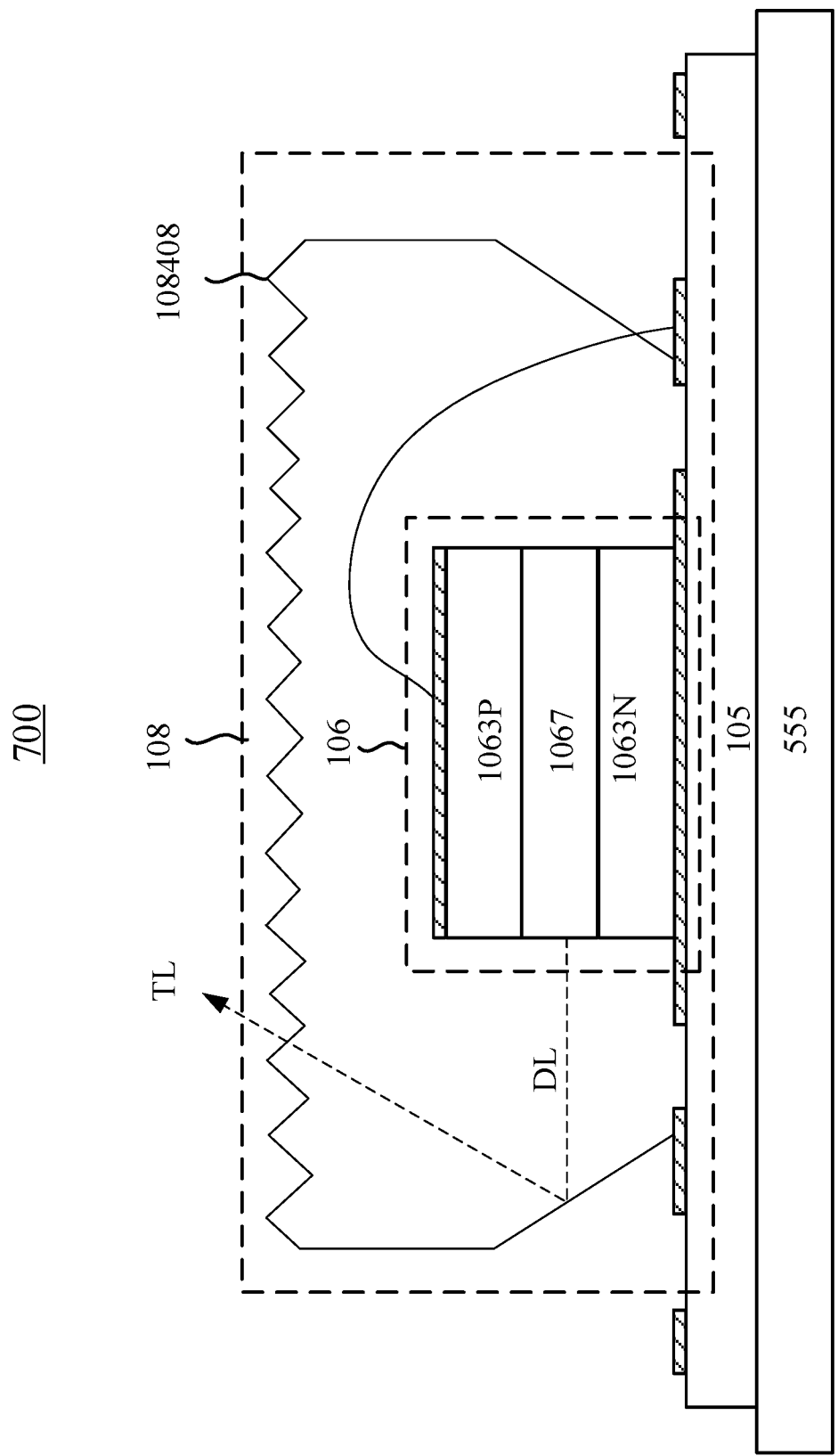

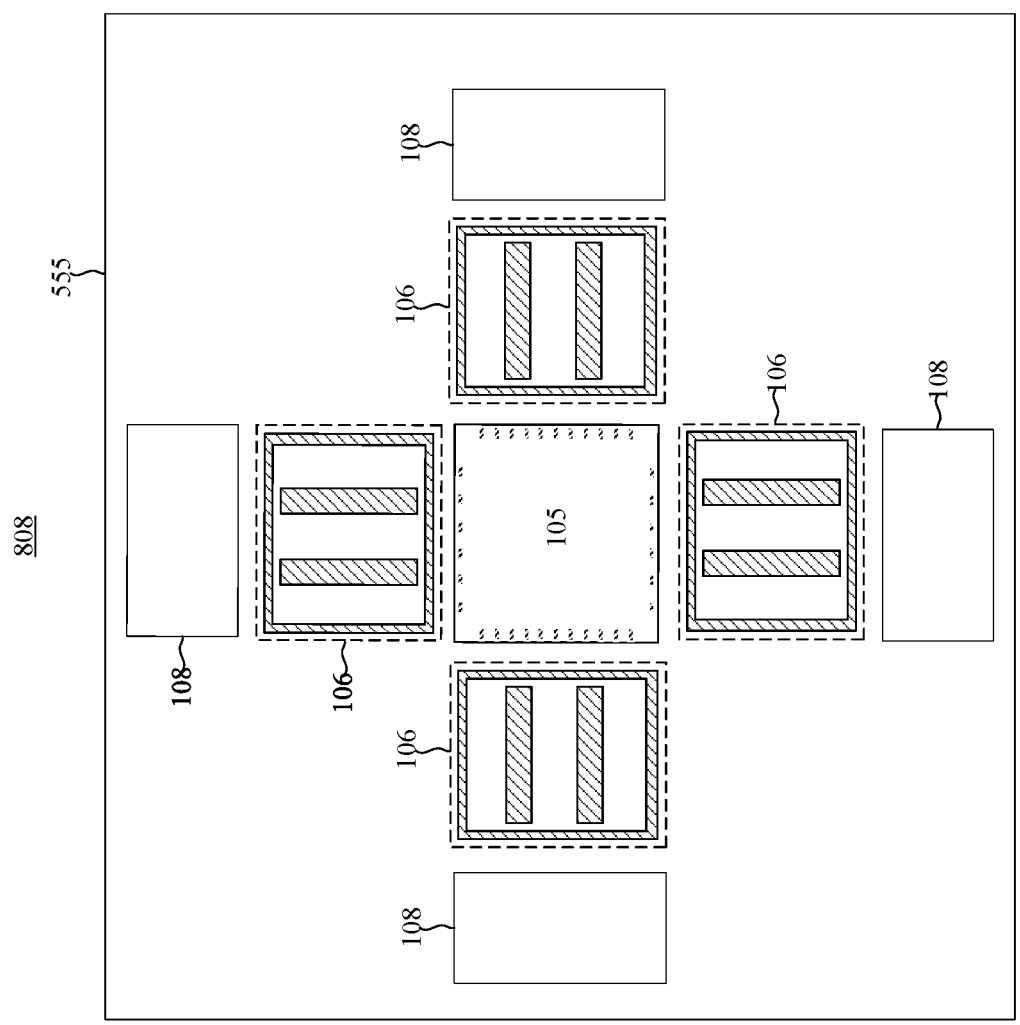

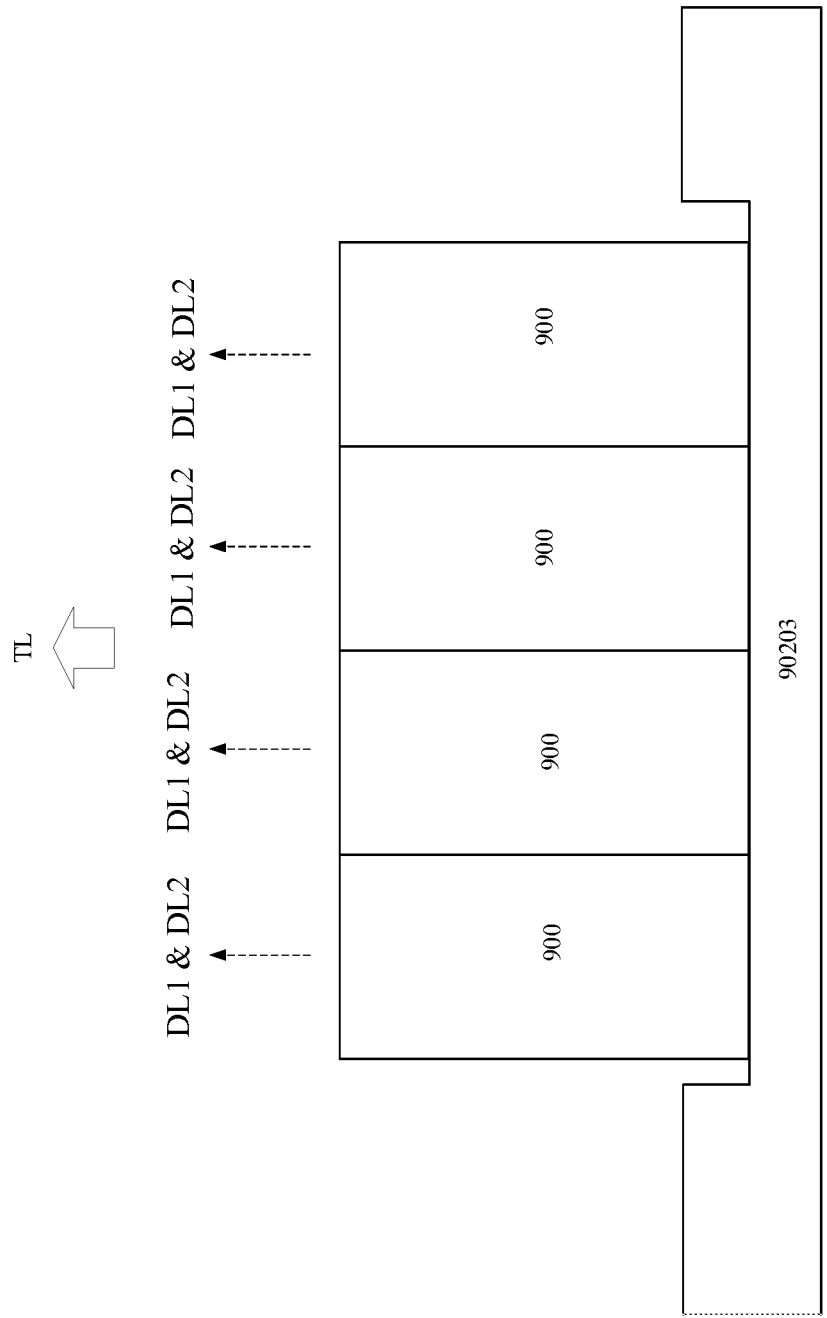

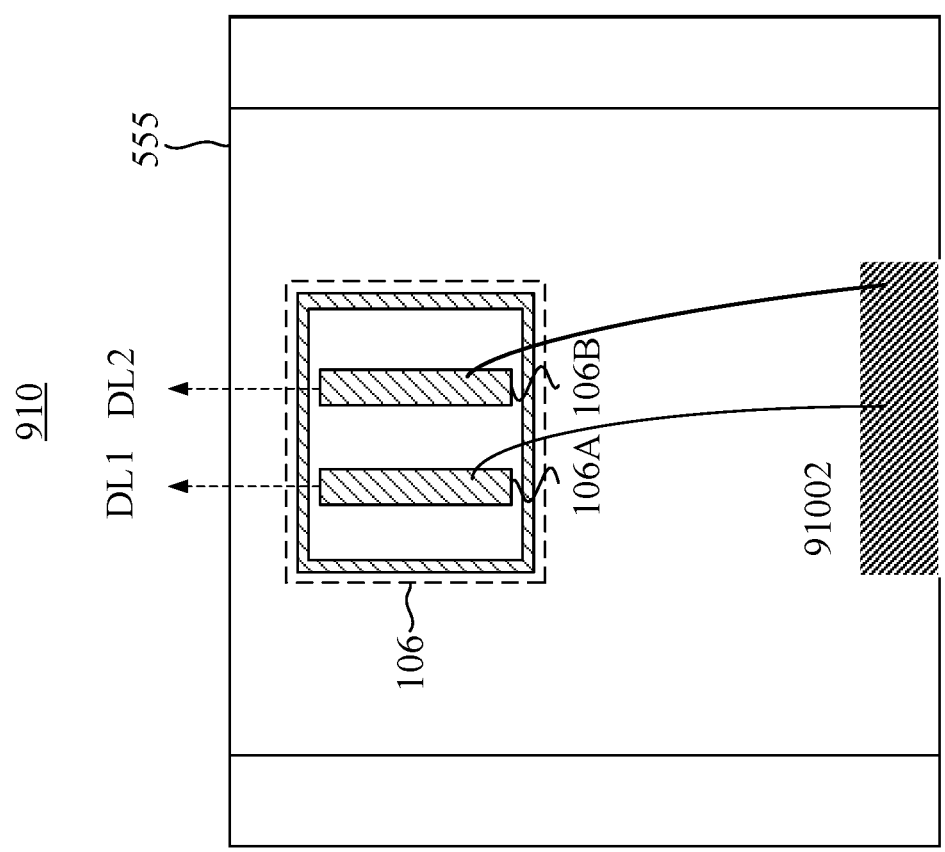

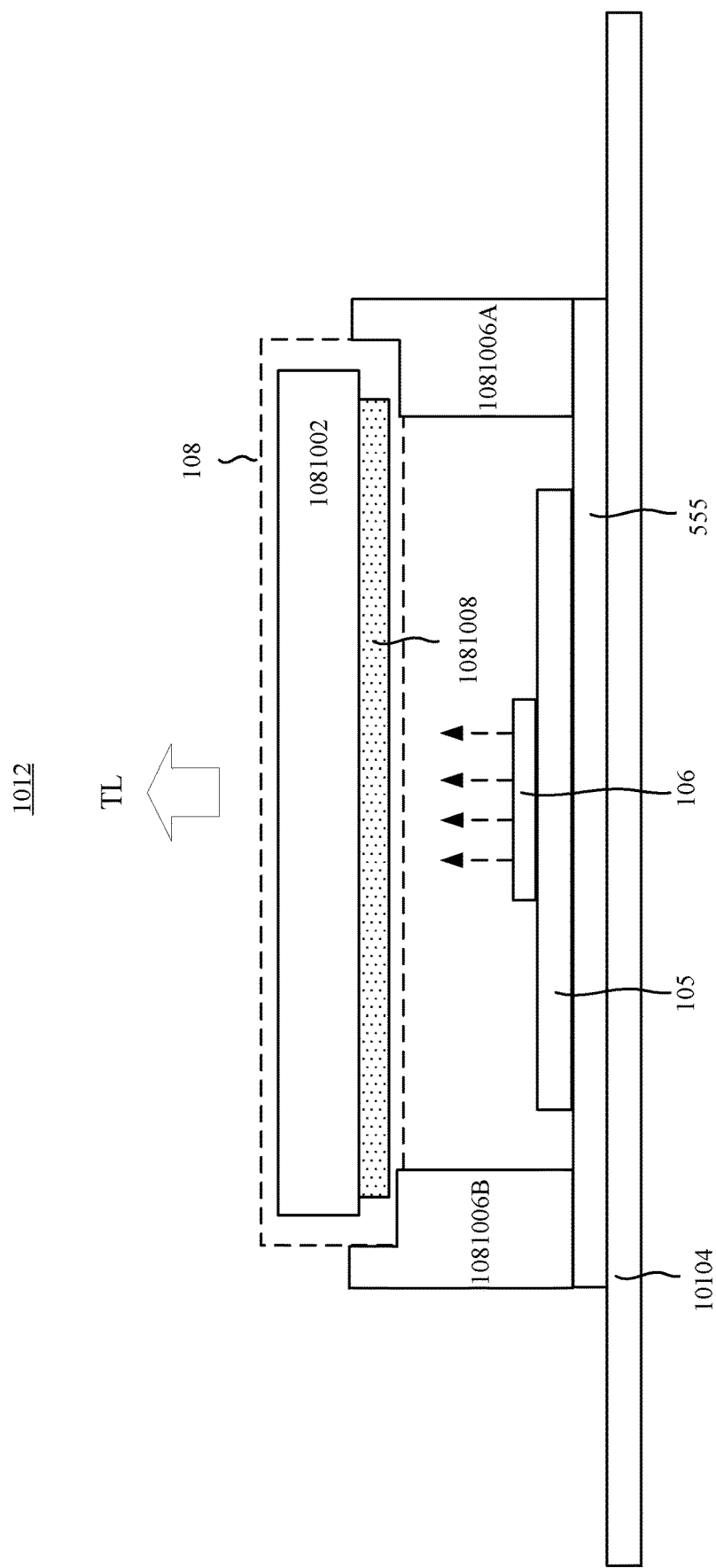

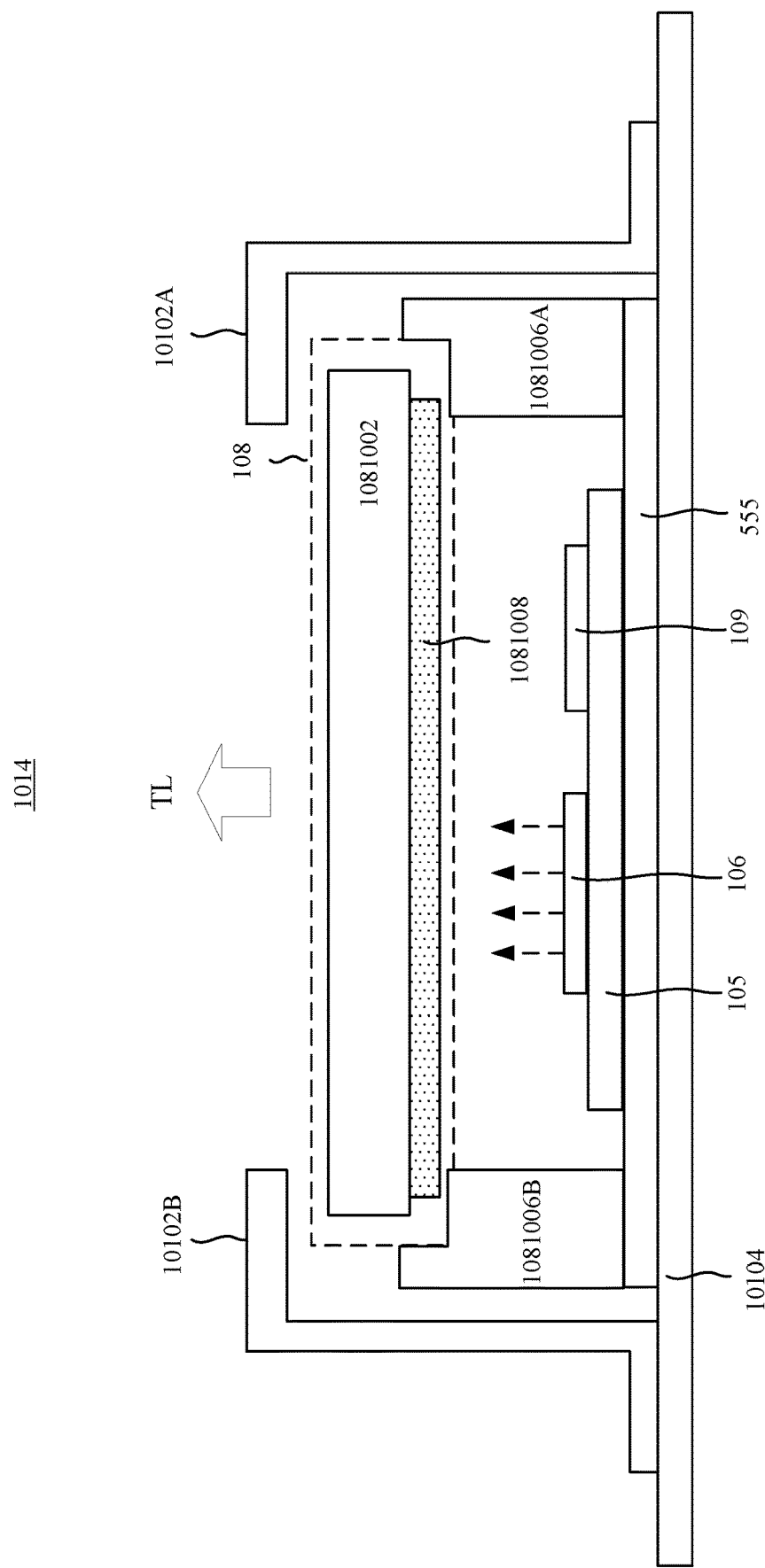

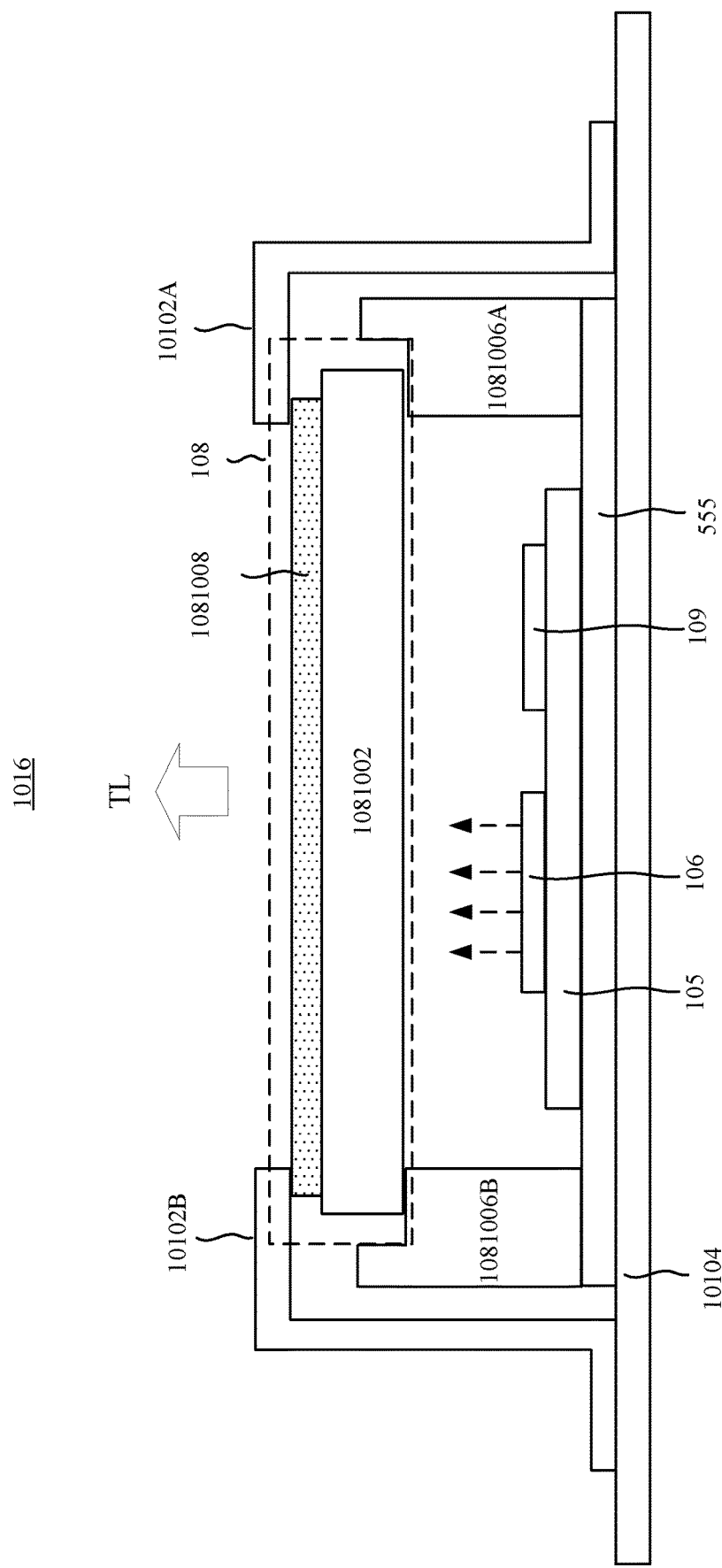

LIGHT EMISSION APPARATUS

CROSS-REFERENCE TO RELATED APPLICATIONS

This patent application claims the benefit of U.S. Provisional Patent Application No. 62/695,062, filed Jul. 8, 2018, U.S. Provisional Patent Application No. 62/700,688, filed Jul. 19, 2018, U.S. Provisional Patent Application No. 62/751,602, filed Oct. 27, 2018, which are incorporated by reference herein.

BACKGROUND

Nowadays, optical technologies have been widely used in many applications, such as cell phone, digital still camera and vehicle lidar. In a time of flight (ToF) image system, light emission apparatus is equipped for emitting the light toward a targeted object and light receiving apparatus is equipped for receiving the light reflected from the targeted object to obtain the depth information. No matter in light emission apparatus or light receiving apparatus, several technologies are still being developed and many problems are still needed to be solved.

SUMMARY

According to a first aspect of the present application, a light emission apparatus is provided. The light emission apparatus includes a laser diode configured to emit a light; a laser driver electrically coupled to the laser diode, the laser driver being configured to drive the laser diode to generate the light; and an optical module arranged to receive the light emitted by the laser diode, the optical module comprising at least one optical element and being configured to adjust the light and emits a transmitting light; wherein the transmitting light emits from the optical module with an illumination angle and the optical module adjusts the light to vary the illumination angle.

In another aspect of the present application, a light emission apparatus is provided. The light emission apparatus includes a laser diode, configured to emit a light; a laser driver electrically coupled to the laser diode, the laser driver being configured to drive the laser diode to generate the light; and an optical module arranged to receive the light emitted by the laser diode, the optical module comprising at least one optical element and being configured to adjust the light and emits a transmitting light; wherein the laser diode is an edge-emitting laser diode and the optical module is configured to change a direction of the light generated from the laser diode.

In a further aspect of the present application, a light emission apparatus is provided. The light emission apparatus includes a laser diode configured to emit a light; a laser driver electrically coupled to the laser diode, the laser driver being configured to drive the laser diode to generate the light; and an optical module arranged to receive the light emitted by the laser diode, the optical module comprising at least one optical element and being configured to adjust the light and emits a transmitting light; wherein the laser diode is a vertical-emitting laser diode and a direction of the light emitted from the laser diode and a direction of the transmitting light are the same.

In another aspect of the present application, a light emission apparatus is provided. The light emission apparatus includes a laser diode configured to emit a light; a laser driver electrically coupled to the laser diode, the laser driver being configured to drive the laser diode to generate the light; and an optical module arranged to receive the light emitted by the laser diode, the optical module comprising at least one optical element and being configured to adjust the light and emits a transmitting light; a sub-mount supporting the laser diode; wherein the laser diode is an edge-emitting laser diode and a direction of the light emitted from the laser diode and a direction of the transmitting light are the same.

Among other advantages and benefits of the embodiments disclosed herein, the light emission apparatus may dynamically adjust the illimitation angle to partially or entirely scan a three-dimensional (3D) target, convert wavelength, or equip the eye-safety mechanism. In addition, the light emission apparatus can get a smaller chip/package space based on different spatial arrangements for the laser diode, laser driver and optical module.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIGS. 5A to 5H illustrate examples of light emission apparatuses using edge-emitting laser and off-chip optical element, according to some embodiments.

FIGS. 6A-1 to 6E illustrate examples of light emission apparatuses using edge-emitting laser, on-chip optical element and off-chip optical element, according to some embodiments.

FIGS. 7A-1 to 7B-2 illustrate examples of light emission apparatuses using edge-emitting laser and encapsulated-type optical element, according to some embodiments.

FIGS. 8A to 8E illustrate example layouts for multiple light emission apparatuses application, according to some embodiments.

FIGS. 9A-1 to 9H-2 illustrate example light emission apparatuses using vertical packages according to some embodiments.

FIGS. 10A-1 to 10I illustrate the light emission apparatuses using vertical emitting laser, according to some embodiments.

DETAILED DESCRIPTION

Figure 1A:
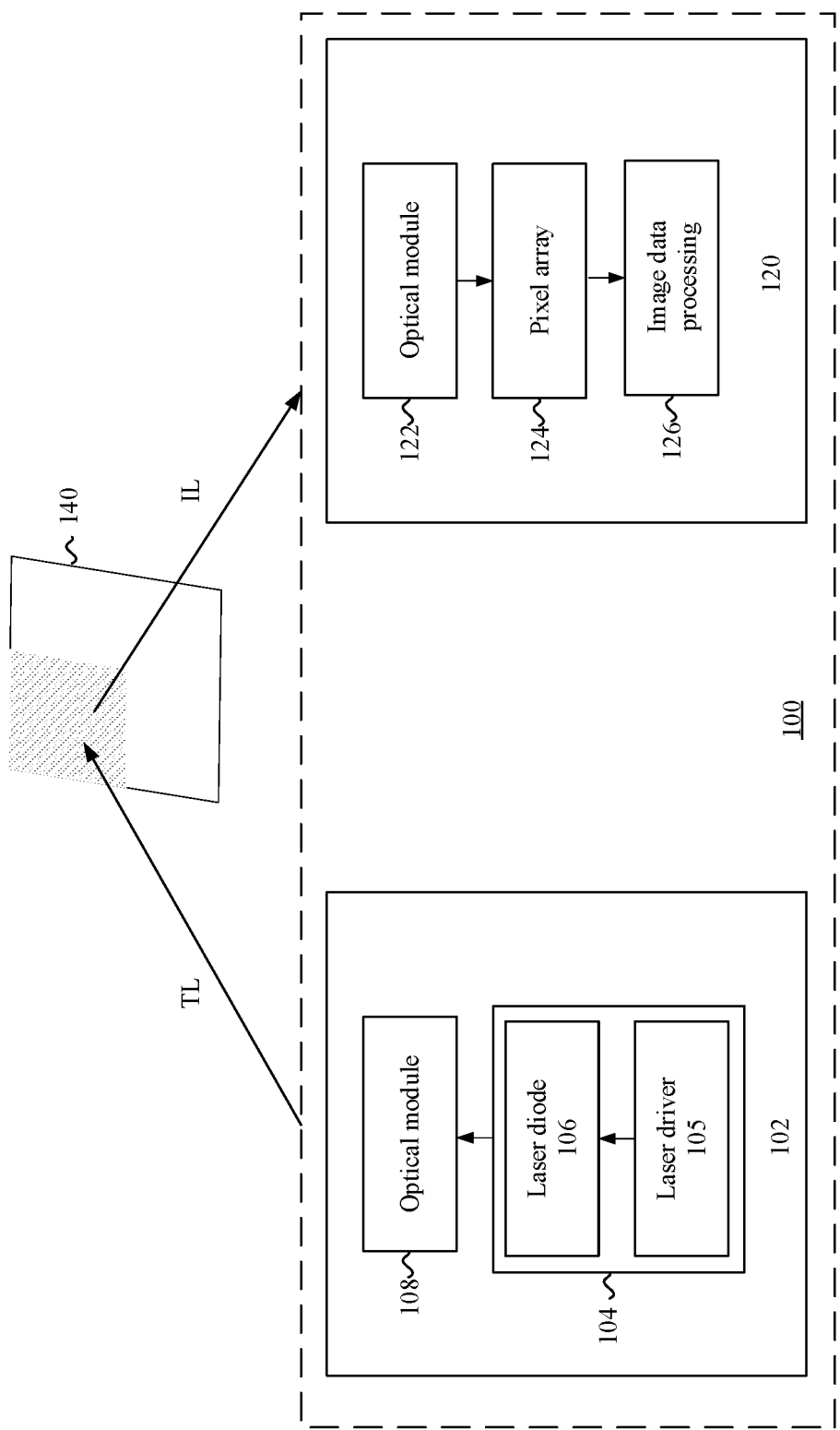
FIG. 1A to FIG. 1B illustrates a time of flight (ToF) image system 100, according to some embodiments.

FIG. 1A illustrates a time of flight (ToF) image system 100, including a light emission apparatus 102 and a light receiving apparatus 120. The light emission apparatus 102 includes a light source 104 and an optical module 108. In some embodiments, the light source 104 includes a laser driver 105 and a laser diode 106. The laser diver 105 is configured to generate a driving signal to drive the laser diode 106. The laser diode 106 is configured to emit light (e.g., visible and/or infrared (IR) light, such as near IR (NIR) light) to the optical module 108. The optical module 108 generally includes one or more optical elements and is configured to adjust (e.g., directing, shaping, filtering, diffusing and/or converting the wavelength) the light generated from the laser diode 106 to output a transmitting light TL and illuminate a portion or the entirety of three-dimensional (3D) target 140 (e.g., a person's face). A portion of the reflected light from three-dimensional target 140 is received as incident light IL at the light receiving apparatus 120. Light receiving apparatus 120 includes an optical module 122, a pixel array 124 and an image data processing 126. The optical element 122, in an embodiment, can be a light guide. The pixel array 124 includes a plurality of photodetectors to absorb the incident light IL. The image data processing 126 is a data processing apparatus (e.g., including one or more data processors) programmed to calculate an image depth information of the 3D target 140 based on the detecting signals generated from the pixel array 124. In some embodiments, the image data processing 126 performs image stitching to fully construct the image depth information of the 3D target 140.

In order to obtain the depth information of the 3D target 140, the transmitting light TL from the light emission apparatus 102 can be a flashed illumination and/or a scanned illumination onto the three-dimensional target 140. In some embodiments, illumination involves a singular flash that illuminates the entire 3D target and no scanning is necessary. Alternatively, the illumination is sequentially scanned to different portions of the 3D target until the entire target is scanned. In certain implementations, the light emission apparatus 102 can perform in-between flashed and scanned illumination, meaning a portion of 3D target 140 is flashed and then another portion of 3D target 140 is flashed again (and so on) until the 3D target 140 is scanned entirely, in which the illumination angles should be adjusted each time. In general, the incremental change in illumination angle and range of adjustment can vary depending on the embodiment. In some cases, the incremental adjustment range can be 5° or more (e.g., 10° or more, 15° or more, up to 20° or more). In certain cases, the range of adjustment can be about 15° or more, e.g., 20° or more, 25° or more, 30° or more, 40° or more, 50° or more, 60° or more, up to 90° or more).

By successively illuminating N different portions of the 3D target 140 until the entirety of the 3D target 140 is scanned through, the effective laser power received by each pixel of the pixel array 124 can be increased by approximately a factor of N, decreasing the pixel signal-to-noise ratio (SNR) by approximately the same factor. To maintain a same frame rate for different values of N, the exposure time for each pixel of the pixel array 124 can be reduced by approximately a factor N and so the pixel SNR can be reduced by approximately a factor of sqrt(N). Consequently, the net SNR can be increased by approximately a factor of sqrt(N), which showcases a possible benefit of flashed-scanned-combined (FSC) depth map acquisition in terms of SNR improvement.

Figure 1B:
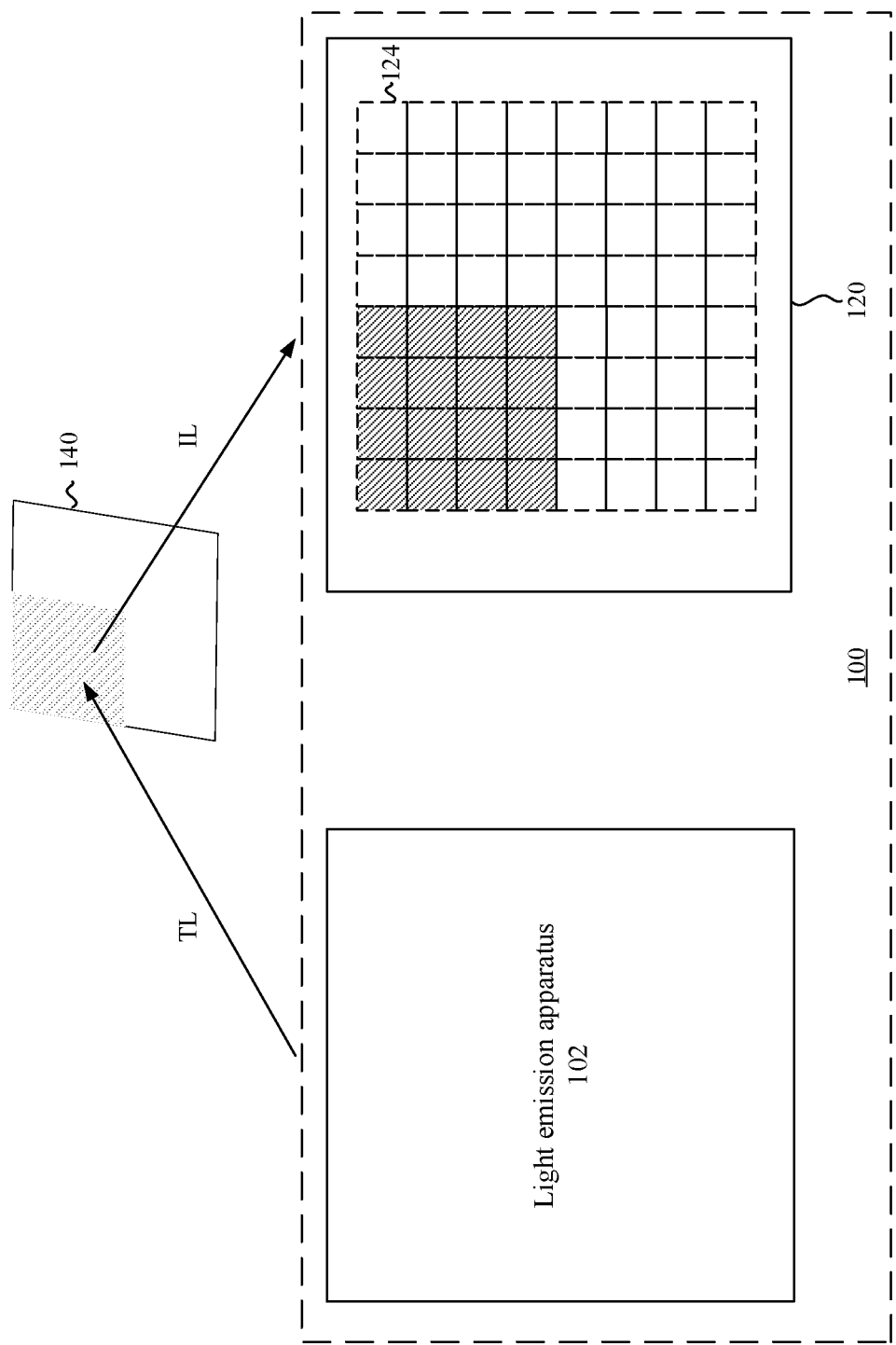

In some embodiments, during the successive illumination of N different portions of the 3D target 140, one may configure the light receiving apparatus 120 so that only the illuminated pixels of the pixel array 124 are turned on, and all the unilluminated pixels are turned off. Consequently, the power consumption associated with operating the pixels of the pixel array 124 can be reduced. As shown in FIG. 1B, taking N=4 as an example, the 3D target 140 can be partitioned into upper-left, upper-right, lower-left and lower-right portions. When the illuminating portion of the 3D target 140 is on the upper-left (as illustrated), the corresponding pixels (i.e., the shaded portion) of the pixel array 124 are turned on, the rest of pixels of the pixel array 124 can be turned off.

In general, scanning can be performed in a variety of different ways. For example, scanning can involve using a scanning mechanism to adjust illumination from a source to scan the target. Scanning mechanisms can include, for example, a mechanical rotator (e.g., including a mirror or other light directing optical element), or an optical phase array (OPA) transmitter that varies a relative phase between different light paths to steer an illumination beam from one condition to another (e.g., to vary the beam direction, divergence, or both).

Figure 2A:
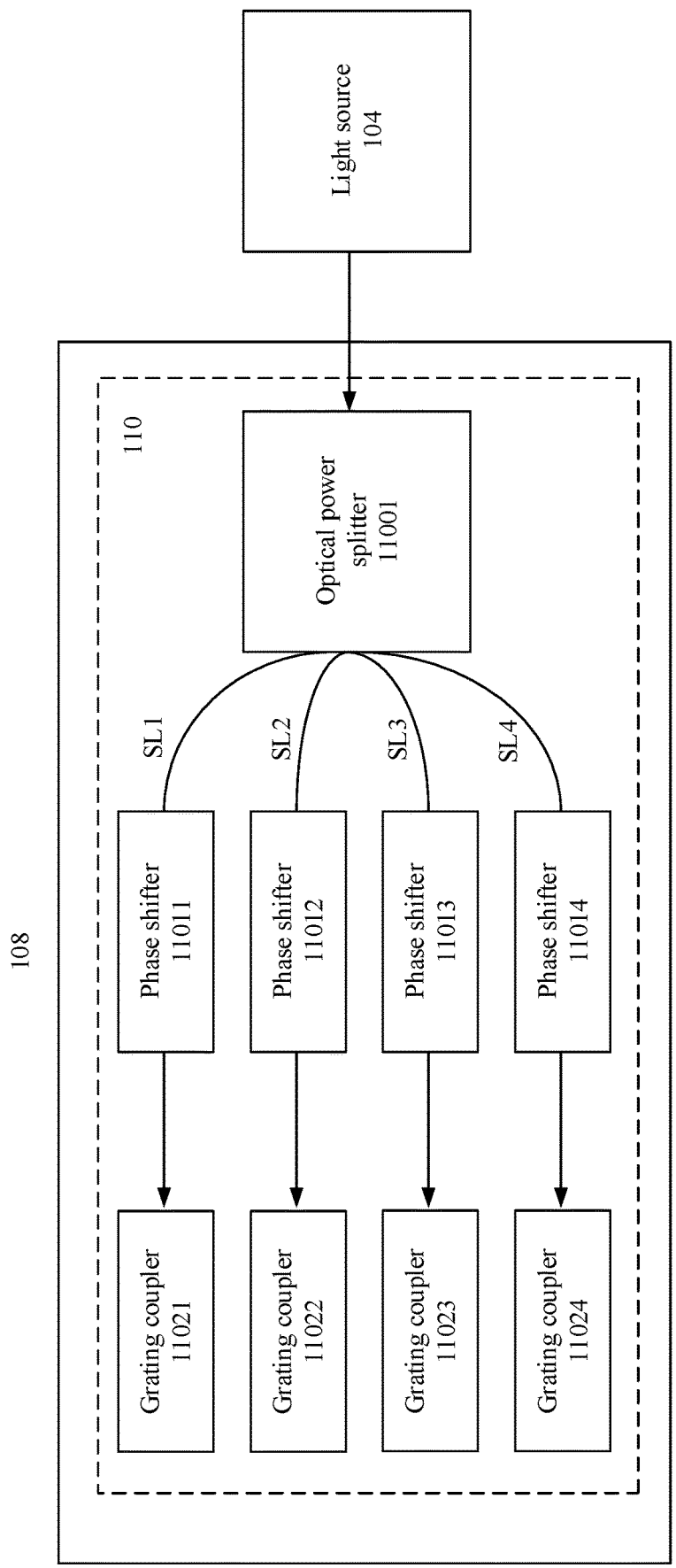
FIGS. 2A to 2C illustrate an optical phase array (OPA) transmitter applied in the light emission apparatus shown in FIG. 1A and FIG. 1B, according to some embodiments.

FIG. 2A illustrates an embodiment of an OPA transmitter 110 using a grating coupler array. OPA transmitter 110 includes an optical power splitter 11001, phase shifters 11011, 11012, 11013 and 11014, and a grating coupler array. The grating coupler array includes grating couplers 11021, 11022, 11023 and 11024. In some embodiments, the optical power splitter 11001 splits light generated from light source 104 into multiple routes so that the splitting lights SL1, SL2, SL3 and SL4, e.g., via one or more waveguides, can be transmitted into phase shifters 11011, 11012, 11013 and 11014 respectively. The optical power splitter 11001 may be a passive device (e.g., multimode interferometer). The grating couplers 11021, 11022, 11023 and 11024 form an array configured to collectively emit the transmitting light TL with an illumination angle and divergence. The illumination angle and/or divergence of the transmitting light TL depends on the relative phase shift between the light propagating along each of the paths. In some implementations, the grating couplers 11021, 11022, 11023 and 11024 are substantially vertical emission—grating coupler (SVE-GC).

In some embodiments, the phase shifters 11011, 11012, 11013 and 11014 can be active devices (e.g., Si pin junction controlled by bias) or passive devices (e.g., metal line routing controlled by bias), and respectively control the phases of the splitting lights SL1, SL2, SL3 and SL4 from optical power splitter 11001 to create or align the phase differences between each of them. Controlling the phase differences between the splitting lights SL1, SL2, SL3 and SL4 allows for adjustment of the illumination angle and/or beam divergence of transmitting light TL collectively generated by the grating couplers 11021, 11022, 11023 and 11024. Therefore, by controlling the phase shifters 11011, 11012, 11013 and 11014, the illumination angle and/or beam divergence of transmitting light TL can be dynamically adjusted and the 3D target 140 can be scanned.

Based on different settings, OPA transmitter 110 can perform flashed-scanned-combined (FSC) depth map acquisition. Assuming the resolution of 3D target 140 is 240×180, for example (other target resolutions are possible), OPA transmitter 110 can flash the whole target, which means that OPA transmitter 110 illuminates the entire 3D target 140 simultaneously and the light receiving apparatus 120 captures light reflected from the entire 3D target 140 in response to its simultaneous illumination. Alternatively or additionally, in some implementations, OPA transmitter 110 illuminates the upper half of 3D target 140 (e.g., 240×90) first and then illuminates the bottom half of target 3D target 140 (e.g., 240×90). Light receiving apparatus 120 sequentially receives light reflected from the upper and lower halves of 3D target 140 and combines the upper half and bottom half of the whole 3D target 140. More generally, the 3D target 140 can be partitioned into more than two (e.g., three or more, four or more, five or more, 10 or more, 20 or more) regions, and OPA transmitter 110 can perform flash and scan repeatedly as many times as necessary to collect reflected light from the entire 3D target.

While OPA transmitter 110 includes an optical power splitter 11001 that splits light along four separate paths, more generally, fewer or more light paths are possible (e.g., five or more, six or more, seven or more, eight or more, 10 or more, 15 or more, up to 20 or more).

In some embodiments, the OPA transmitter 110 can be implemented on a silicon (Si) photonics platform (e.g. using SOI substrate). The optical power splitter 11001 includes a Si-based waveguide. The light from the laser diode 106 with a peak wavelength between 1.0 um~2.0 um may be used, to avoid optical absorption caused by the Si-based waveguide. Light source 104 can be implemented by on-chip or off-chip with the optical module 108. In an on-chip configuration, light source 104 is integrated with other components in a single, monolithic package, e.g., forming a photonic integrated circuit. In an on-chip configuration, light source 104 may be a hybrid laser using III-V gain chip bonded/packaged to OPA transmitter 110. In an off-chip configuration, the light source 104 is a separately manufactured element that is later packaged with the other components. In an off-chip configuration, an optical coupler (not shown in figure) may be equipped between the OPA transmitter 110 and the light source 104. The optical coupler interfacing off-chip light source 104 may be an edge coupler (e.g. spot-size converter, evanescent coupler) or a vertical coupler (e.g. grating coupler, turning mirror) or a combination thereof.

Figure 2B:
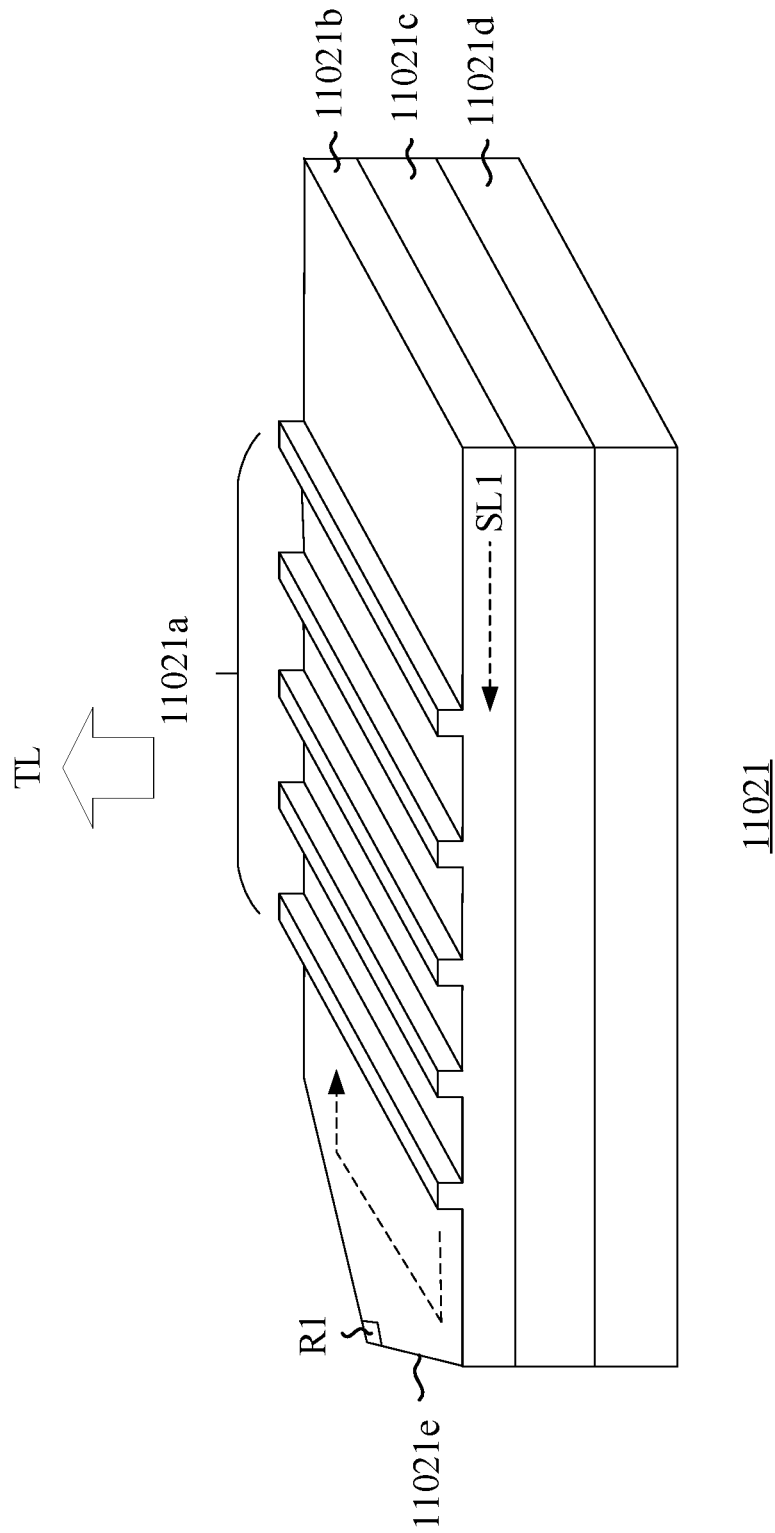

FIG. 2B illustrates an embodiment of a grating coupler. The grating coupler 11021 is a substantially vertical emission—grating coupler (SVE-GC), including gratings 11021a, a silicon waveguide 11021b, an oxide buffer layer 11021c, and a silicon substrate 11021d. The grating coupler 11021 is configured to couple the splitting light SL1 in the waveguide 11021b to the air to form the transmitting light TL. In this embodiment, a corner reflector 11021e is formed at the end of the grating coupler 11021 and has an angle R1, which is able to reflect the residual splitting lights SL1 back to the gratings 11021a and therefore avoid the waste for those uncoupled residual splitting lights SL1. The angle R1 is substantially 90 degrees.

Figure 2C:
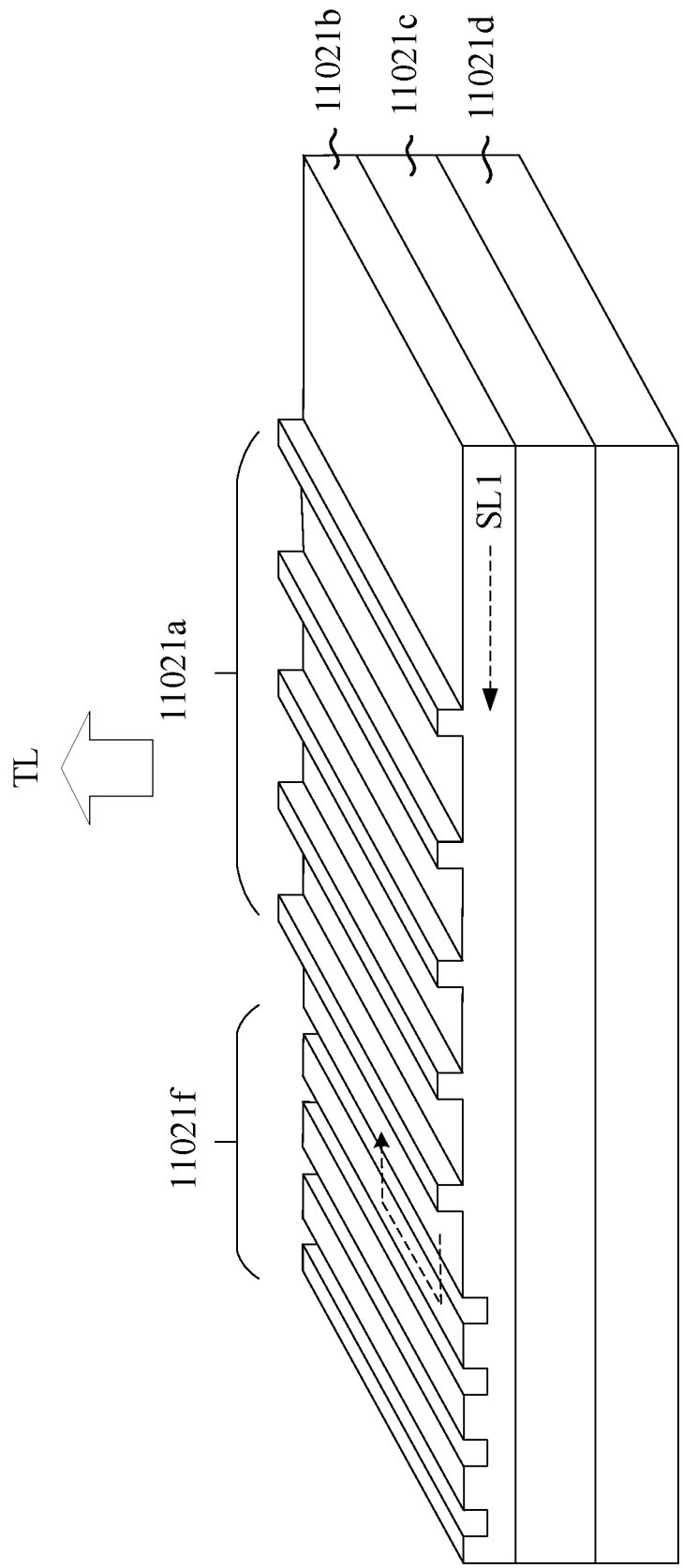

FIG. 2C illustrates another embodiment of a grating coupler. Similar to FIG. 2B, the grating coupler 11021 is a substantially vertical emission—grating coupler (SVE-GC) (emission TL is substantially perpendicular to the plane of the grating), including gratings 11021a, silicon waveguide 11021b, oxide buffer layer 11021c and silicon substrate 11021d. This embodiment includes a distributed Bragg reflector 11021f (DBR) at the end of the grating coupler 11021, which is able to reflect the residual splitting lights SL1 back to the gratings 11021a and therefore avoid the waste for those uncoupled residual splitting lights SL1.

As the illustrations of FIG. 2A-2C, OPA transmitter 110 is an approach to control the illumination angle of the transmitting light TL and the 3D target 140 can be partially or entirely scanned. Specifically, by equipping a grating coupler array and control each phase of the light entering into each grating coupler, the illumination angle of the transmitting light TL can be adjusted dynamically.

Many longer-wavelength NIR emission sources with direct/indirect modulation, emit light in a horizontal direction (e.g. DFB, DBR lasers) instead of a vertical direction (e.g. VCSEL, VECSEL lasers), and so they may consume more chip/package spaces.

Since 3D TOF system with small footprint has potential to be used in various applications, due to size limitation, to have a direct/indirect modulated longer-wavelength NIR emitter with a compact size can become a challenging problem.

Based on different implementations, laser diodes can be categorized into two types depending on which surface of the device emits light: one is edge-emitting laser; the other one is vertical emitting laser. Below descriptions discloses the embodiments using either edge-emitting laser or vertical emitting laser to implement light emission apparatus 102. Relevant optical element, circuits, layouts, geometry and its combination will be described in detail below.

Figures 1, 3A:
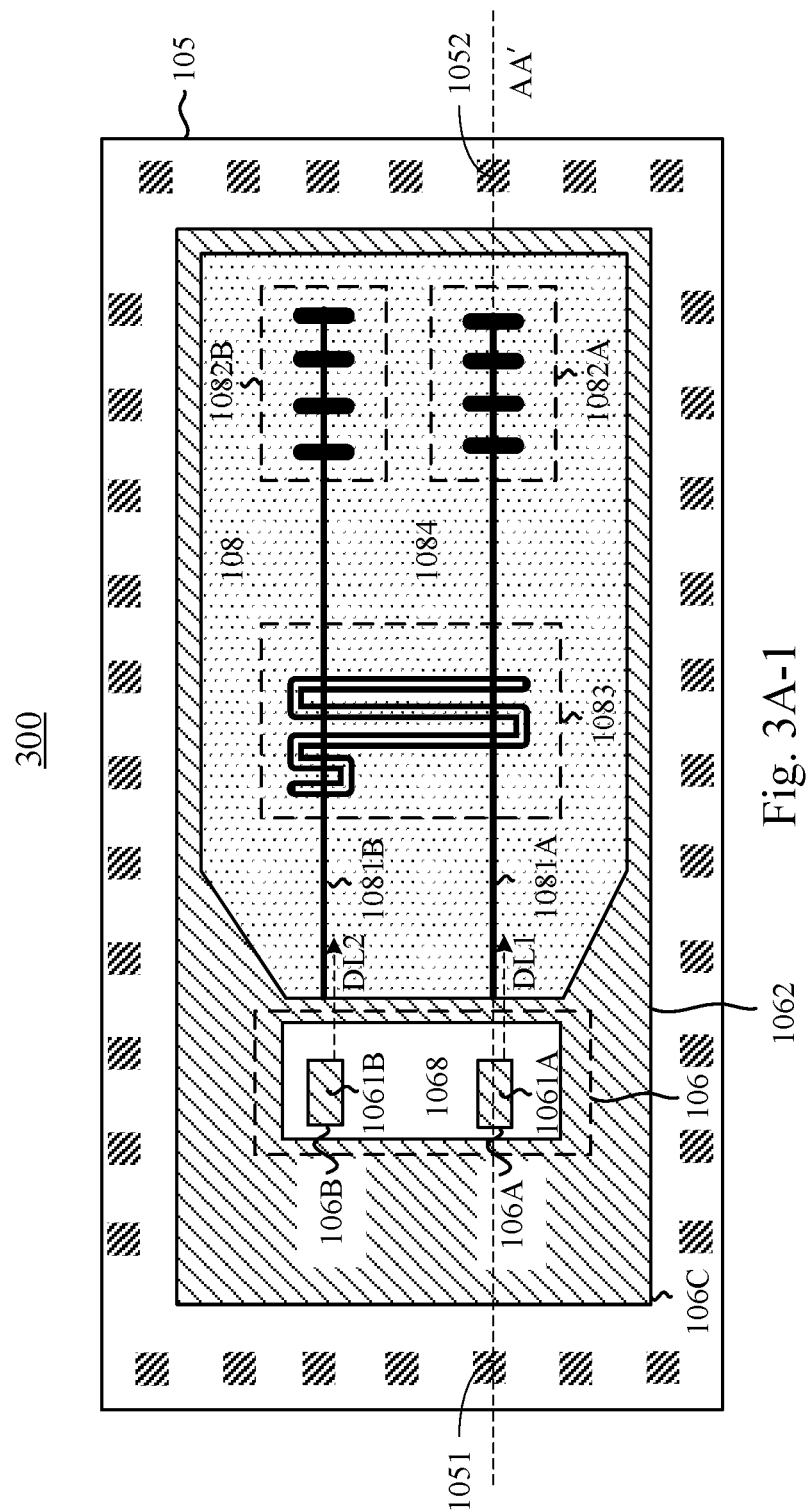
FIGS. 3A-1 to 3P-2 illustrate examples of light emission apparatuses using edge-emitting laser and vertical coupler, according to some embodiments.
Figures 2, 3A:
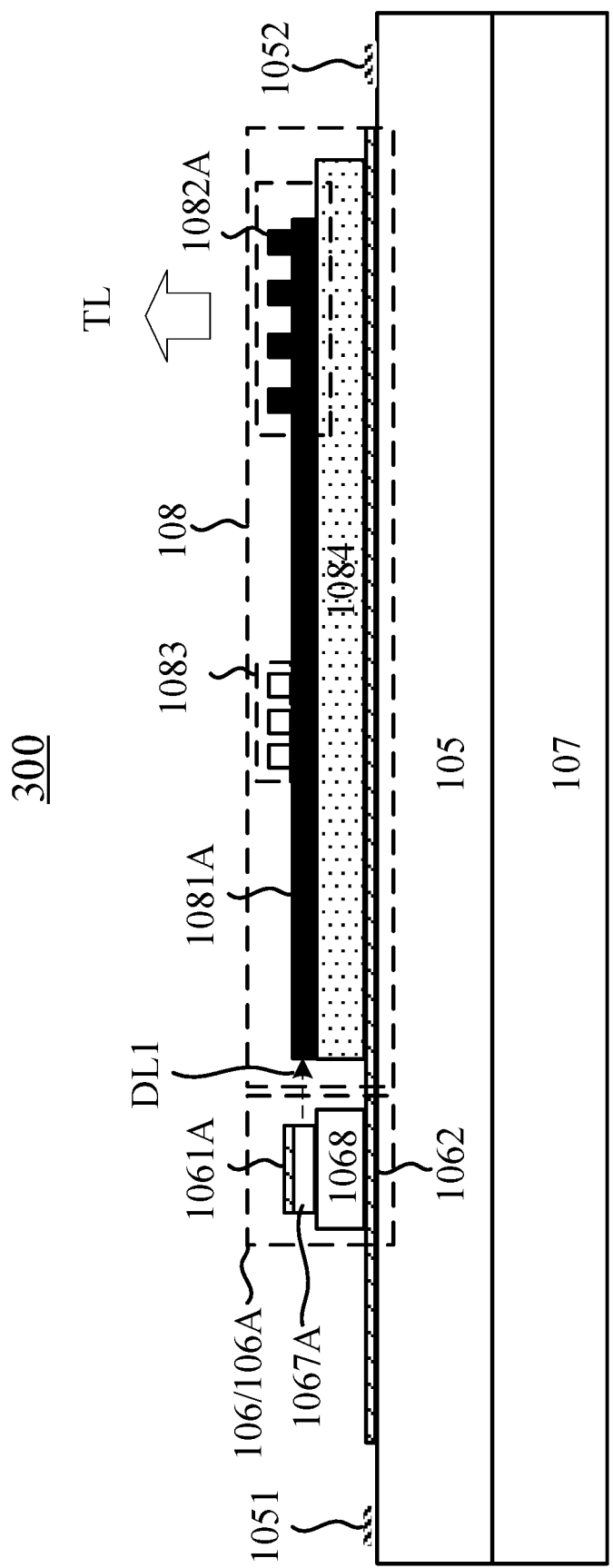

FIG. 3A-1 illustrates an embodiment of light emission apparatus 300, from the top view, including a laser driver 105, a laser diode 106, an optical module 108 and a carrier 107, where the laser diode 106 is an edge-emitting laser. FIG. 3A-2 is the cross-sectional view (Section AA') in FIG. 3A-1. As illustrated in FIG. 3A-1 and FIG. 3A-2, laser diode 106 is separated from optical module 108, and both of them are stacked on laser driver 105 and carrier 107. Generally, laser diver 105 includes one or more integrated circuits for providing drive signals to laser diode 106. Carrier 107 provides a mechanical support for laser driver 105 and can be, e.g., a semiconductor substrate or a printed circuit board.

Specifically, laser diode 106 includes laser bar 106A and laser bar 106B. Optical module 108 includes waveguides 1081A and 1081B, vertical grating couplers 1082A and 1082B, and phase shifter 1083. Laser diode 106 is configured to emit the light DL1 from the active region 1067A of laser bar 106A and emit light DL2 from the active region 1067B of laser bar 106B. Waveguide 1081A is configured to direct the light DL1 generated by the laser diode 106 to the vertical grating coupler 1082A. Vertical grating coupler 1082A is configured to turn the direction of the light DL1 with a predetermined angle (e.g., 90 degree) to output the transmitting light TL, where the transmitting light TL can be generated by light DL1 only or collectively generated by light DL1 and light D2.

Figures 1, 3B:
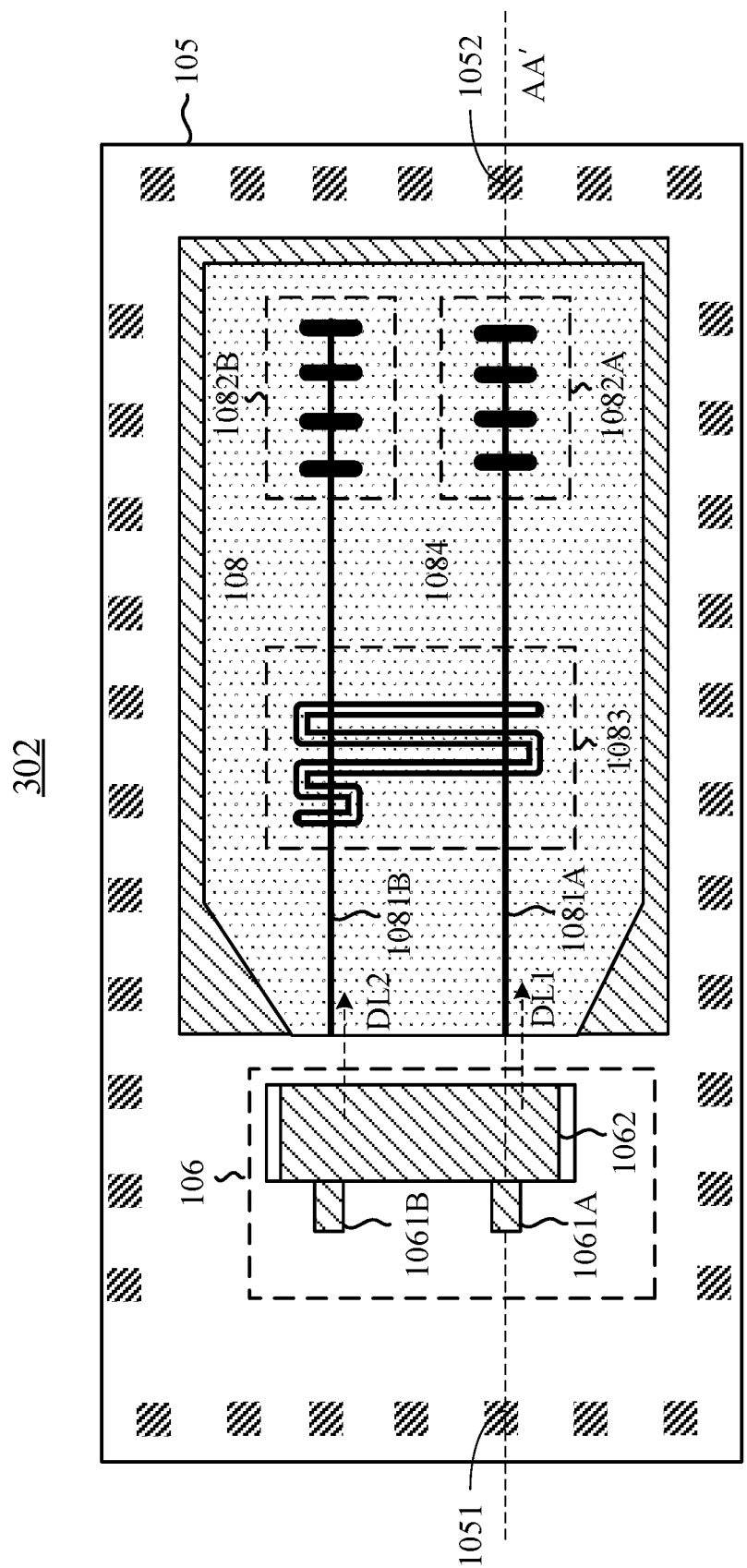
Figures 2, 3B:
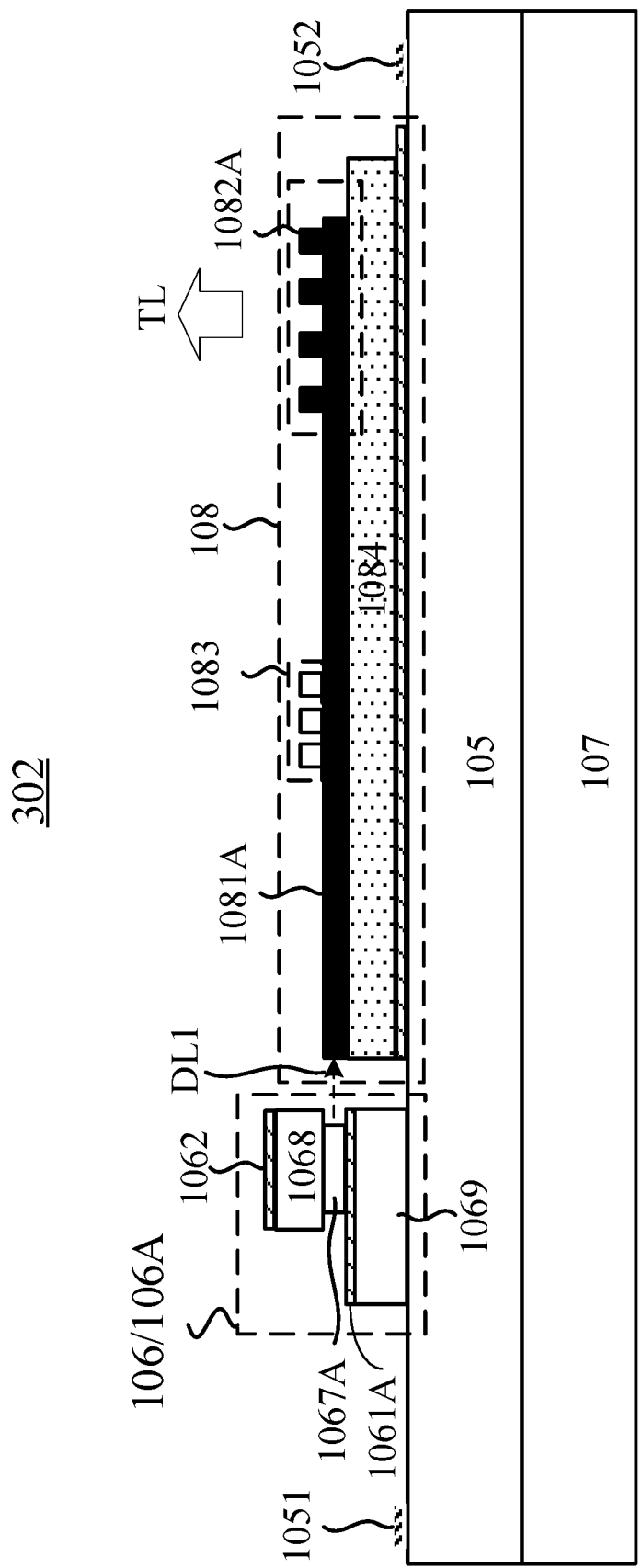

In more detail, vertical grating coupler 1082A and vertical grating coupler 1082B can be implemented as the embodiments shown in FIG. 2B and FIG. 2C. Phase shifter 1083 is configured to adjust the phase delay of the light DL1 transmitted in the waveguide 1081A and phase delay of the light DL2 transmitted in the waveguide 1081B. One implementation of the phase shifter 1083 is a routing of a metal line as shown in FIG. 3A-1 and FIG. 3B-1, which is controlled by a control signal to generate an electrical field into waveguides 1081A and 1081B so that the phase of the lights DL1 and DL2 transmitted in the waveguides 1081A and 1081B can be adjusted.

In this embodiment, the substrate 1068 of the laser diode 106 and the substrate 1084 of the optical module 108 are separated. First contact 1061A and second contact 1062 of the laser diode 106 are metals and being placed as shown in 3A-2, where the second contact 1062 is placed underneath the substrate 1068 and the substrate 1084. The driving signal used to drive the laser diode 106 can be generated by the laser driver 105 through the connection of first contact 1061A and pad 1051, wherein the driving signal is a modulation signal and can be outputted from the pad 1051. Second contact 1062 can be connected to a constant voltage (e.g. ground), which may be generated from the pad 1052.

With this configuration, the laser diode 106 can be driven by the laser driver 105 to generate the lights DL1 and DL2 into the optical module 108. Optical module 108 can output the transmitting light TL through waveguides 1081A and 1081B, vertical grating couplers 1082A and 1082B and/or phase shifter 1083 accordingly. Note that some devices (e.g.

phase shifter 1083) inside the laser diode 106, optical module 108 and laser driver 105 are optional. The phase shifter 1083 can be removed or replaceable based on different scenarios.

FIG. 3B-1 and FIG. 3B-2 illustrate an embodiment of light emission apparatus 302, which includes laser driver 105, laser diode 106, optical module 108 and carrier 107. The difference between light emission apparatus 302 and light emission apparatus 300 is the implementation of laser diode 106. This embodiment flips the laser diode 106 of the light emission apparatus 300 so that the first contacts 1061A and 1061B are placed under the second contact 1062. In order to emit the lights DL1 and DL2 into waveguides 1081A and 1081B respectively, this embodiment adds a spacer 1069 under the first contacts 1061A and 1061B, which is able to adjust the height of the active regions 1067A and 1067B of the laser diode 106 so that the heights of light DL1 and waveguide 1081A are substantially the same, and the heights of light DL2 and waveguide 1081B are substantially the same. The operations between light emission apparatus 300 and light emission apparatus 302 are similar, related descriptions are hereby omitted for sake of brevity.

Figures 1, 3C:
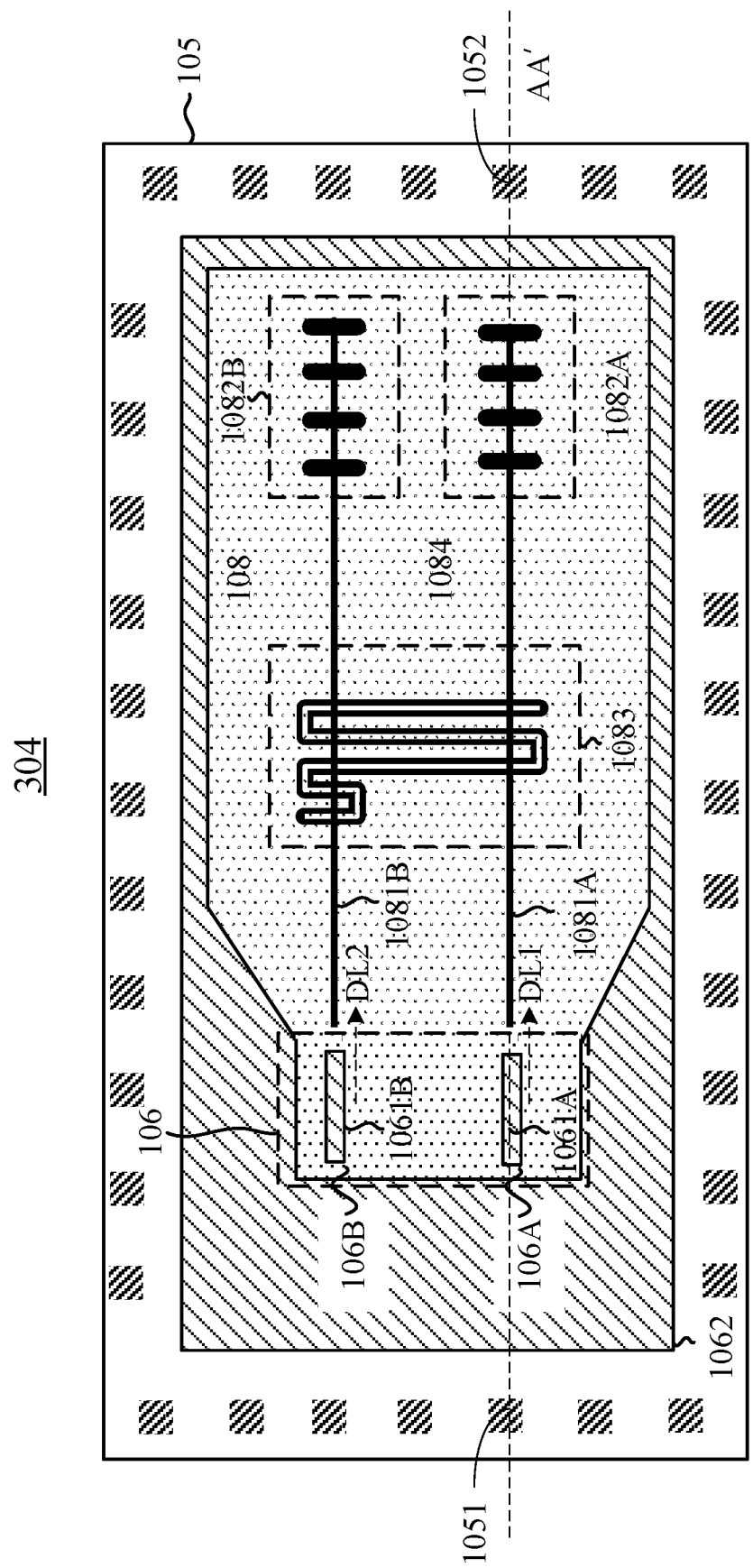
Figures 2, 3C:
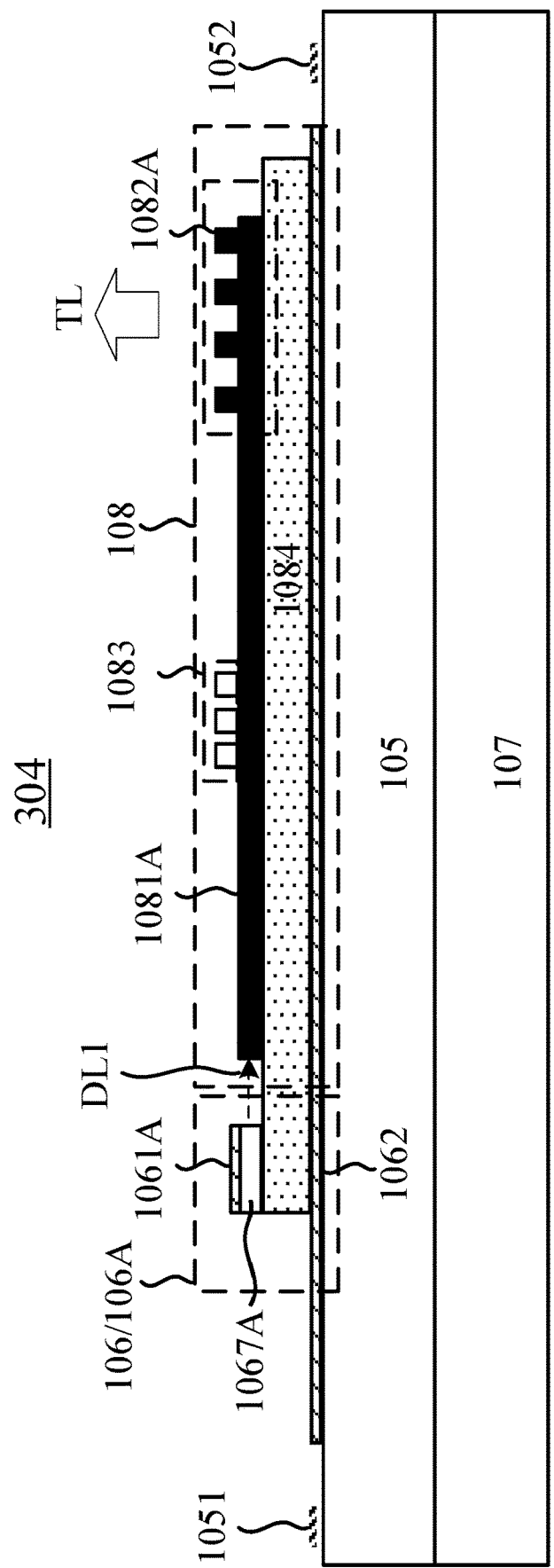

FIG. 3C-1 and FIG. 3C-2 illustrate an embodiment of light emission apparatus 304, which includes laser driver 105, laser diode 106, optical module 108 and carrier 107. Compared to light emission apparatus 300, the laser diode 106 and optical module 108 in this embodiment share the same substrate 1084.

Figures 1, 3D:
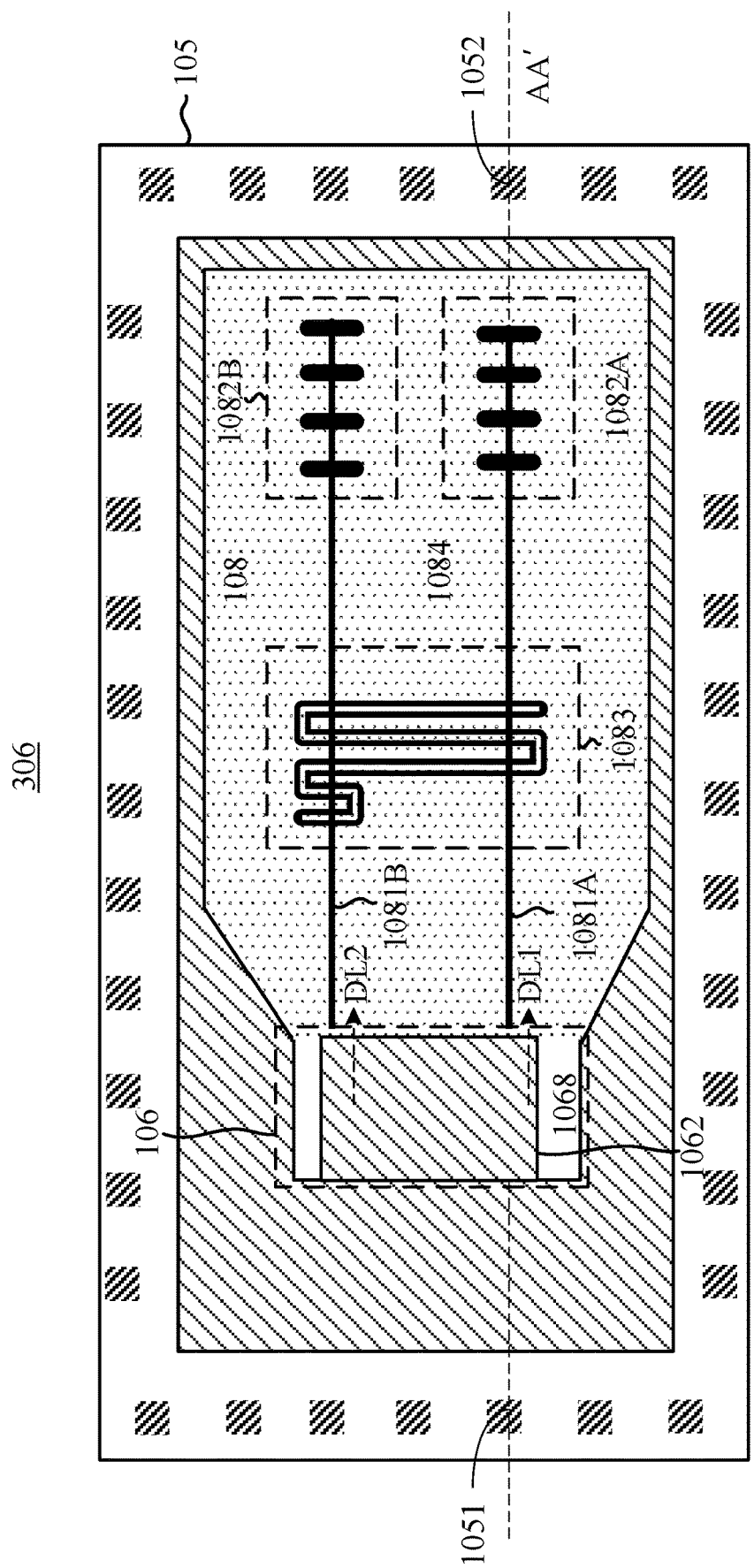
Figures 2, 3D:
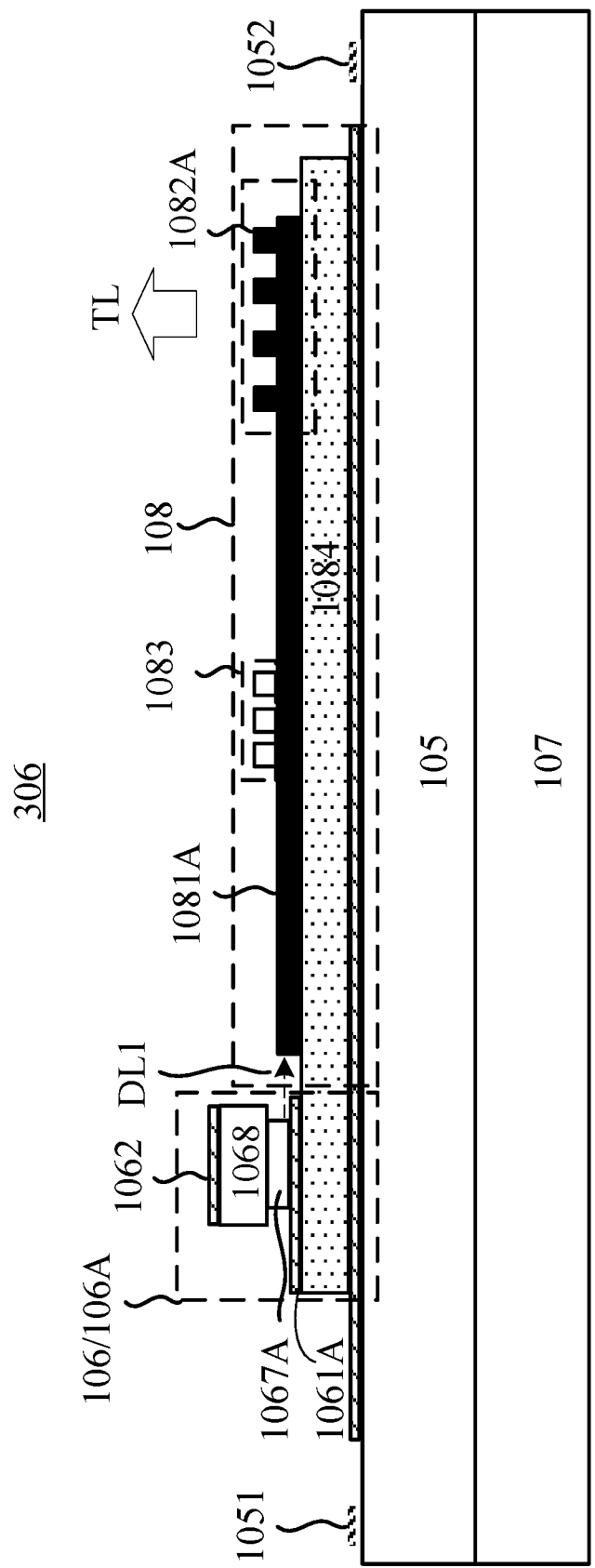

FIG. 3D-1 and FIG. 3D-2 illustrate an embodiment of light emission apparatus 306. Compared to light emission apparatus 304, laser diode 106 and optical module 108 also shares the same substrate 1084. The difference between light emission apparatus 306 and light emission apparatus 304 is the implementation of laser diode 106. This embodiment flips the laser diode 106 of the light emission apparatus 304 so that the first contacts 1061A and 1061B are placed under the second contact 1062.

Figures 1, 3E:
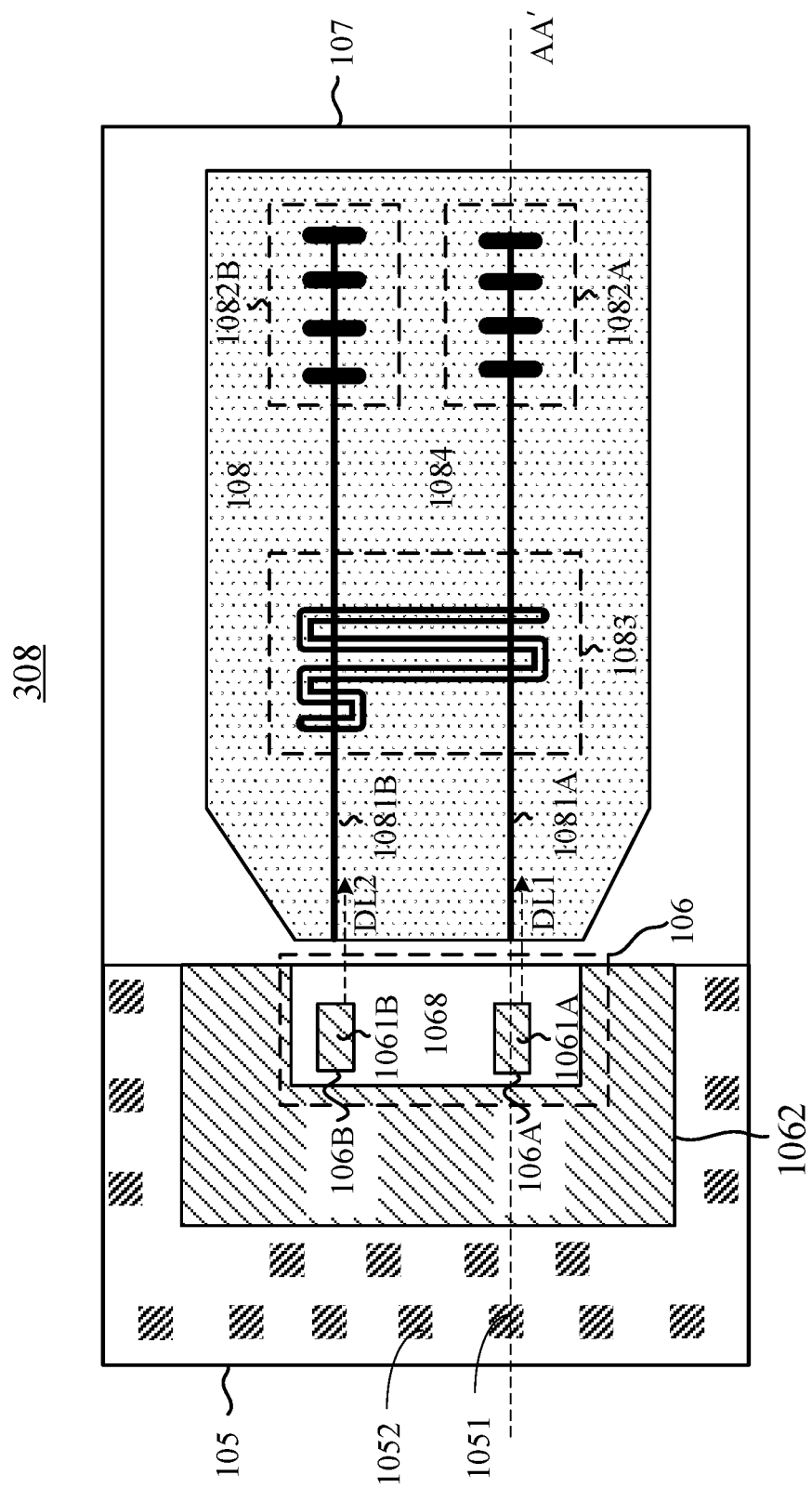
Figures 2, 3E:
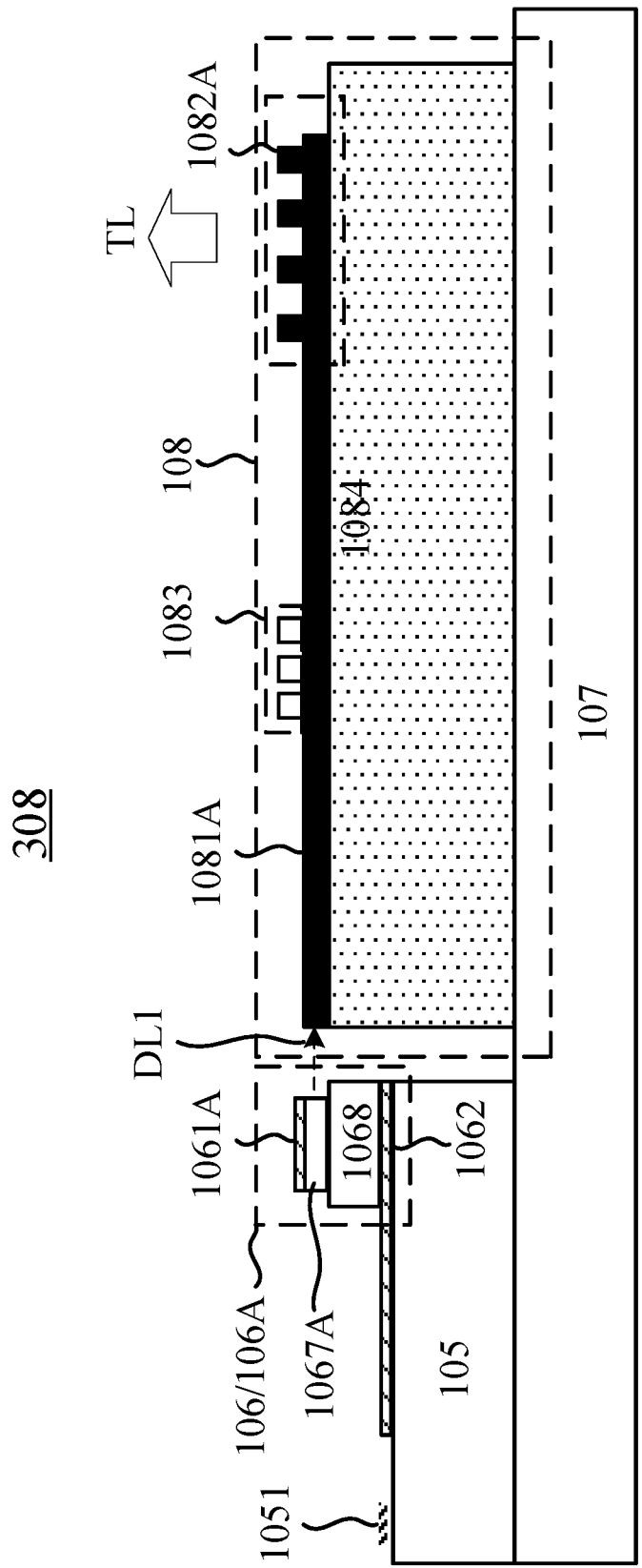

FIG. 3E-1 and FIG. 3E-2 illustrate an embodiment of light emission apparatus 308. Compared to light emission apparatus 300, laser diode 106 in this embodiment is stacked on the laser driver 105, but laser driver 105 is not under the optical module 108. Both laser driver 105 and optical module 108 are supported by the carrier 107.

Figures 1, 3F:
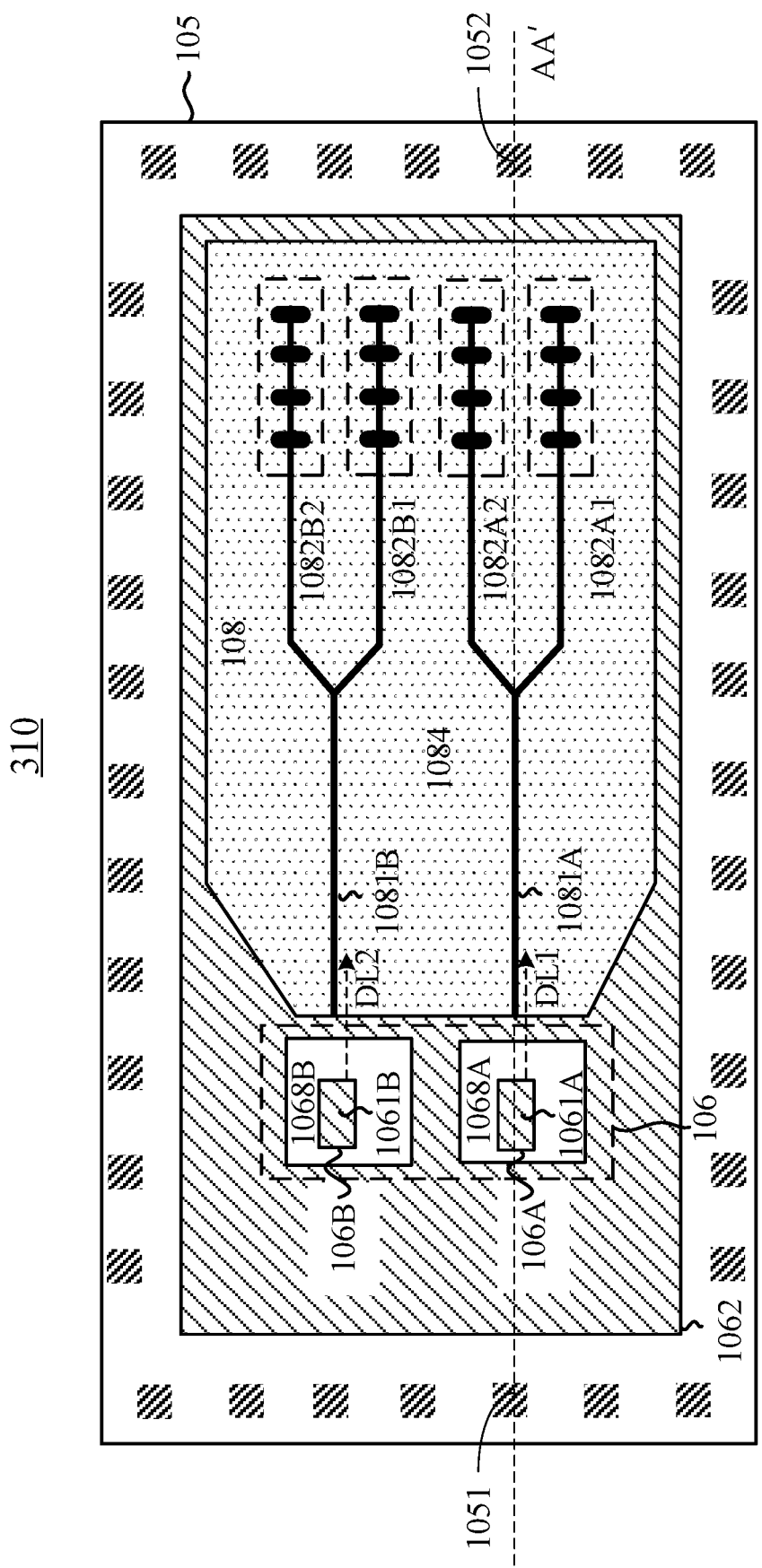
Figures 2, 3F:
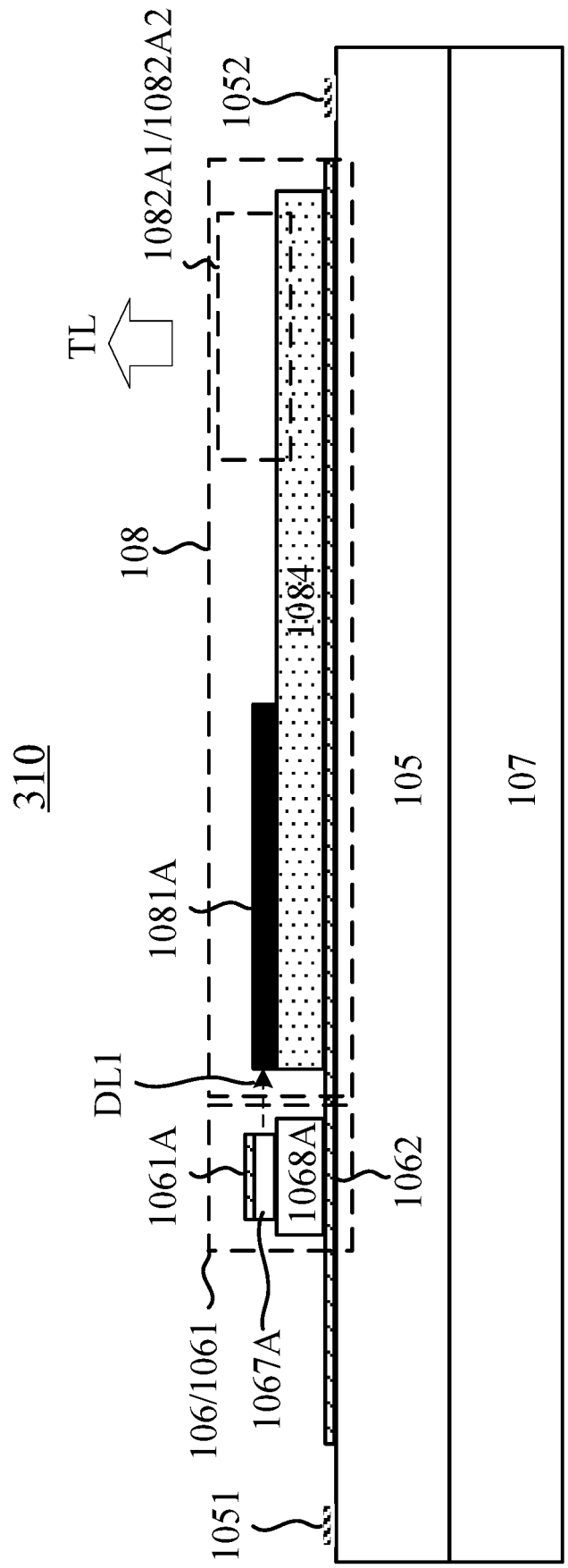

FIG. 3F-1 and FIG. 3F-2 illustrate an embodiment of light emission apparatus 310. In laser diode 106, this embodiment utilizes different substrates 1068A and 1068B to support laser bar 106A and 106B respectively. In optical module 108, it includes more vertical grating couplers 1082A1, 1082A2, 1082B1 and 1082B2. Specifically, the light DL1 is split into two branches and outputted by the vertical grating couplers 1082A1 and 1082A2. Similarly, the light DL2 is split into two branches and outputted by the vertical grating couplers 1082B1 and 1082B2. In other implementations, waveguide 1081A and waveguide 1081B can have more fan-outs so that light DL1 and DL2 can be split into more branches. Note that this embodiment and the embodiments hereinafter can add phase shifter to control the phase of the light transmitted in waveguide so that the illumination angle of the transmitting light TL can be properly adjusted.

Figures 1, 3G:
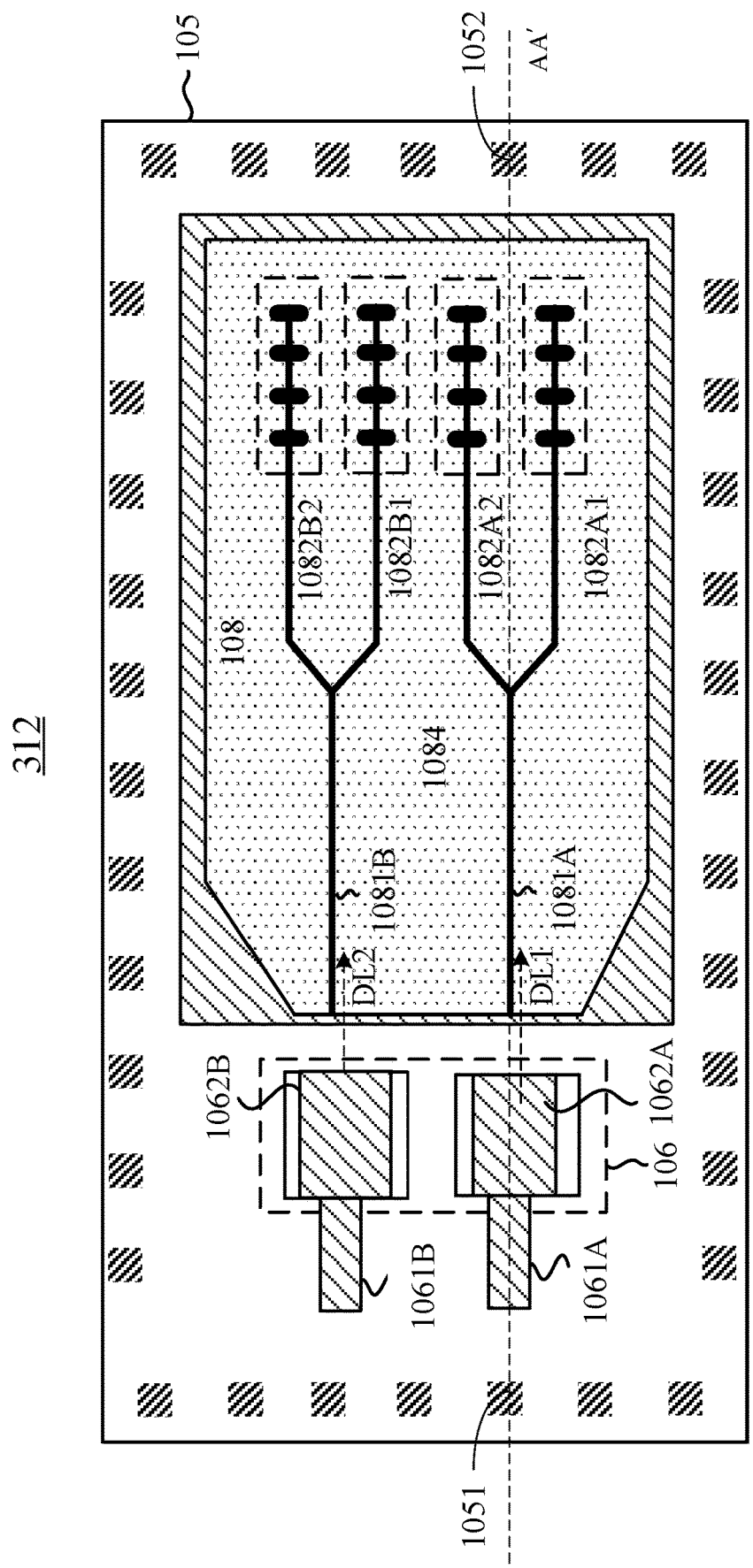
Figures 2, 3G:
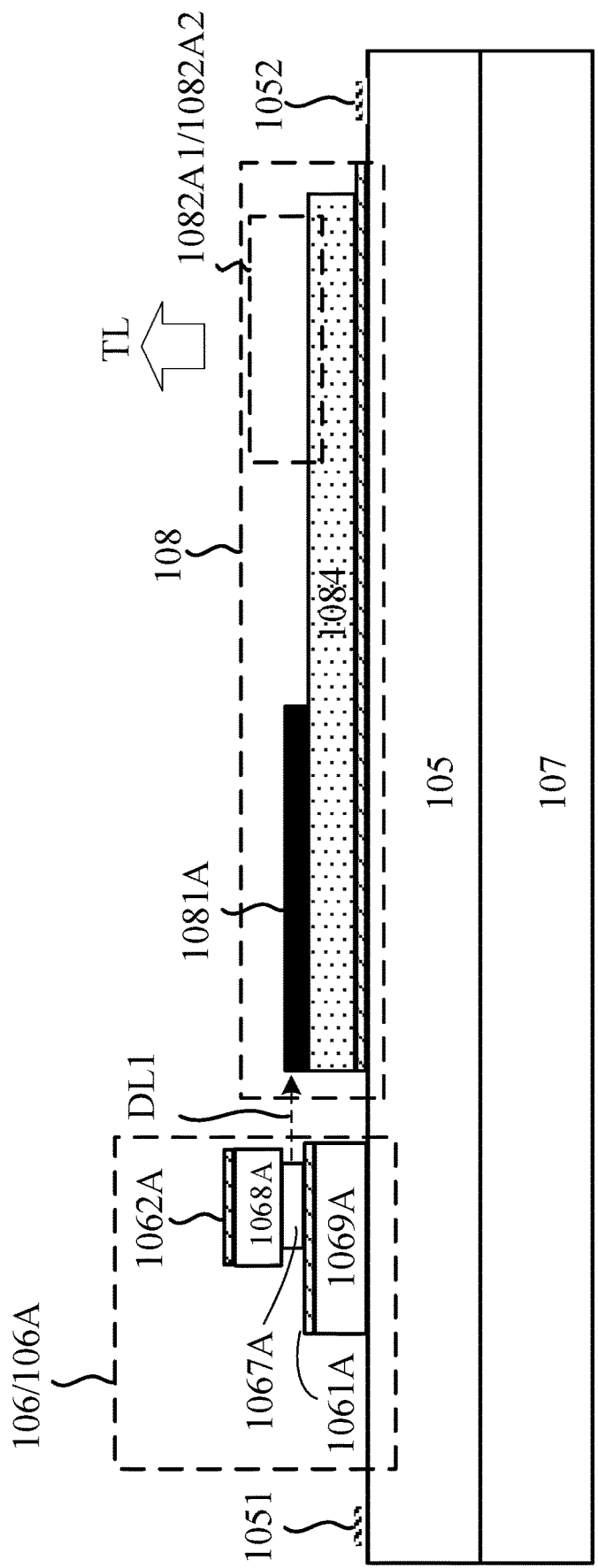

FIG. 3G-1 and FIG. 3G-2 illustrate an embodiment of light emission apparatus 312. Compared to light emission apparatus 310, this embodiment flips the laser diode 106 of the light emission apparatus 310 so that the first contacts 1061A and 1061B are placed under the second contacts 1062A and 1062B. In order to emit the lights DL1 and DL2 into waveguides 1081A and 1081B respectively, this embodiment adds spacers 1069A and 1069B under the first contacts 1061A and 1061B respectively, which is able to adjust the height of the active regions 1067A and 1067B of the laser diode 106 so that the heights of light DL1 and waveguide 1081A are substantially the same, and the heights of light DL2 and waveguide 1081B are substantially the same.

Figures 1, 3H:
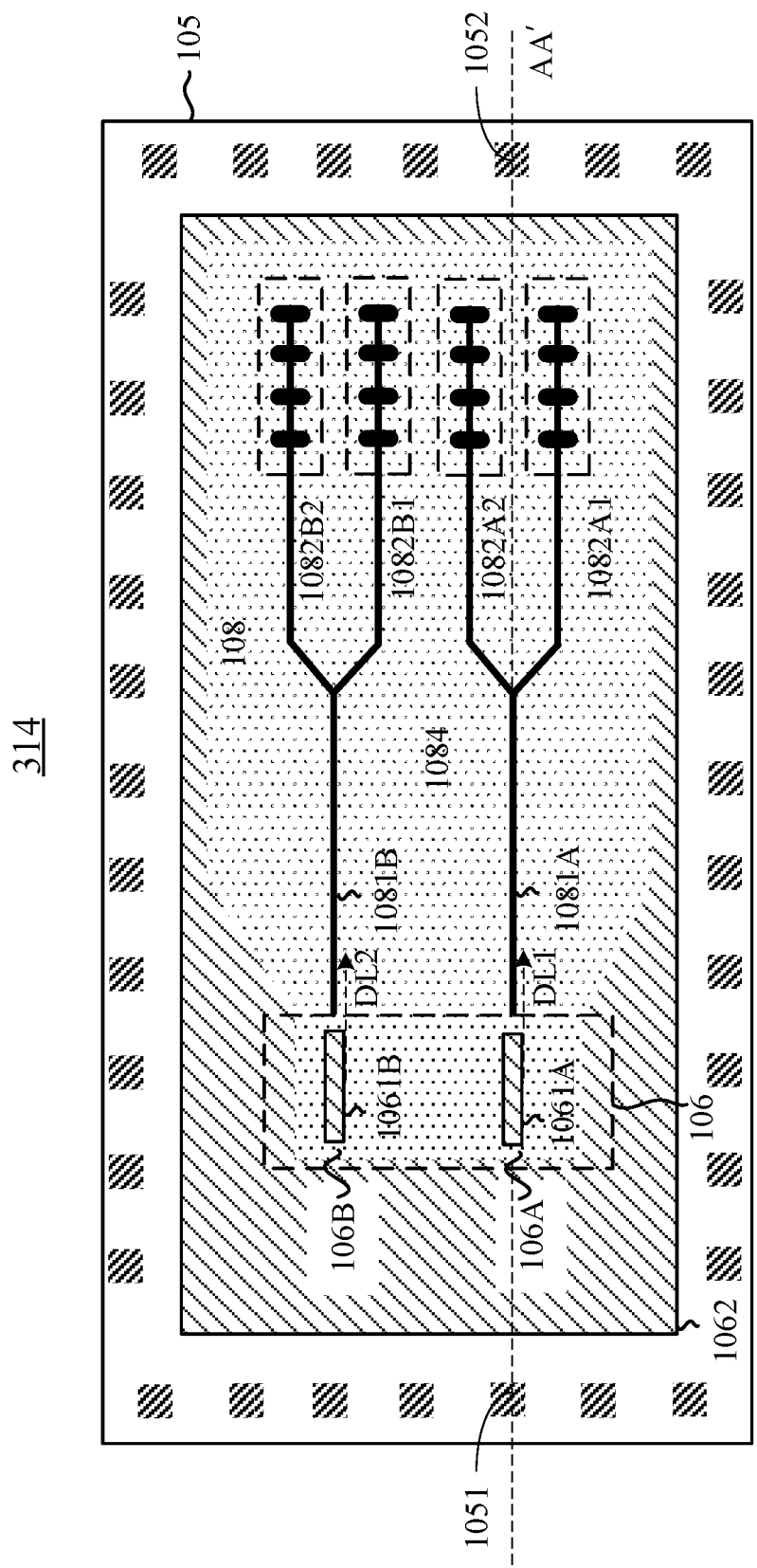
Figures 2, 3H:
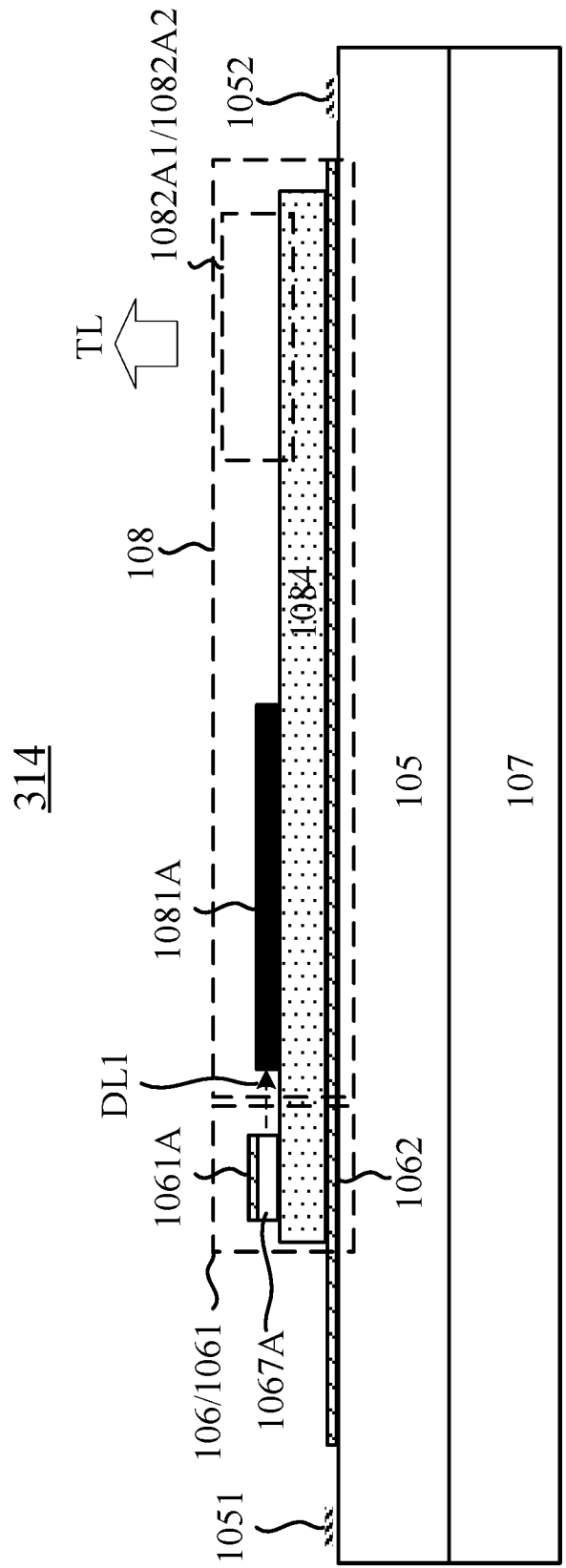

FIG. 3H-1 and FIG. 3H-2 illustrate an embodiment of light emission apparatus 314. Compared to light emission apparatus 310, the laser diode 106 and optical module 108 in this embodiment share the same substrate 1084.

Figures 1, 3I:
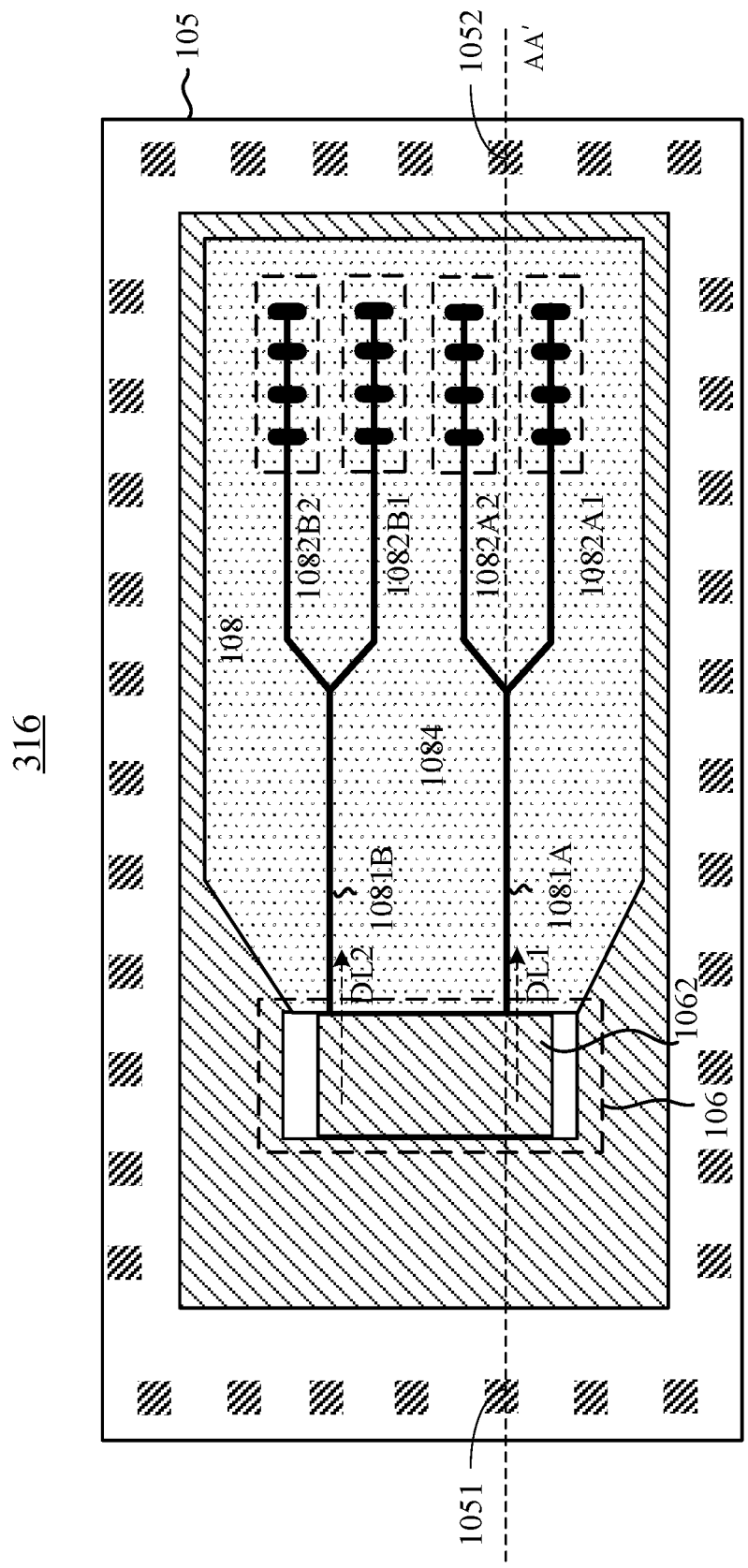
Figures 2, 3I:
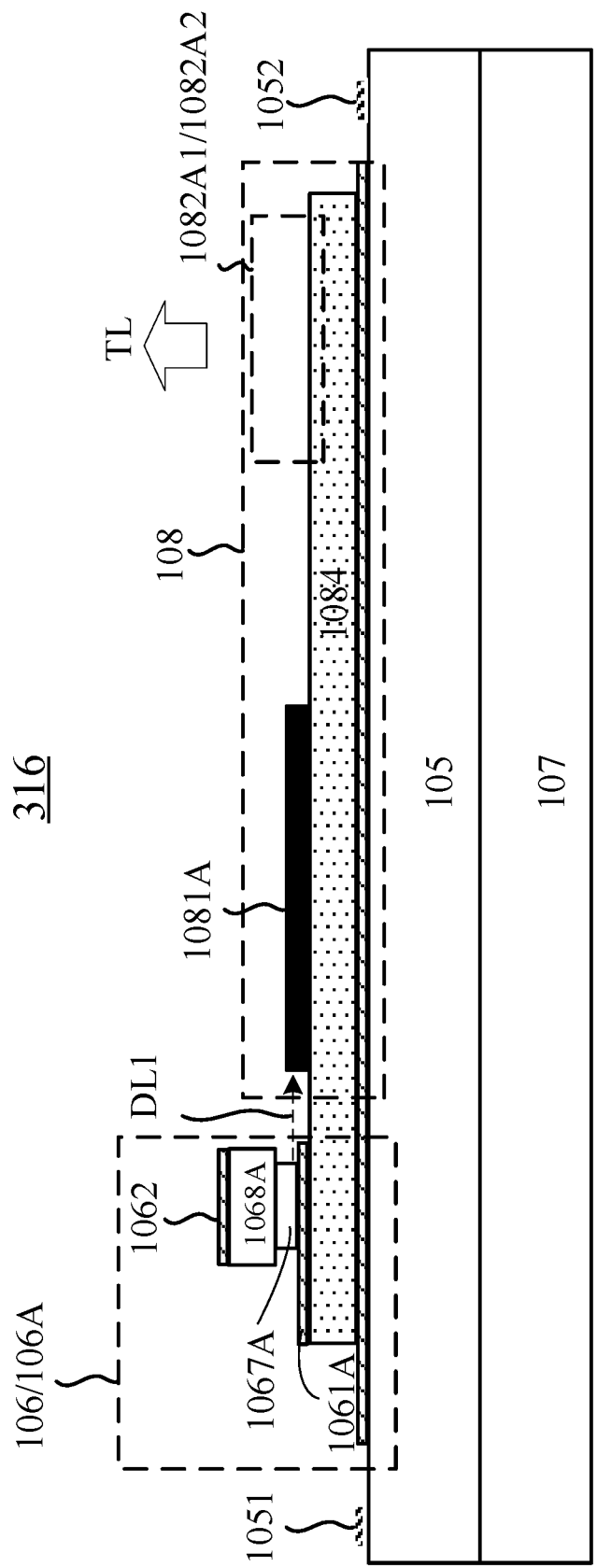

FIG. 3I-1 and FIG. 3I-2 illustrate an embodiment of light emission apparatus 316. Compared to light emission apparatus 314, laser diode 106 and optical module 108 in this embodiment also shares the same substrate 1084. The difference between light emission apparatus 316 and light emission apparatus 314 is the implementation of laser diode 106. This embodiment flips the laser diode 106 of the light emission apparatus 314 so that the first contacts 1061A and 1061B are placed under the second contact 1062.

Figures 1, 3J:
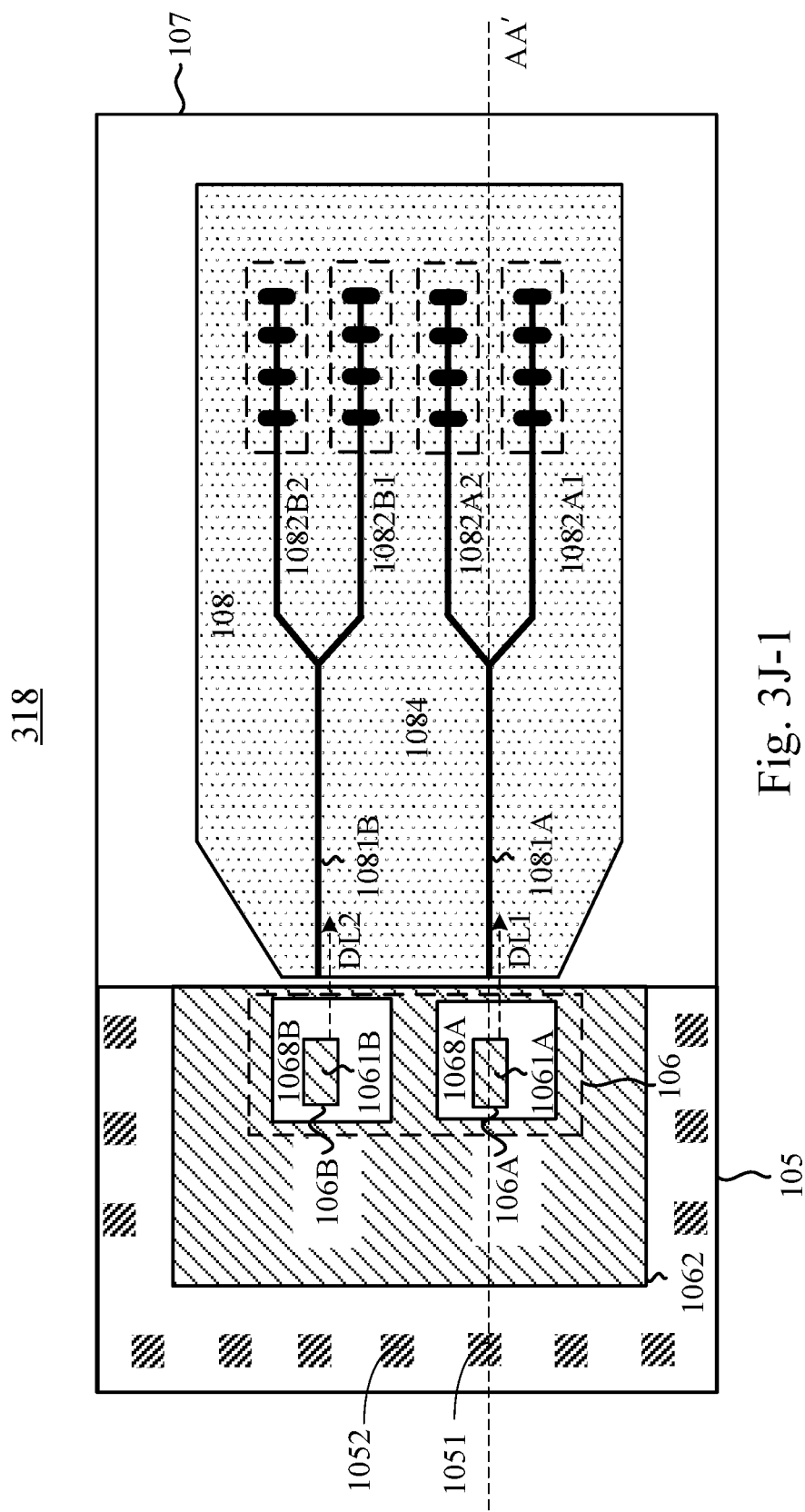
Figures 2, 3J:
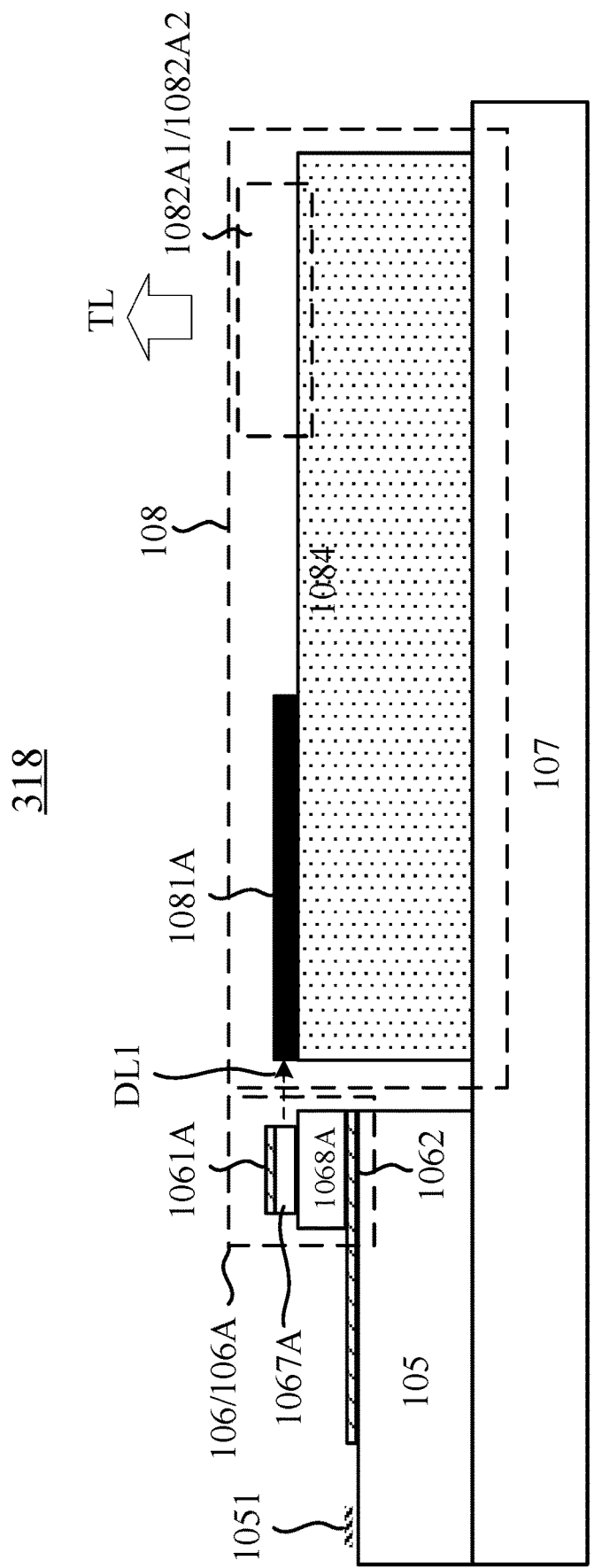

FIG. 3J-1 and FIG. 3J-2 illustrate an embodiment of light emission apparatus 318. Compared to light emission apparatus 310, laser diode 106 in this embodiment is stacked on the laser driver 105, but laser driver 105 is not under the optical module 108. Both laser driver 105 and optical module 108 are supported by the carrier 107.

Figures 1, 3K:
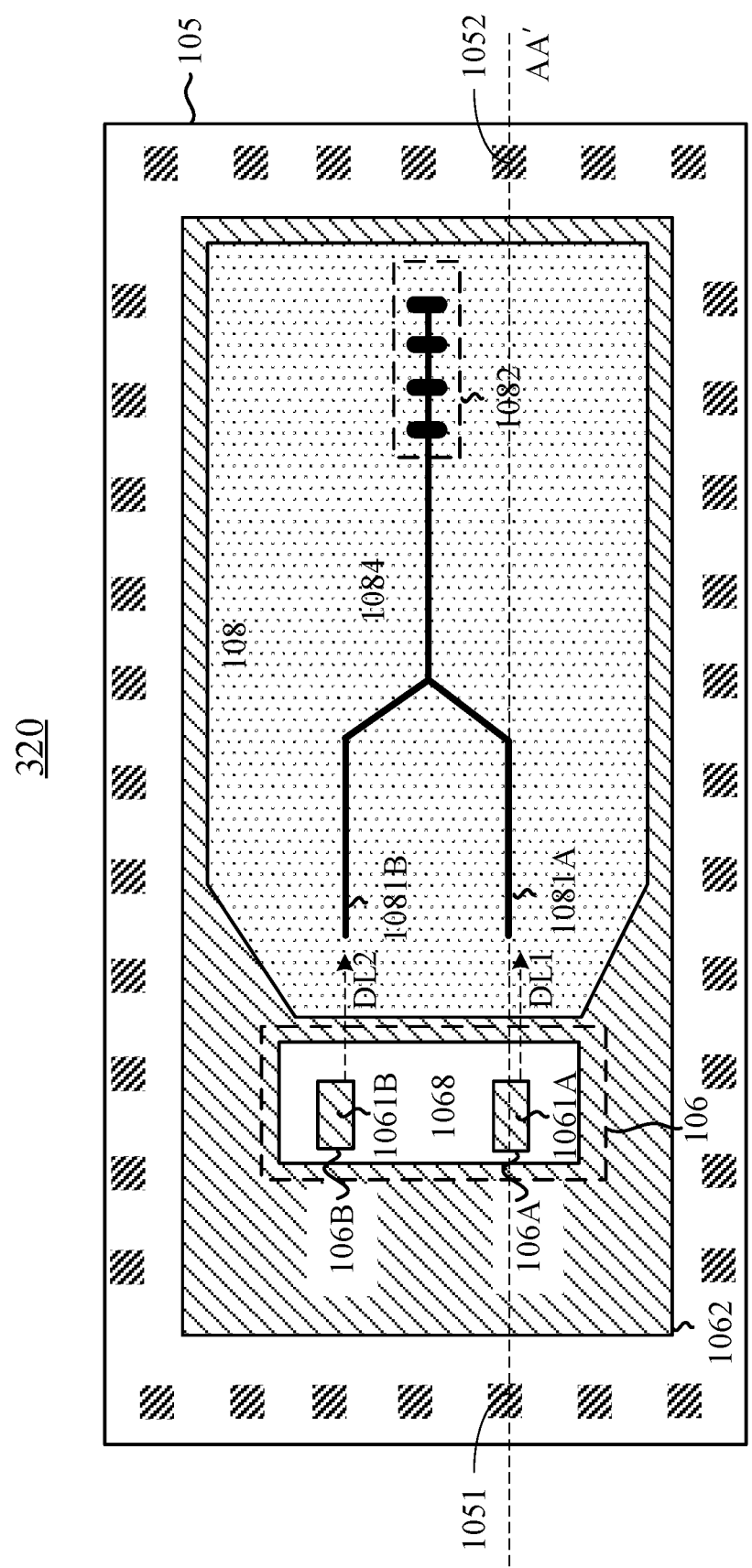
Figures 2, 3K:
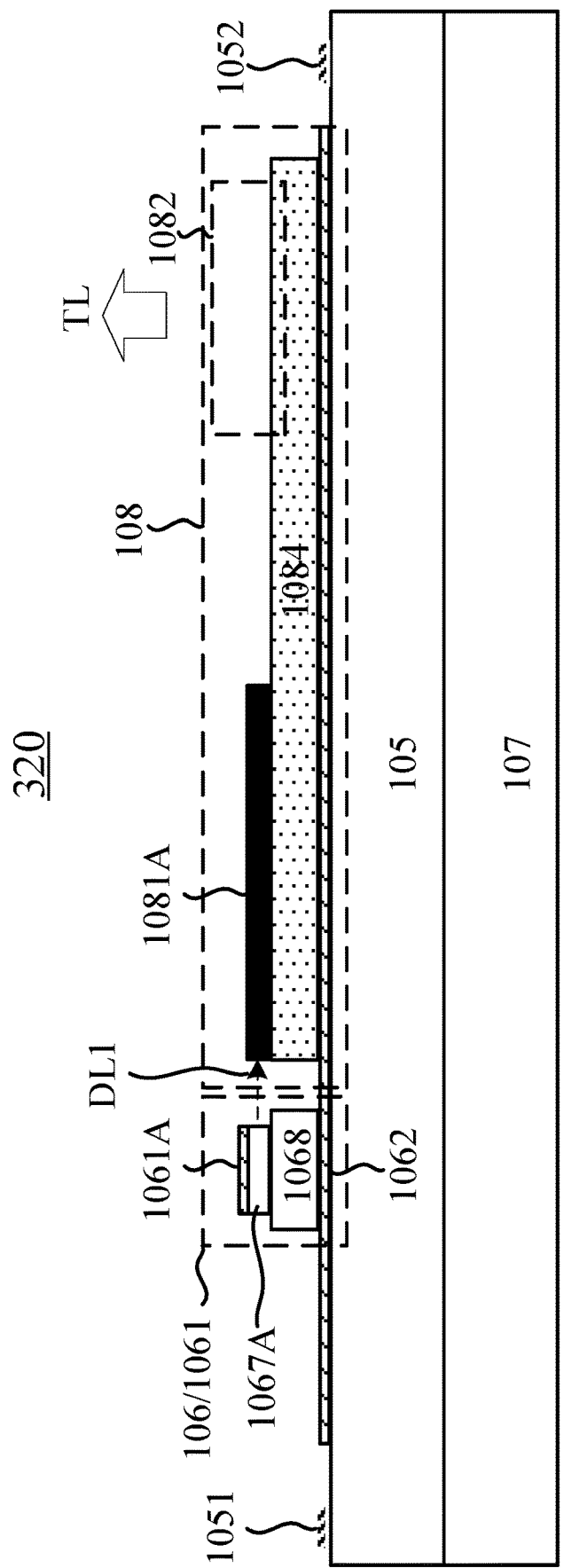

FIG. 3K-1 and FIG. 3K-2 illustrate an embodiment of light emission apparatus 320. In laser diode 106, this embodiment utilizes one substrate 1068 and 1068 to support laser bar 106A and 106B. In optical module 108, it includes one vertical grating couplers 1082. Specifically, the light DL1 propagates along waveguide 1081A and light DL2 propagates along waveguide 1081B, this two lights DL1 and DL2 will be combined and transmitted by vertical grating couplers 1082 accordingly. This embodiment utilizes two fans-in (1081A & 1081B) waveguide profile, however, more fans-in waveguide profile is also a possible implementation.

Figures 1, 3L:
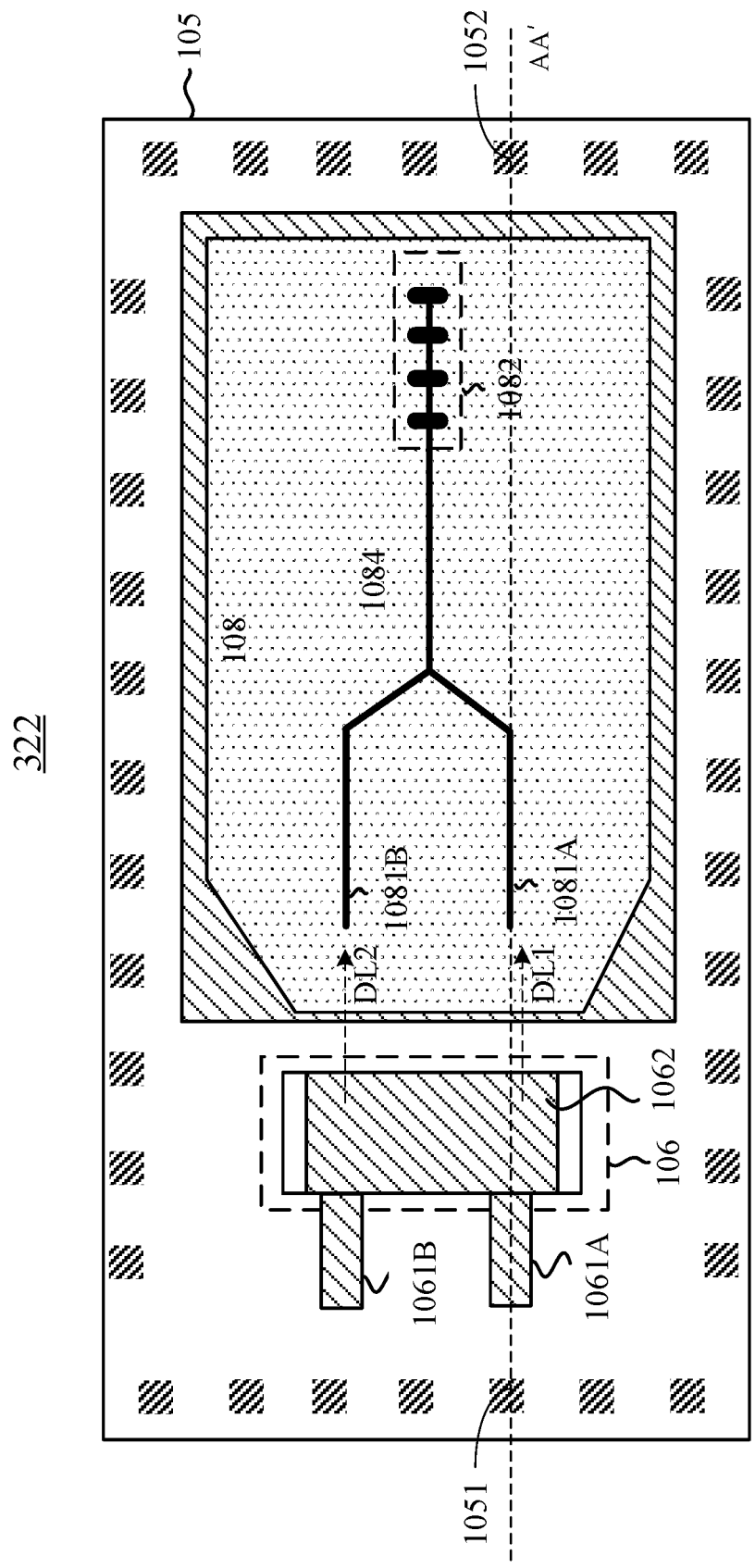
Figures 2, 3L:
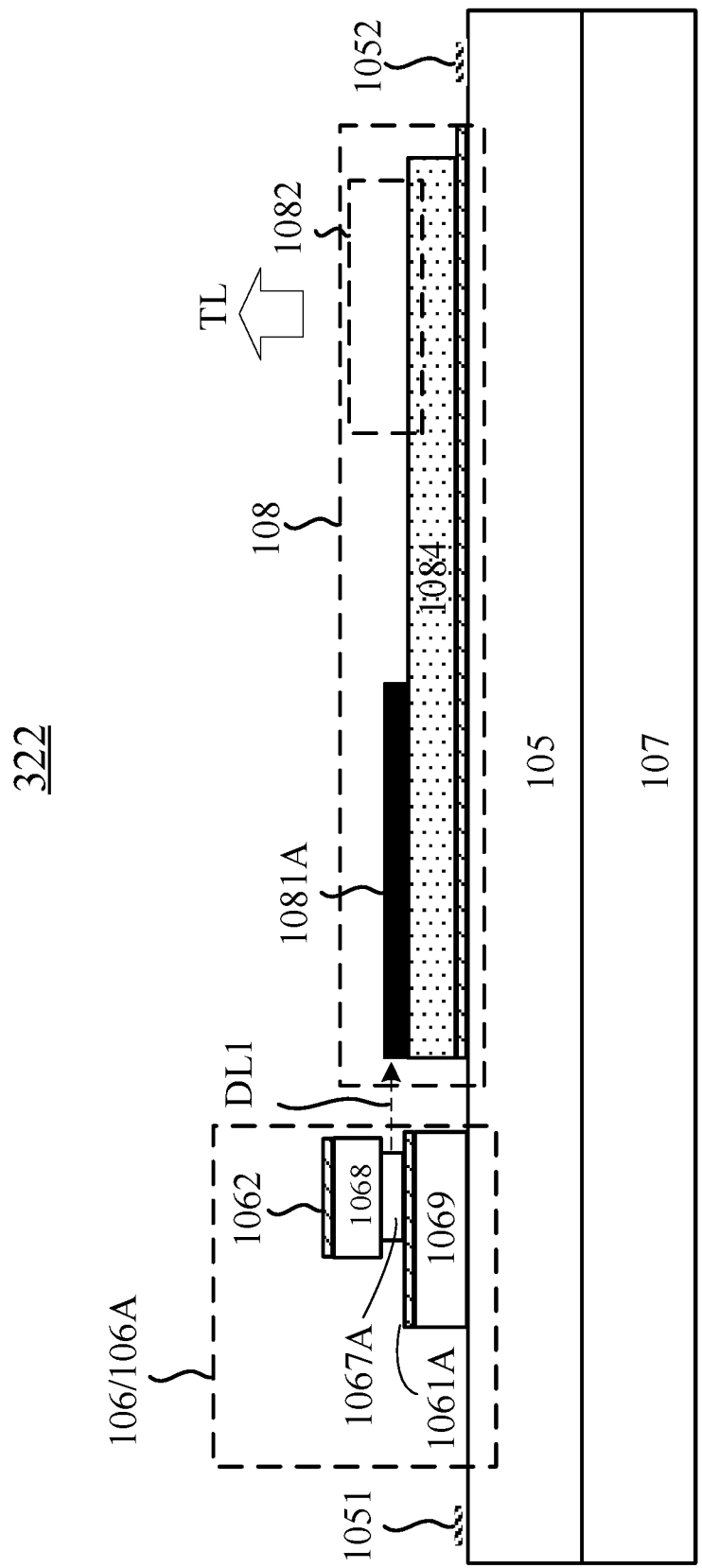

FIG. 3L-1 and FIG. 3L-2 illustrate an embodiment of light emission apparatus 322. Compared to light emission apparatus 322, this embodiment flips the laser diode 106 of the light emission apparatus 310 so that the first contacts 1061A and 1061B are placed under the second contacts 1062. In order to emit the lights DL1 and DL2 into waveguides 1081A and 1081B respectively, this embodiment adds a spacer 1069 under the first contacts 1061A and 1061B which is able to adjust the height of the active regions 1067A and 1067B of the laser diode 106 so that the heights of light DL1 and waveguide 1081A are substantially the same, and the heights of light DL2 and waveguide 1081B are substantially the same.

Figures 1, 3M:
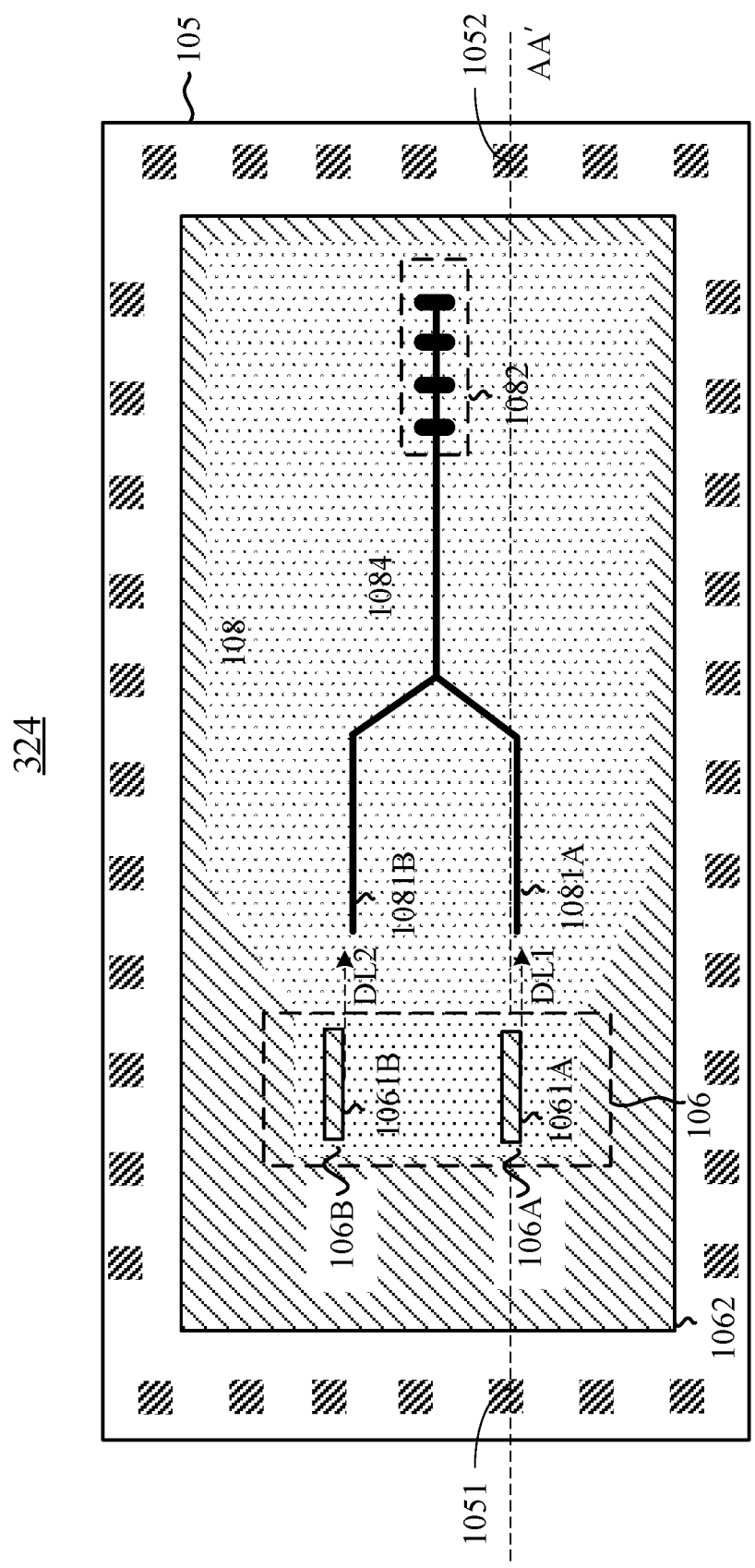
Figures 2, 3M:
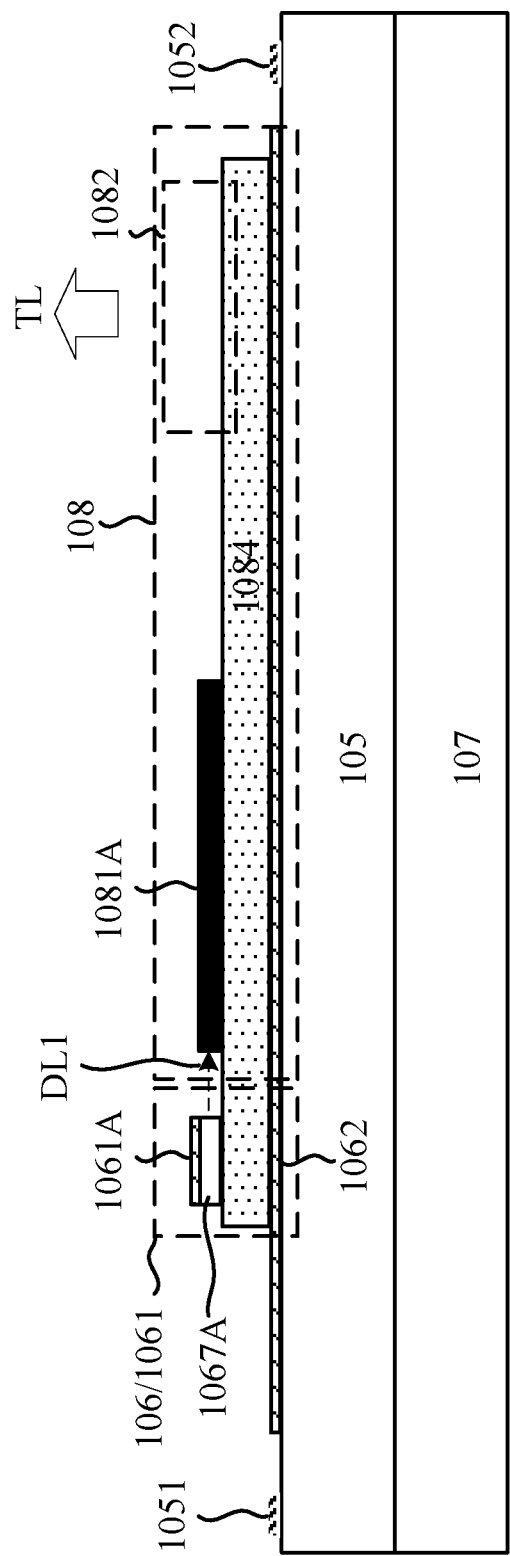

FIG. 3M-1 and FIG. 3M-2 illustrate an embodiment of light emission apparatus 324. Compared to light emission apparatus 320, the laser diode 106 and optical module 108 in this embodiment share the same substrate 1084.

Figures 1, 3N:
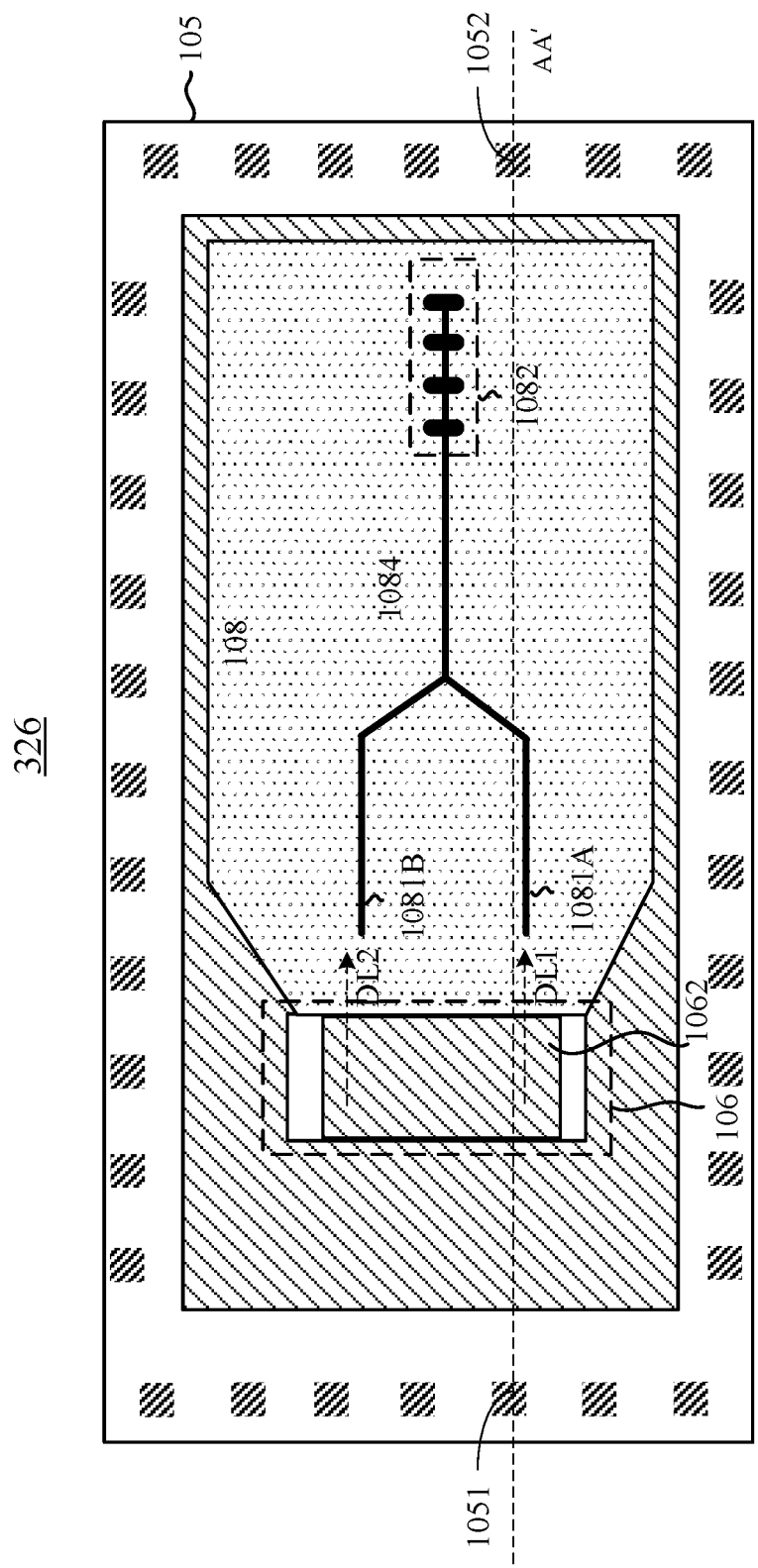
Figures 2, 3N:
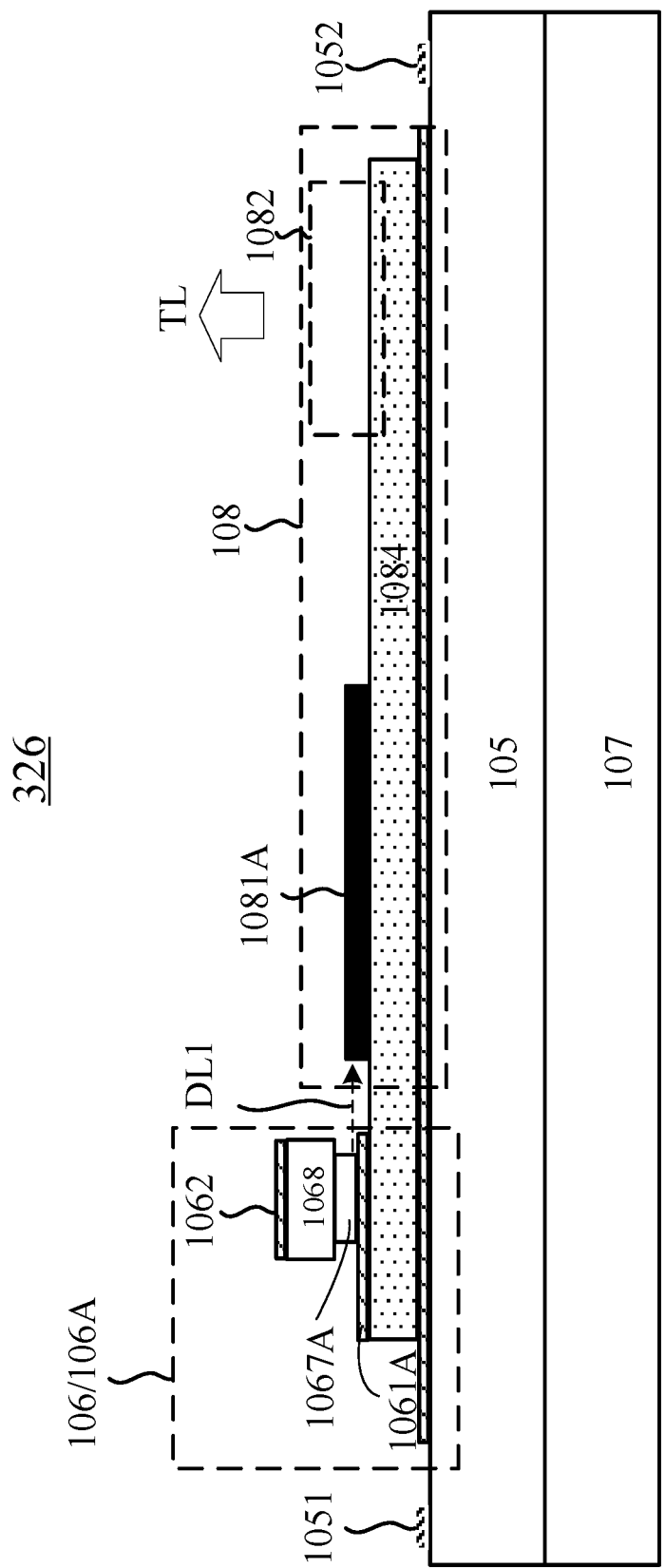

FIG. 3N-1 and FIG. 3N-2 illustrate an embodiment of light emission apparatus 326. Compared to light emission apparatus 324, laser diode 106 and optical module 108 in this embodiment also shares the same substrate 1084. The difference between light emission apparatus 326 and light emission apparatus 324 is the implementation of laser diode 106. This embodiment flips the laser diode 106 of the light emission apparatus 324 so that the first contacts 1061A and 1061B are placed under the second contact 1062.

Figures 1, 3O:
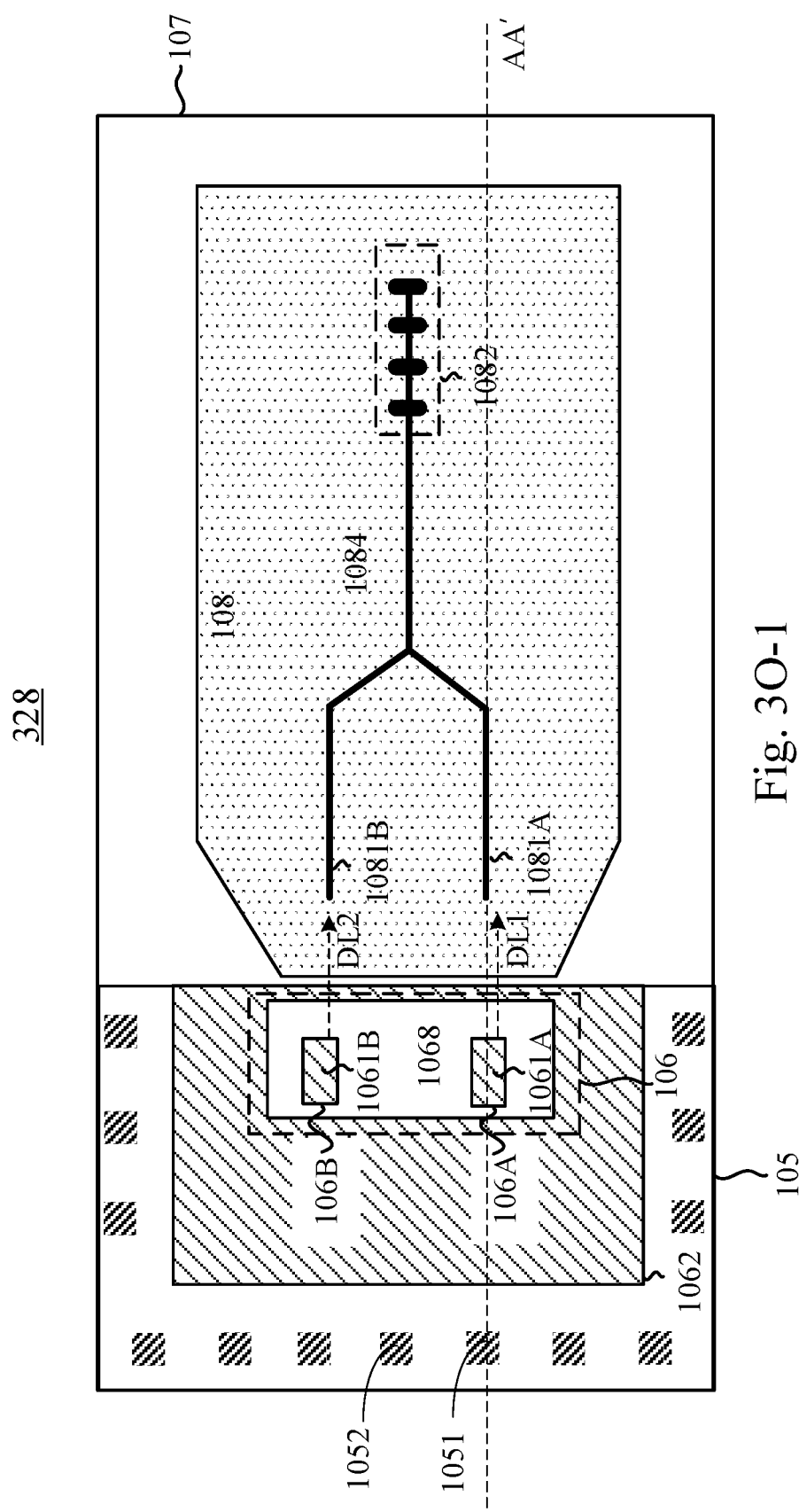
Figures 2, 3O:
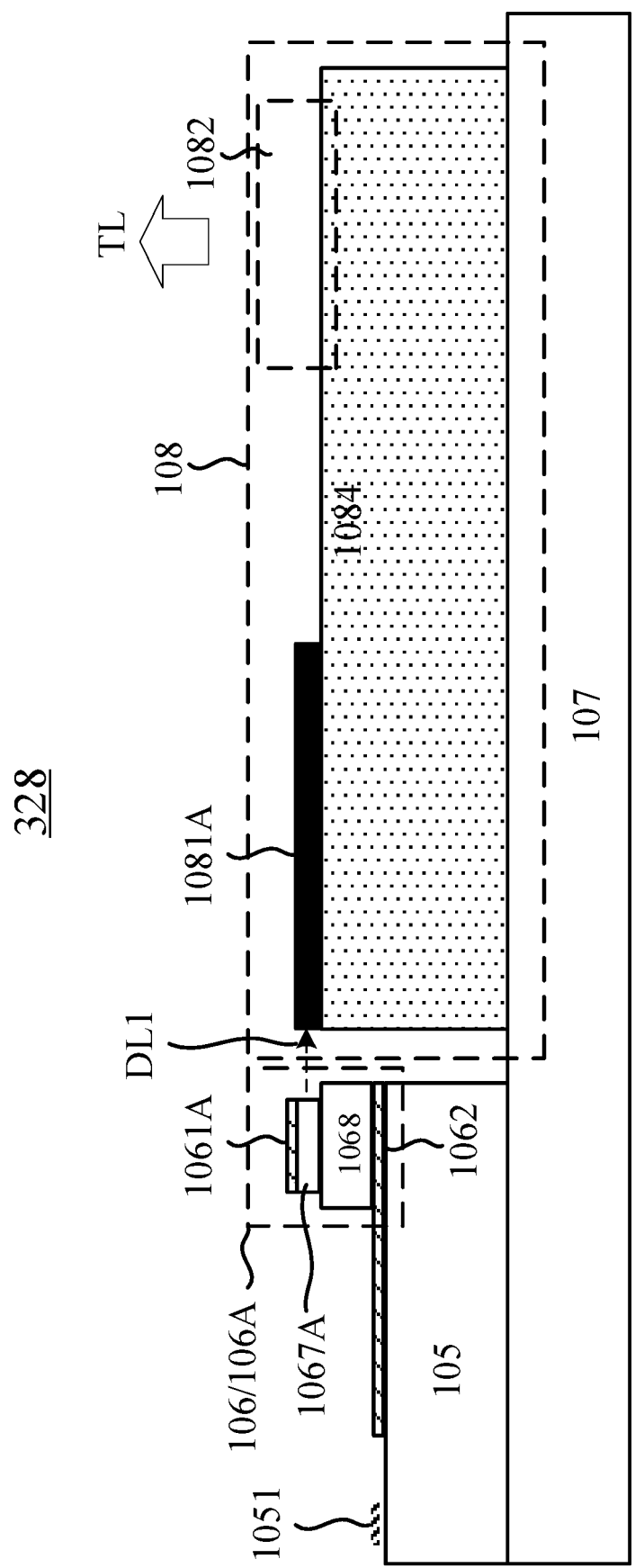

FIG. 3O-1 and FIG. 3O-2 illustrate an embodiment of light emission apparatus 328. Compared to light emission apparatus 320, laser diode 106 in this embodiment is stacked on the laser driver 105, but laser driver 105 is not under the optical module 108. Both laser driver 105 and optical module 108 are supported by the carrier 107.

Figures 1, 3P:
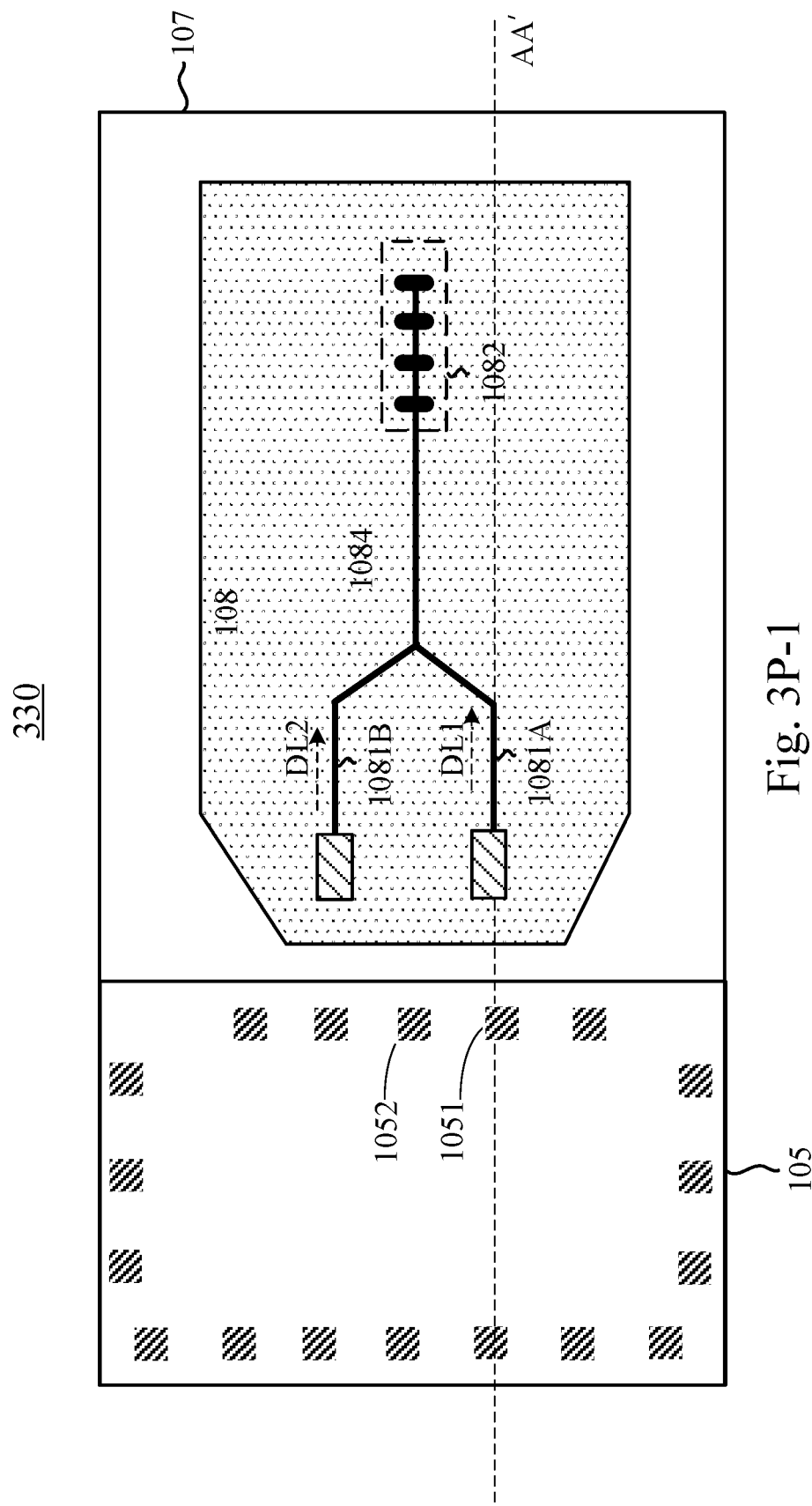
Figures 2, 3P:
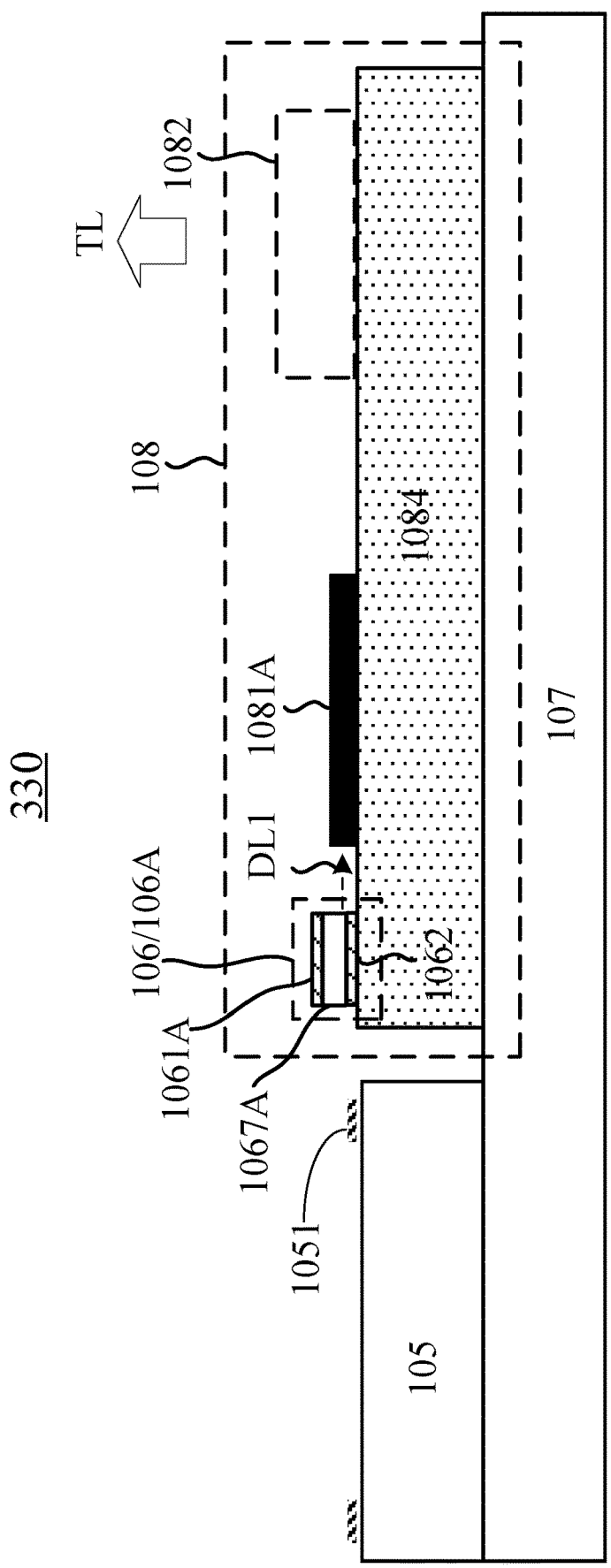

FIG. 3P-1 and FIG. 3P-2 illustrate an embodiment of light emission apparatus 328. This embodiment arranges the laser diode 106 stacked on the optical module 108. Laser driver 105 and optical module 108 are separated, using different substrates 105 and 1084 individually. Both laser driver 105 and optical module 108 are supported by the carrier 107.

Below are the embodiments using edge-emitting laser accompanying with optical elements. The edge-emitting laser and optical elements can be formed monolithically (e.g. as part of an integrated photonic circuit) or separately. Besides, there are many kinds of optical elements can be implemented, using as a mirror to reflect light coming from the edge-emitting laser to a desired direction.

Figure 4A:
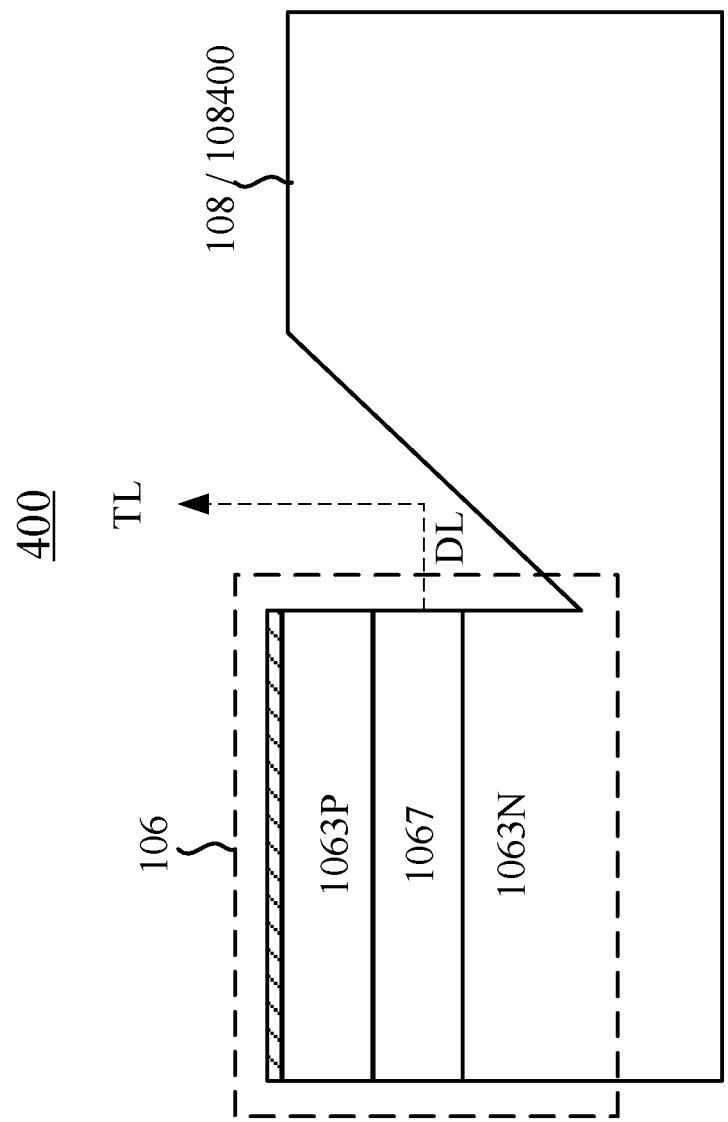
FIGS. 4A to 4J illustrate examples of light emission apparatuses using edge-emitting laser and on-chip optical element, according to some embodiments.

FIG. 4A illustrate an embodiment of light emission apparatus 400. Light emission apparatus 400 includes laser diode 106 and optical module 108. Laser diode 106 is an edge-emitting laser, including active region 1067 and cladding layers 1063N and 1063P. Optical module 108 in this embodiment is a shaped optical element 108400 (or called "shaped optics"), The material of the optical module 108 is the same as the material of the cladding layer 1063N (e.g., n-InGaAlP) and has a shape as shown in FIG. 4A. In some embodiments, the material of the optical module 108 includes semiconductor material. In some embodiments, the optical module 108 includes a sidewall that is not perpendicular to an upper surface of the cladding layer 1063N. Due to the material of the shaped optical element 108400 is the same with the material of the cladding layer 1063N, the region of the cladding layer 1063N and the region of the shaped optical element 108400 are monolithic. With this configuration, the light DL emitted from laser diode 106 can be reflected with a substantially 90-degree angle and output the transmitting light TL.

Figure 4B:
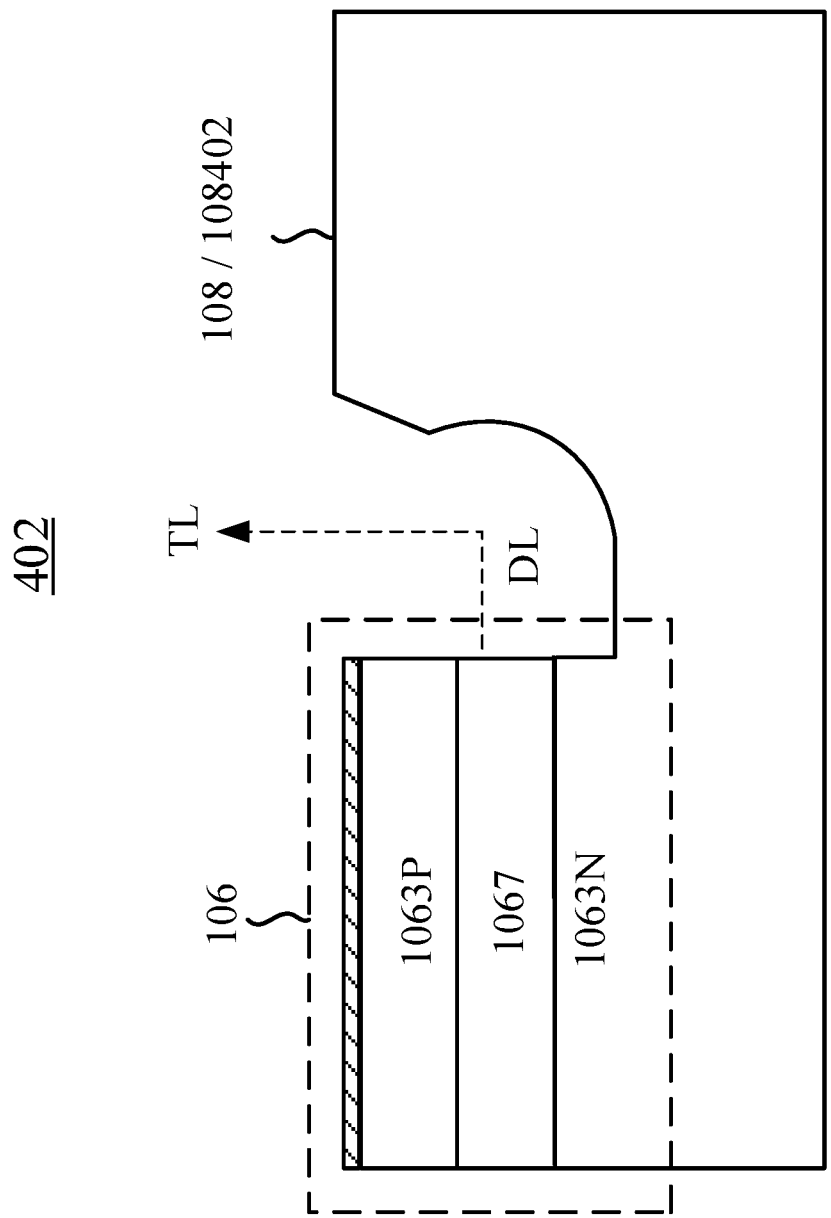

FIG. 4B illustrate an embodiment of light emission apparatus 402. Light emission apparatus 402 includes laser diode 106 and optical module 108. Laser diode 106 is an edge-emitting laser, including active region 1067 and cladding layers 1063N and 1063P. Optical module 108 in this embodiment is a shaped optical element 108402, uses the material same as the cladding layer 1063N (e.g., n-InGaAlP) and has a shape as shown in FIG. 4B. In some embodiment, the sidewall includes a curved portion. Due to the material of the shaped optical element 108402 is the same with the material of the cladding layer 1063N, the region of the cladding layer 1063N and the region of the shaped optical element 108402 are monolithic. With this configuration, the light DL emitted from laser diode 106 can be reflected with a substantially 90-degree angle and output the transmitting light TL.

Figure 4C:
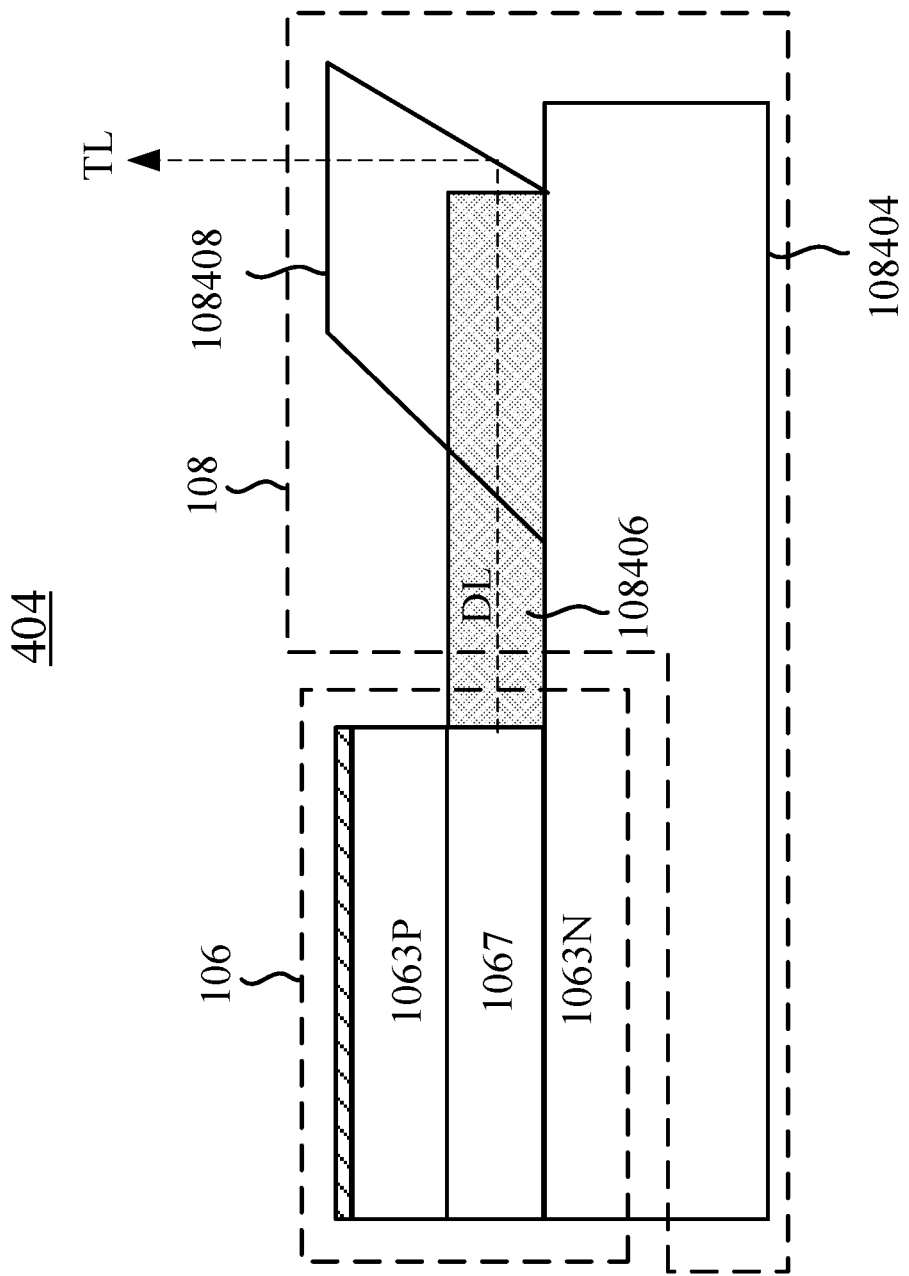

FIG. 4C illustrate an embodiment of light emission apparatus 404. Light emission apparatus 404 includes laser diode 106 and optical module 108. Laser diode 106 is an edge-emitting laser, including active region 1067 and cladding layers 1063N and 1063P. Optical module 108 in this embodiment includes three shaped optical elements 108404, 108406 and 108408. Shaped optical element 108404 uses the material same as the cladding layer 1063N (e.g., n-InGaAlP) and being arranged as a substrate under the laser diode 106. Due to the material of the shaped optical element 108404 is the same with the material of the cladding layer 1063N, the region of the cladding layer 1063N and the region of the shaped optical element 108404 are monolithic. Shaped optical element 108404 in this embodiment is a waveguide for transmitting the light DL in a predetermined route. From a cross-sectional view, the shape of the shaped optical element 108408 in this embodiment is a trapezoid. The light DL can be reflected with a substantially 90-degree angle to output the transmitting light TL.

Figure 4D:
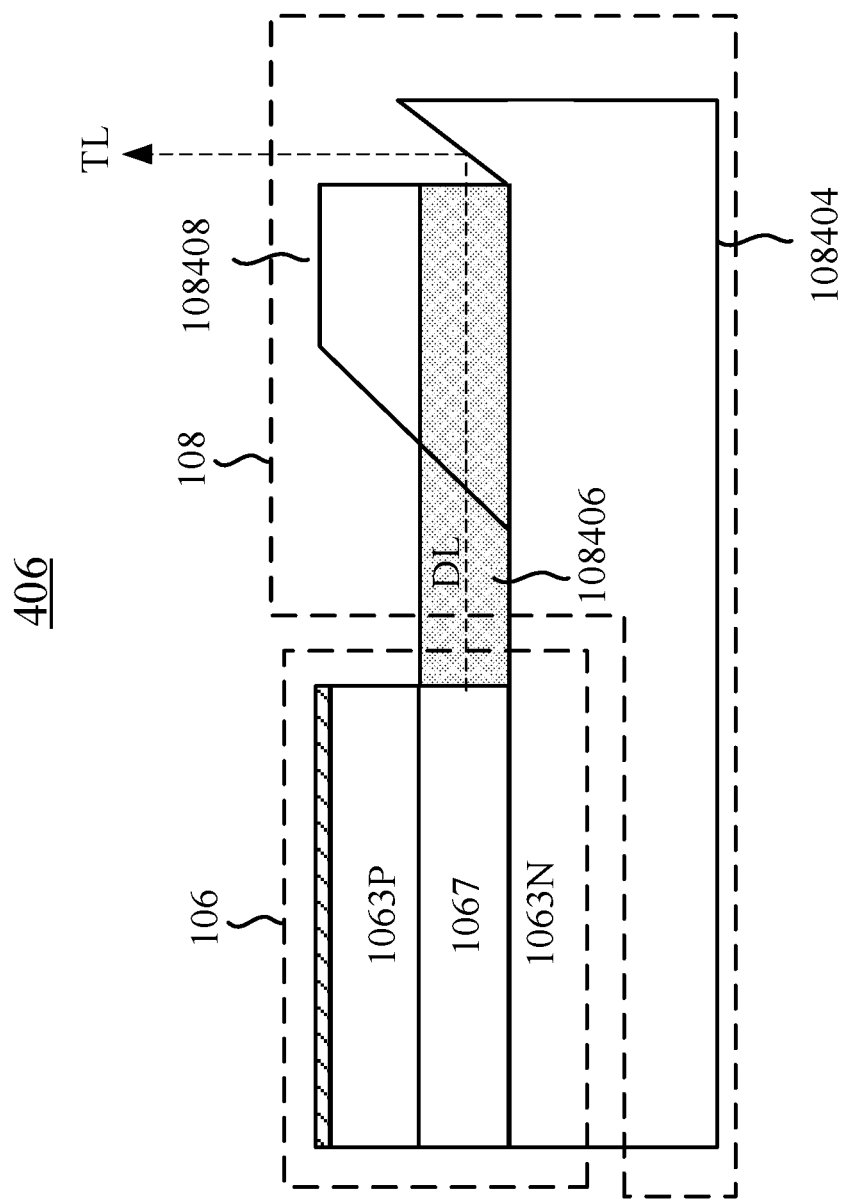
Figure 4E:
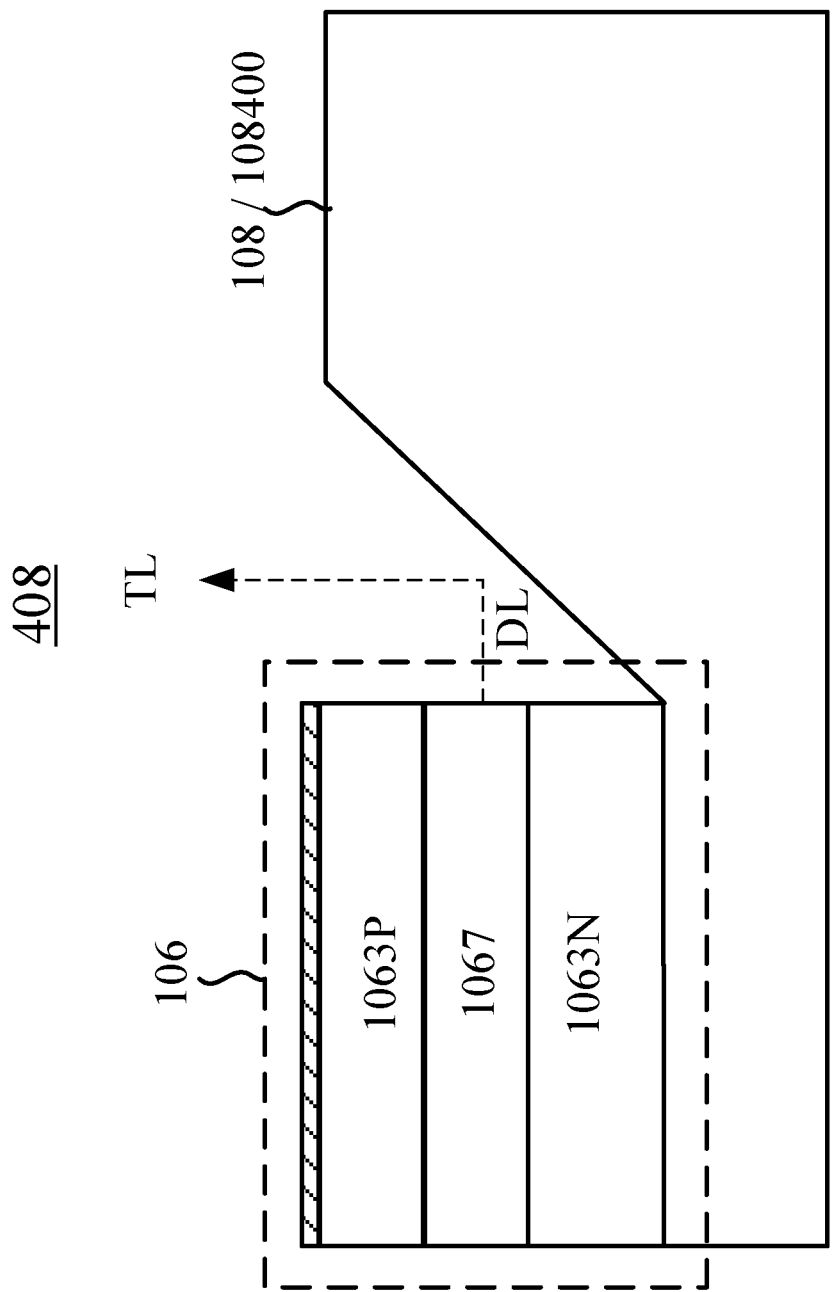
Figure 4F:
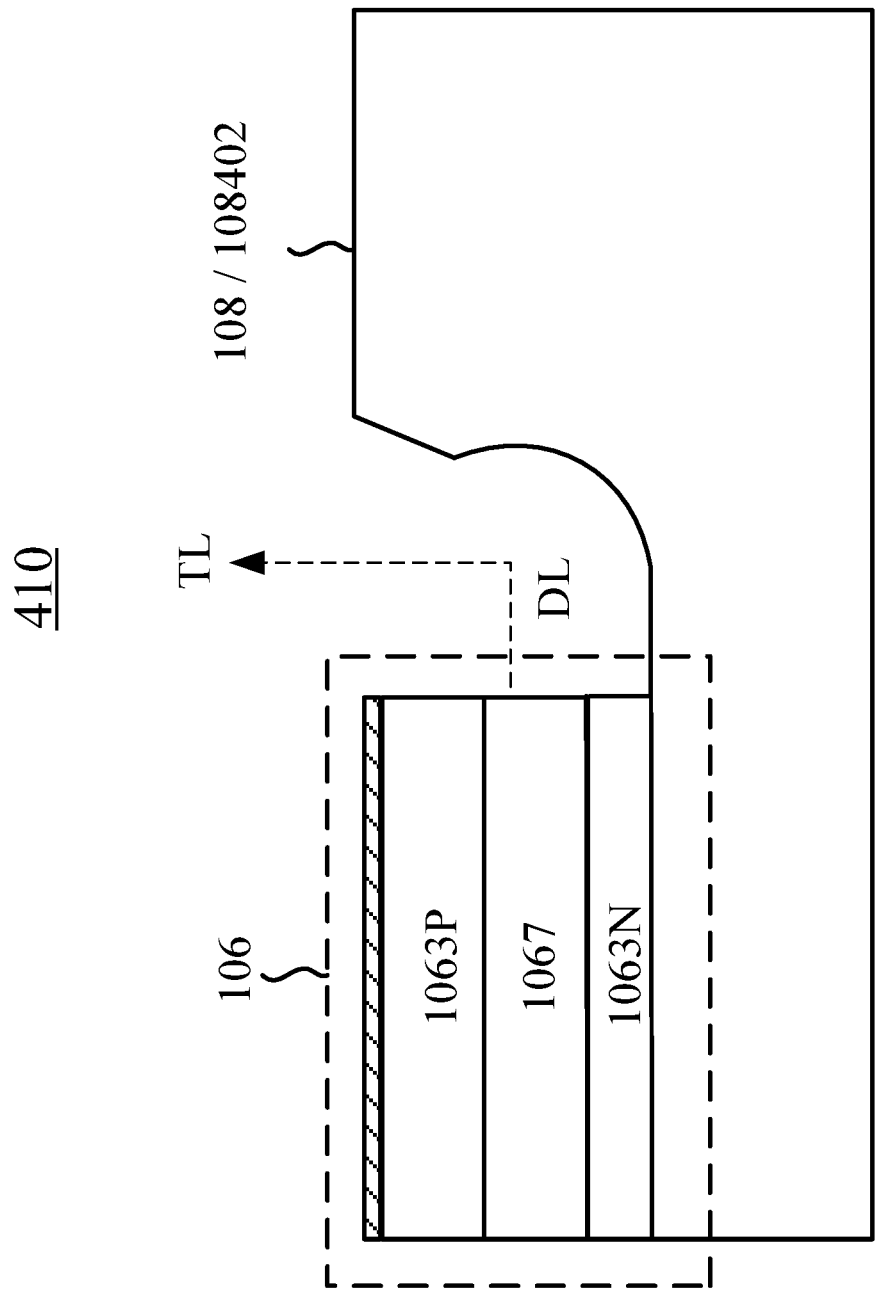
Figure 4G:
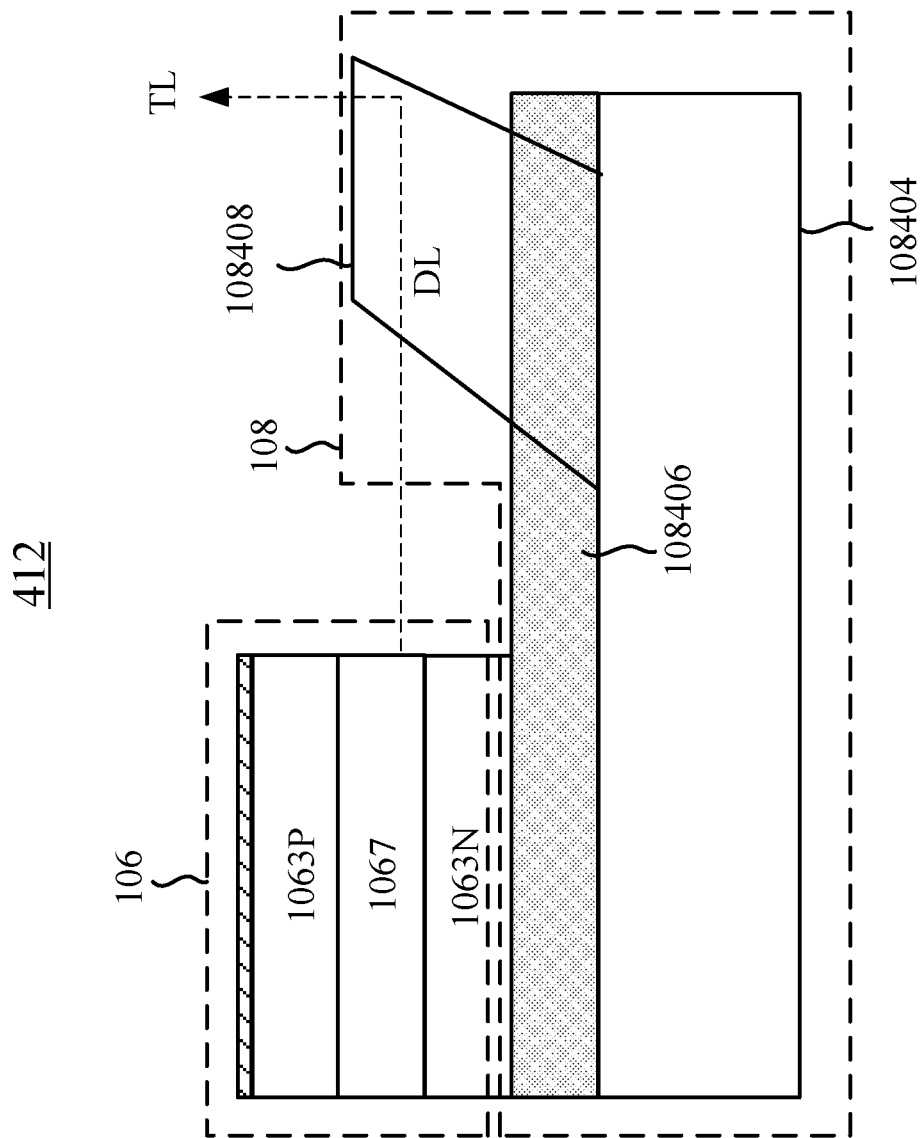
Figure 4H:
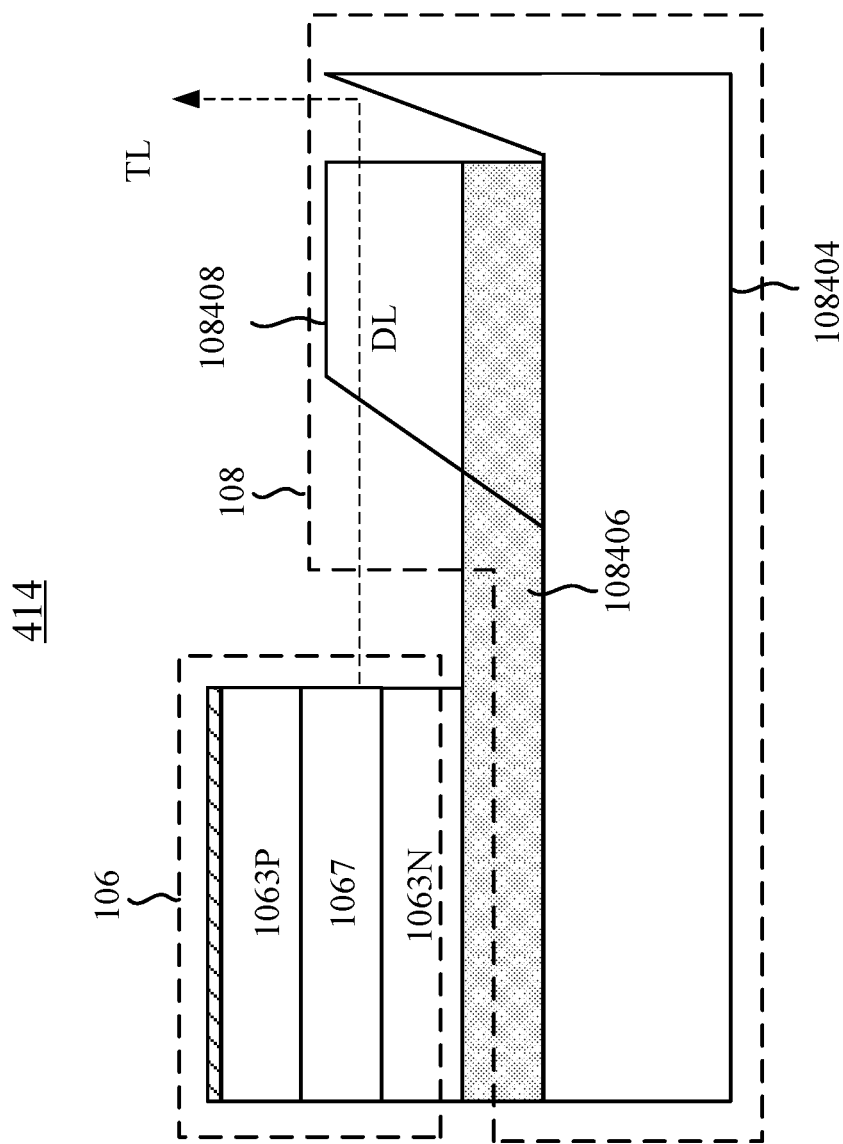

FIG. 4D illustrate an embodiment of light emission apparatus 406. This embodiment is similar to the light emission apparatus 404. The different portions are the shapes of shaped optical element 108404 and shaped optical element 1084408. With this configuration, the light DL emitted from laser diode 106 can be reflected with a substantially 90-degree angle and output the transmitting light TL.

FIG. 4E-FIG. 4H are also the alternative embodiments using edge-emitting laser accompany with optical elements. Light emission apparatuses 408, 410, 412 and 414 are similar to the light emission apparatuses 400, 402, 404 and 406 respectively. The differences are the optical elements 108400, 108402, 108404 and 108406 in these embodiments uses different material with cladding layer 1063N, therefore the formations are not monolithic.

Figure 4I:
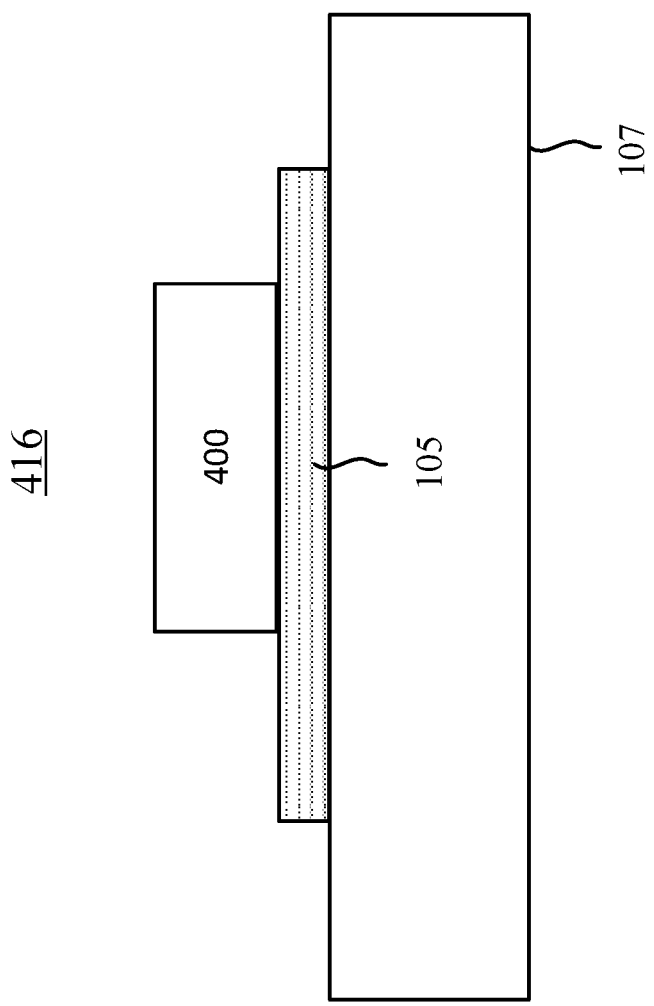
Figure 4J:
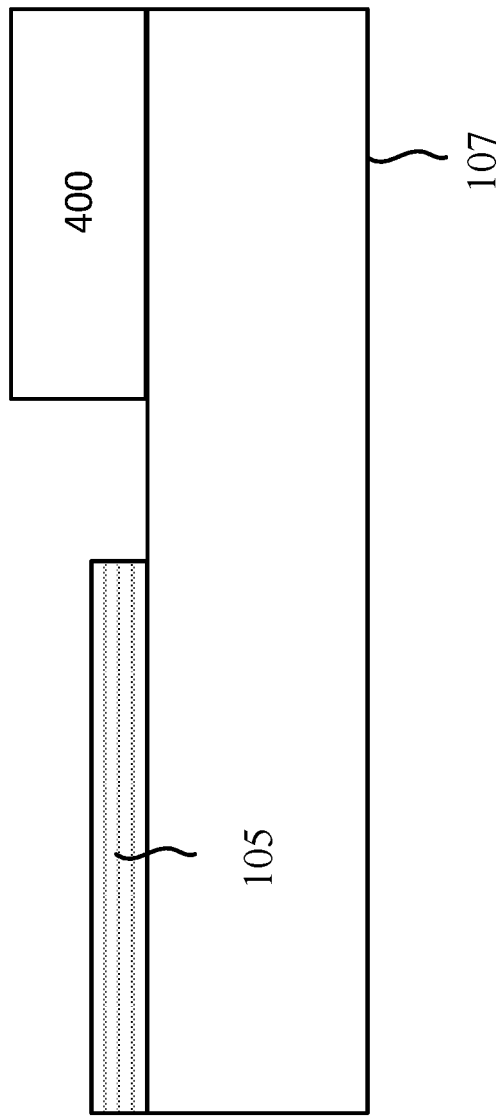

FIG. 4I-FIG. 4J are the embodiments illustrating the spatial relationships for the laser diode, optical module, laser driver and carrier. FIG. 4I illustrates the light emission apparatuses 400 stacked on laser driver 105 on carrier 107. FIG. 4J illustrates the light emission apparatuses 400 separated from laser driver 105, both of them are on carrier 107. Note that the light emission apparatuses 416 and 418 in FIG. 4I-FIG. 4J can be replaced by other embodiments, such as the embodiments shown in FIG. 4A to FIG. 4H.

FIG. 5A illustrates the alternative embodiment of light emission apparatus 500. Light emission apparatus 500 includes laser driver 105, laser diode 106, carrier 107, optical module 108 and sub-mount 555. Laser diode 106 is an edge-emitting laser. Optical module 108 in this embodiment includes shaped optical elements 108500 and 108502. The shaped optical elements 108500 is a collimator. Shaped optical elements 108502 is a 45-degree mirror, which is able to reflect the light DL with a substantially 90-degree angle. The spatial relationship in this embodiment as shown in the figure, laser diode 106 is stacked on laser driver 105, laser driver is stacked on carrier 107, and carrier 107 is stacked on sub-mount 555. Optical module 108 is stacked on sub-mount 555. Laser diode 106, laser driver 105 and carriers 107 are separated from optical module 108. Sub-mount 555 can be used to provide a mechanical support and may be made by ceramics for dissipating the heat.

Figure 5B:
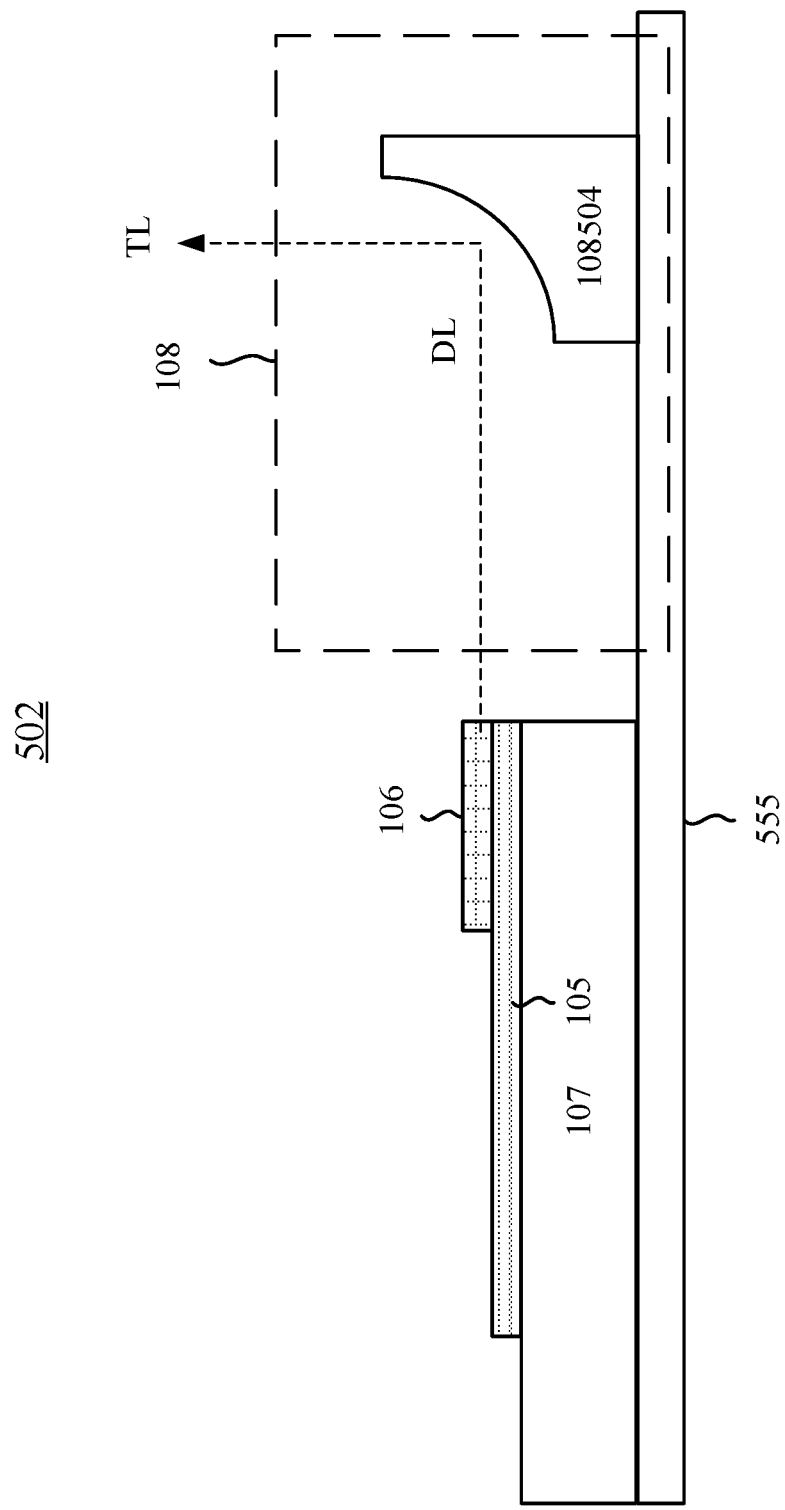

FIG. 5B illustrates the alternative embodiment of light emission apparatus 502. Light emission apparatus 502 includes laser driver 105, laser diode 106, carrier 107, optical module 108 and sub-mount 555. Compared to the light emission apparatus 500, the difference is the shape of the optical module 108. The shaped optical element 108504 has a concave as shown in FIG. 5B, which is a mirror and able to reflect the light DL with a substantially 90-degree angle and output the transmitting light TL.

Figure 5C:
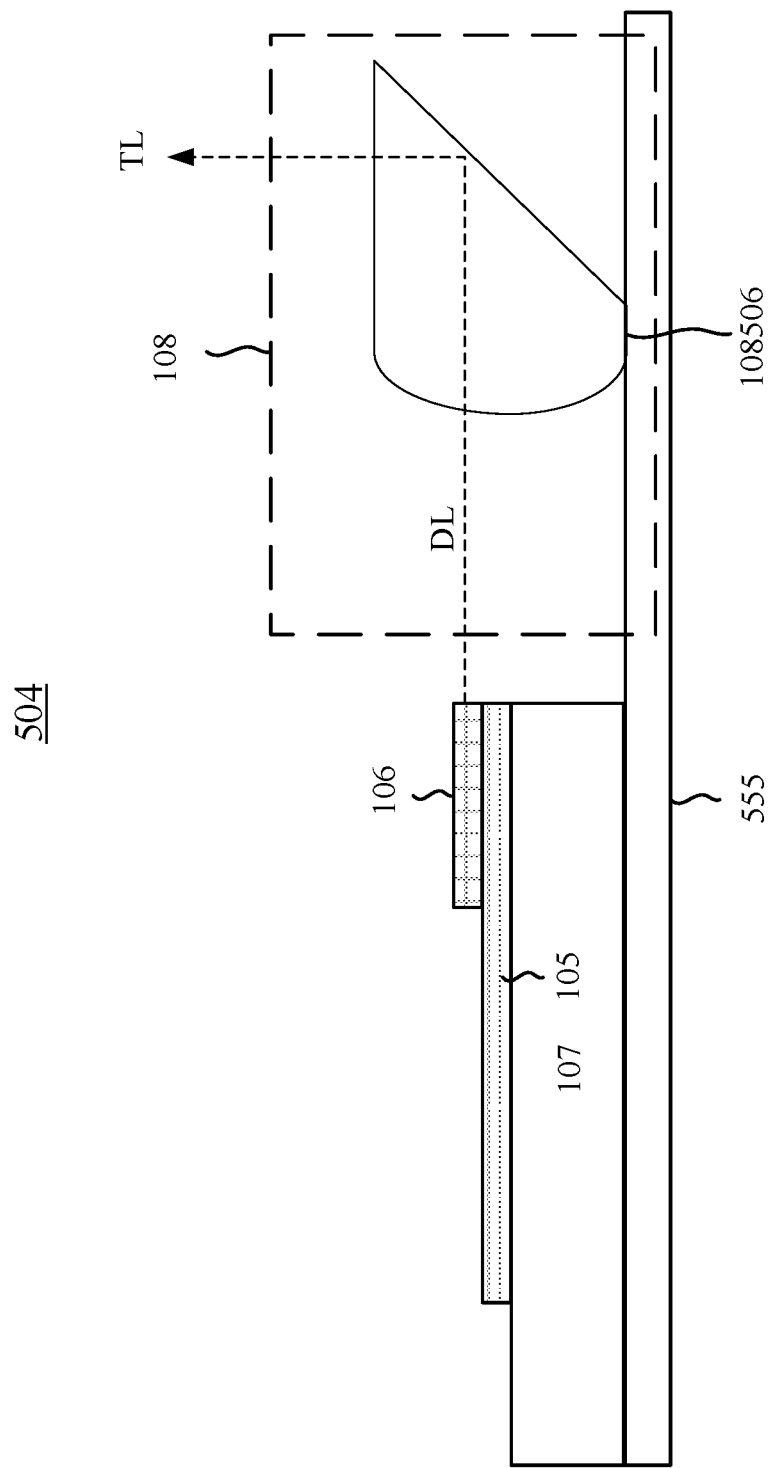

FIG. 5C illustrates the alternative embodiment of light emission apparatus 504. Light emission apparatus 504 includes laser driver 105, laser diode 106, carrier 107, optical module 108 and sub-mount 555. Compared to the light emission apparatus 502, the difference is the shape of the optical module 108. The shaped optical element 108506 includes an inclined surface and a curved surface.

Figure 5D:
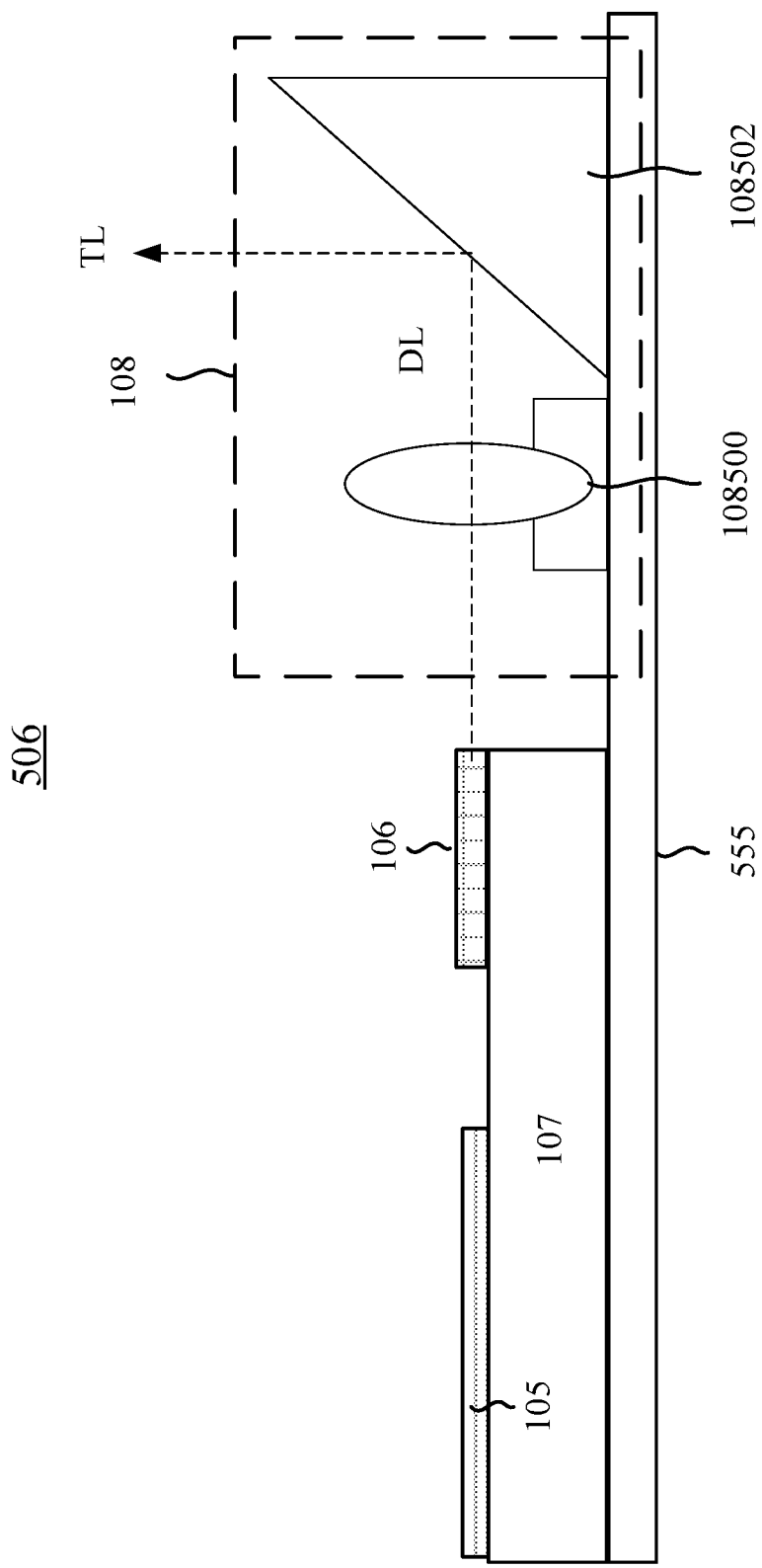
Figure 5E:
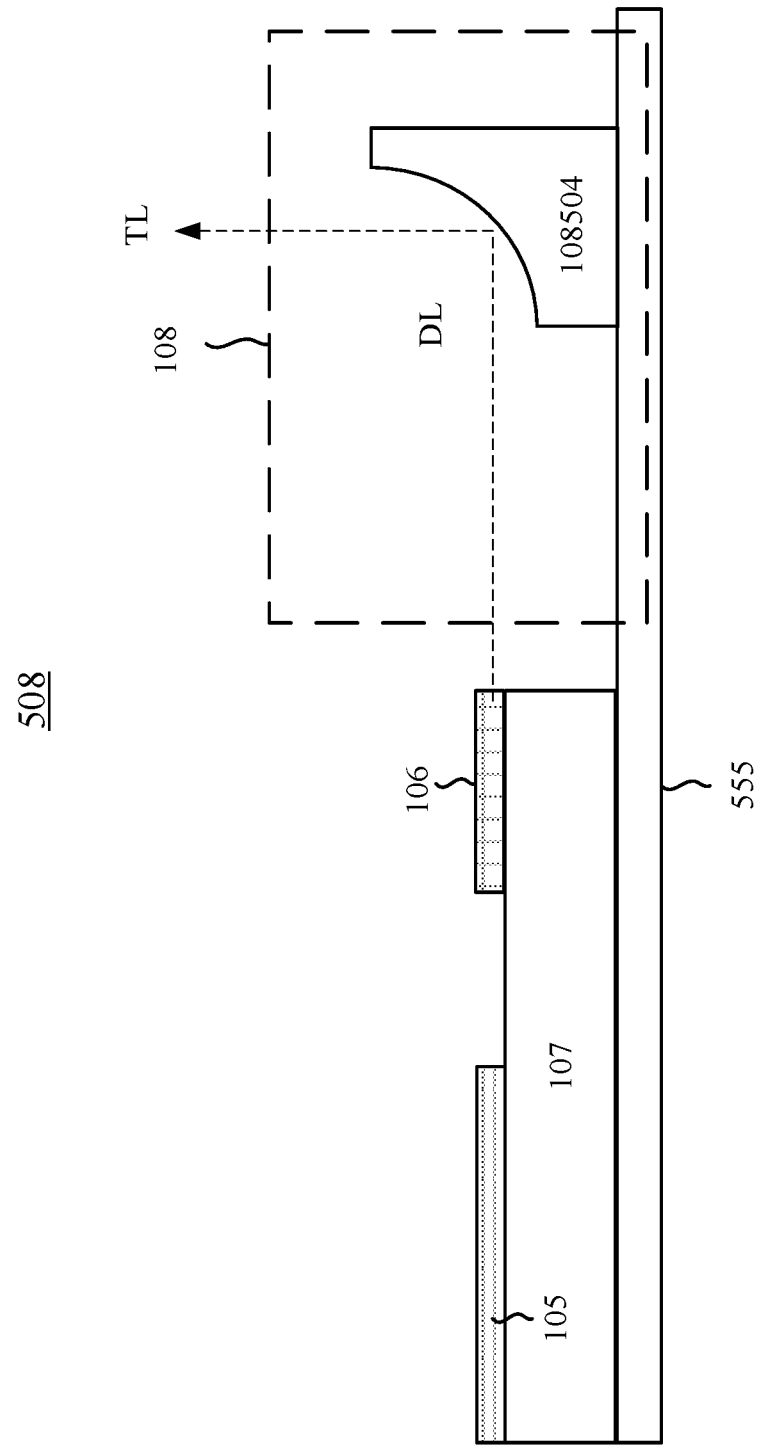
Figure 5F:
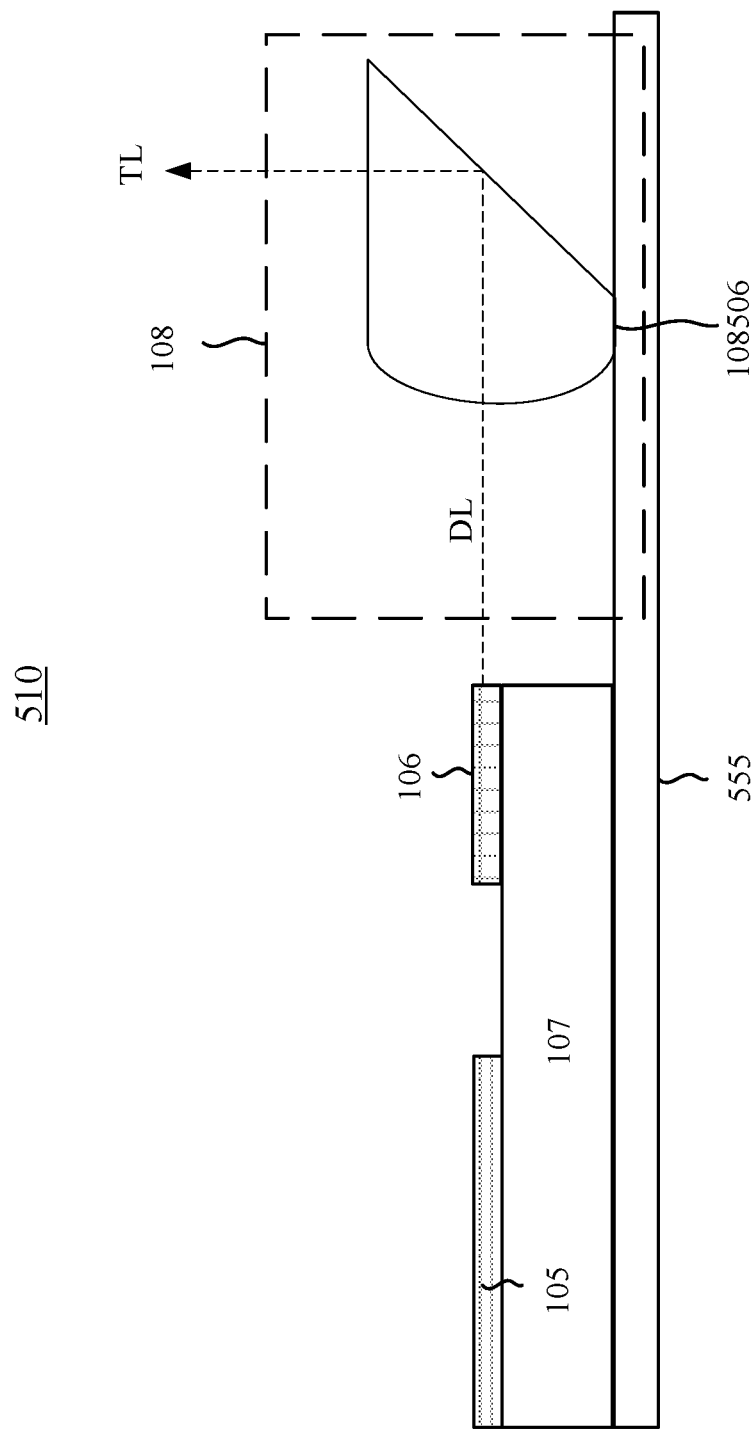

FIG. 5D-FIG. 5F are the alternative embodiments of light emission apparatus. Light emission apparatuses 506, 508 and 510 are similar to the light emission apparatuses 500, 508 and 510. The different parts are the positions of laser driver 105 and laser diode 106. The laser driver 105 and laser diode 106 in FIG. 5D-FIG. 5F are positioned in a horizontal plane and the laser diode 106 is between the laser driver 105 and the optical module 108.

Figure 5G:
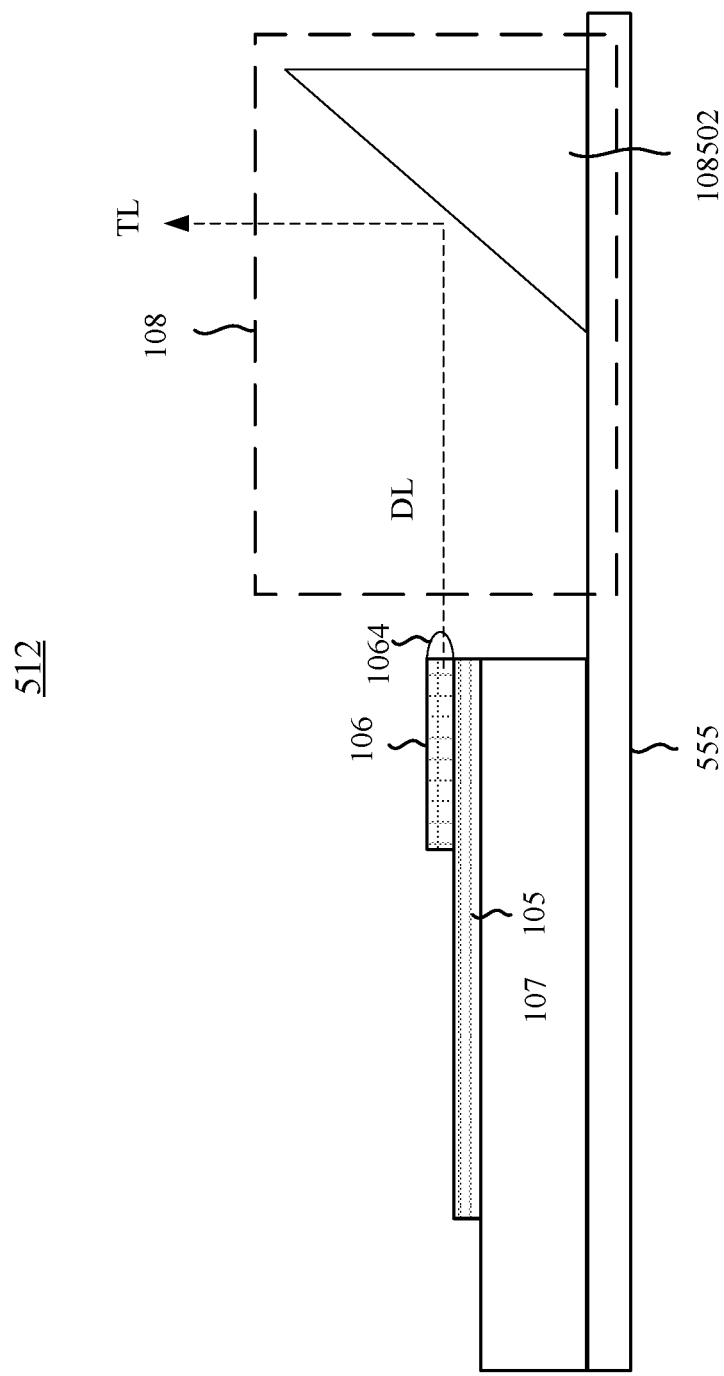
Figure 5H:
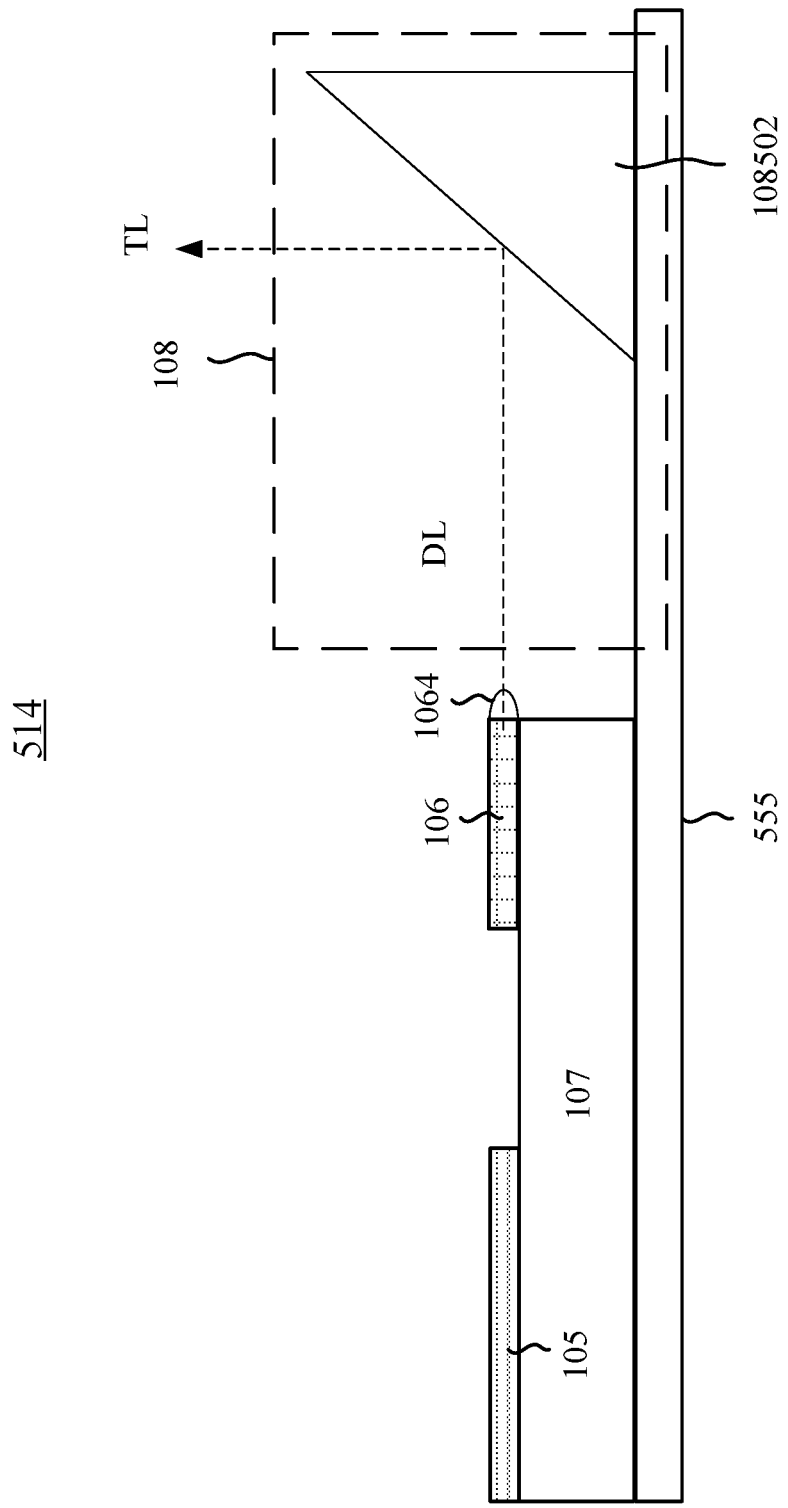

In addition to the elements disclosed in above-mentioned embodiments, micro-lens can be introduced as well. FIG. 5G and FIG. 5H are the embodiments using the micro-lens 1064 equipped on laser diode 106. The difference between the embodiments of FIG. 5G and FIG. 5H are the positions of laser driver 105 and laser diode 106.

Figures 1, 6A:
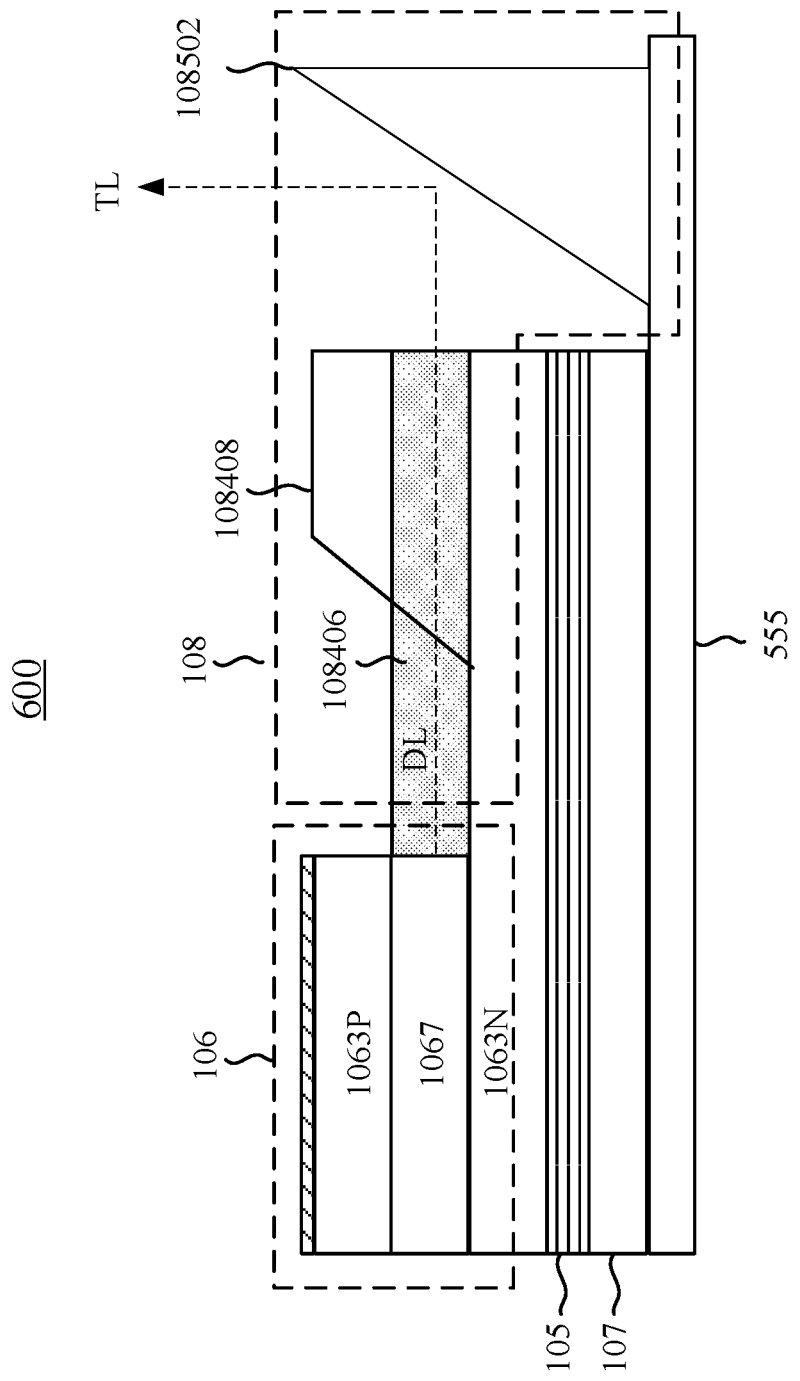
Figures 2, 6A:
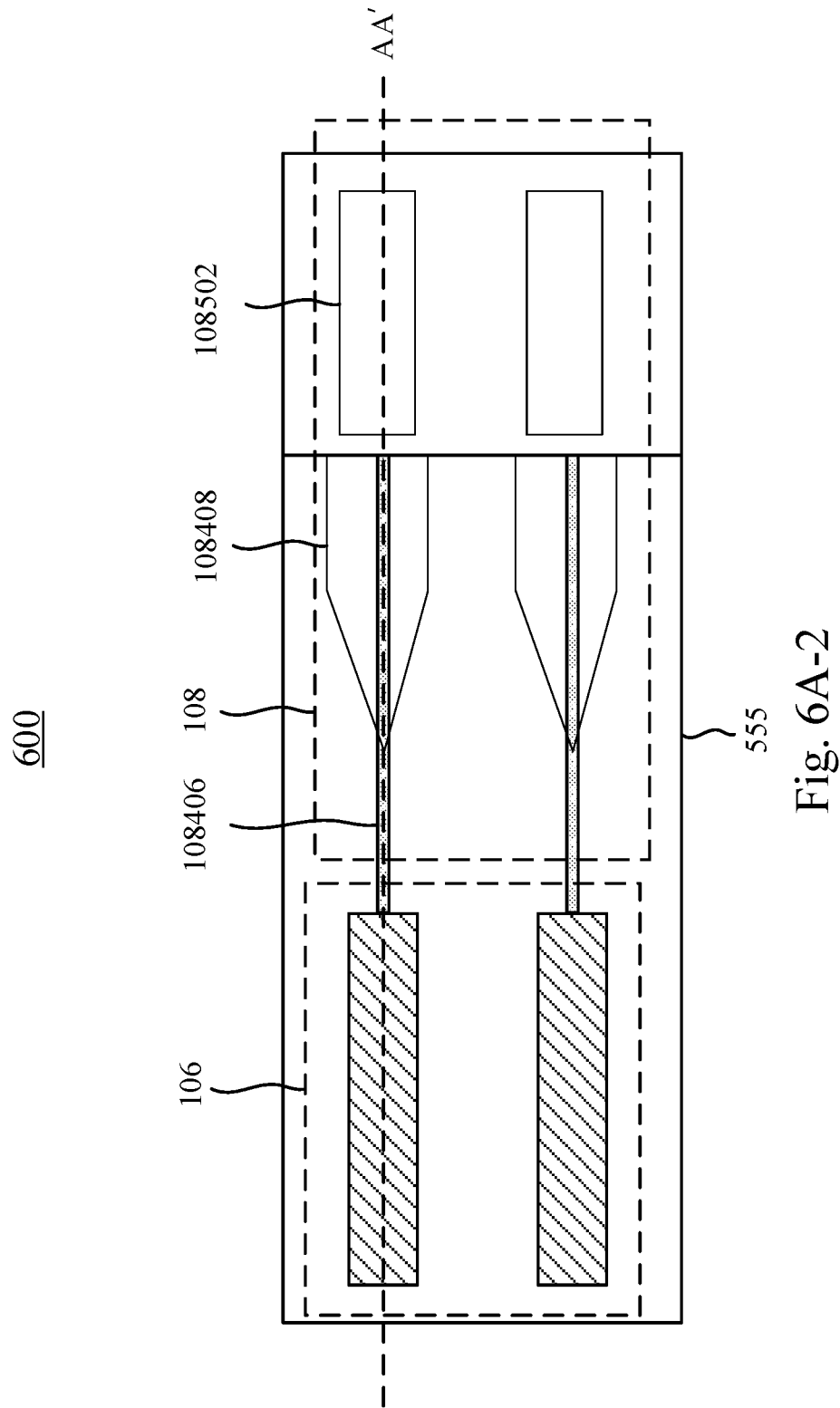

FIG. 6A-1 and FIG. 6A-2 illustrate the alternative embodiment of light emission apparatus 600, which combines on-chip optical element and off-chip optical element. Light emission apparatus 600 includes laser driver 105, laser diode 106, carrier 107, optical module 108 and sub-mount 555. Optical module 108 includes shaped optical element 108408 and shaped optical element 108502, wherein the shaped optical element 108408 is on-chip and shaped optical element 108502 is off-chip. In this embodiment, a portion of the optical module 108 and a portion of the cladding layer 1063N of the laser diode 106 are formed monolithically. The spatial relationship for each element as shown in the figures, related descriptions are omitted herein.

Figures 1, 6B:
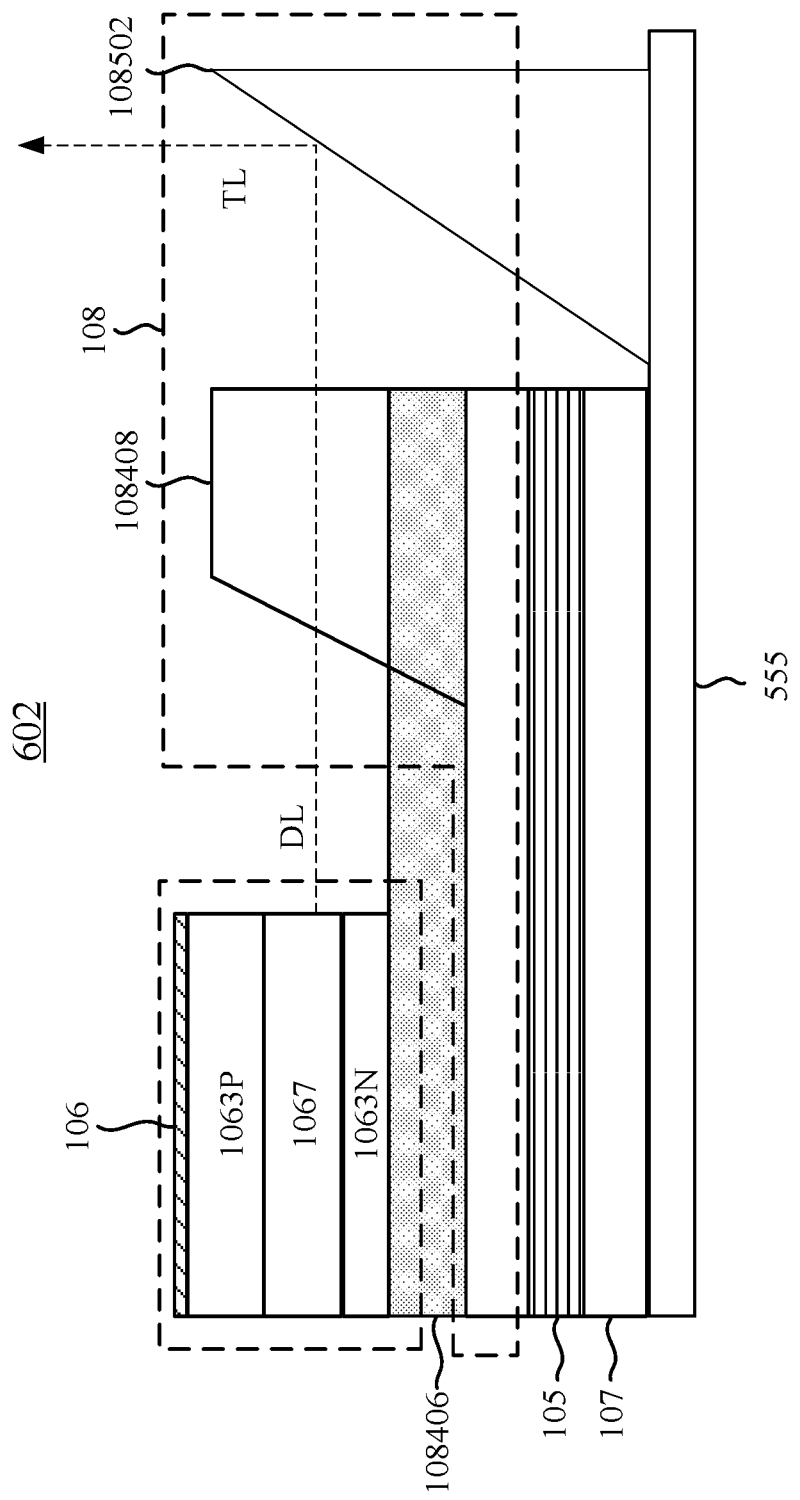
Figures 2, 6B:
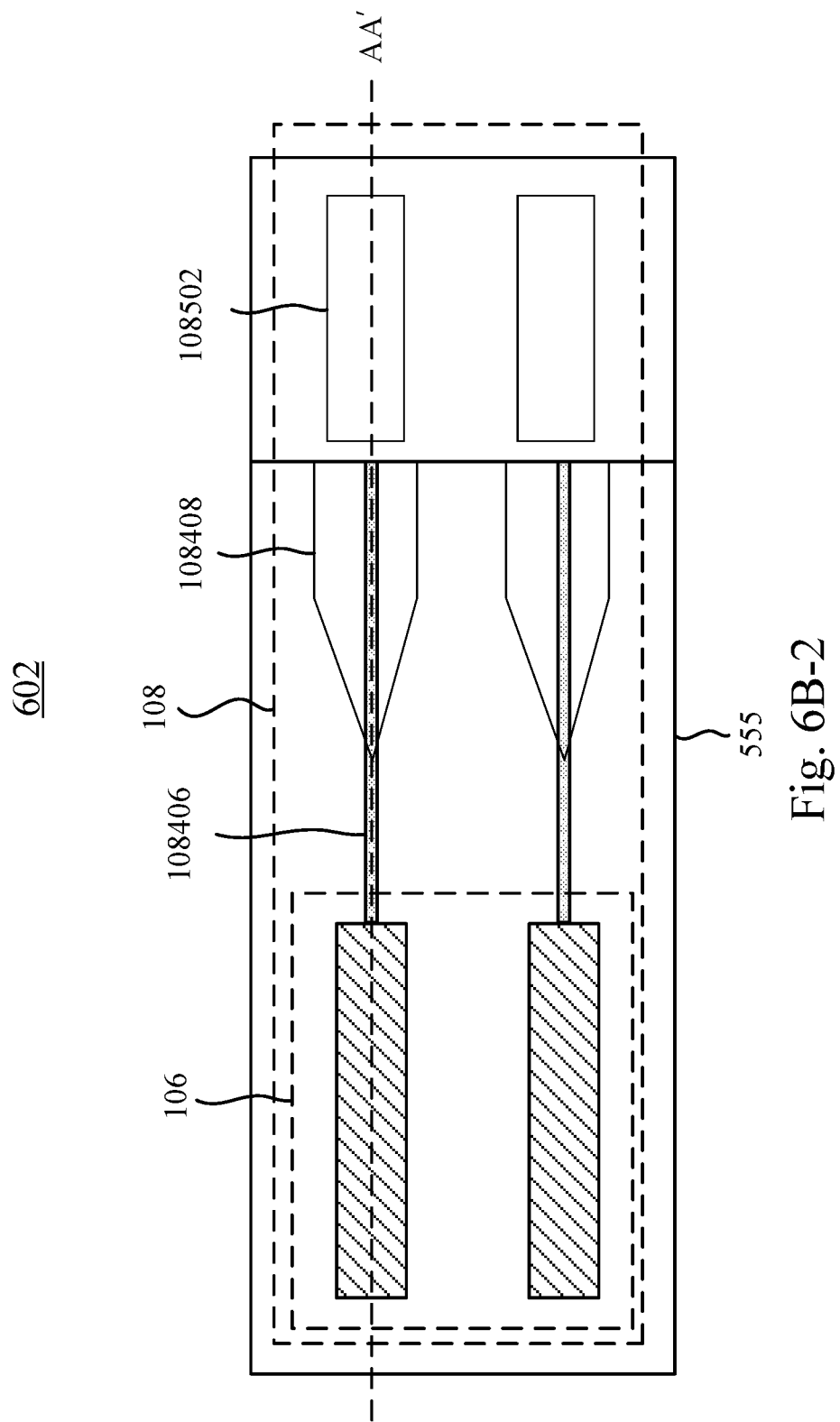

FIG. 6B-1 and FIG. 6B-2 illustrate the alternative embodiment of light emission apparatus 602, which combines on-chip optical element and off-chip optical element. Light emission apparatus 602 includes laser driver 105, laser diode 106, carrier 107, optical module 108 and sub-mount 555. Optical module 108 includes shaped optical element 108408 and shaped optical element 108502, wherein the shaped optical element 108408 is on-chip and shaped optical element 108502 is off-chip. In this embodiment, optical module 108 and laser diode 106 are formed separately. The spatial relationship for each element as shown in the figures, related descriptions are omitted herein.

Figures 2, 6C:
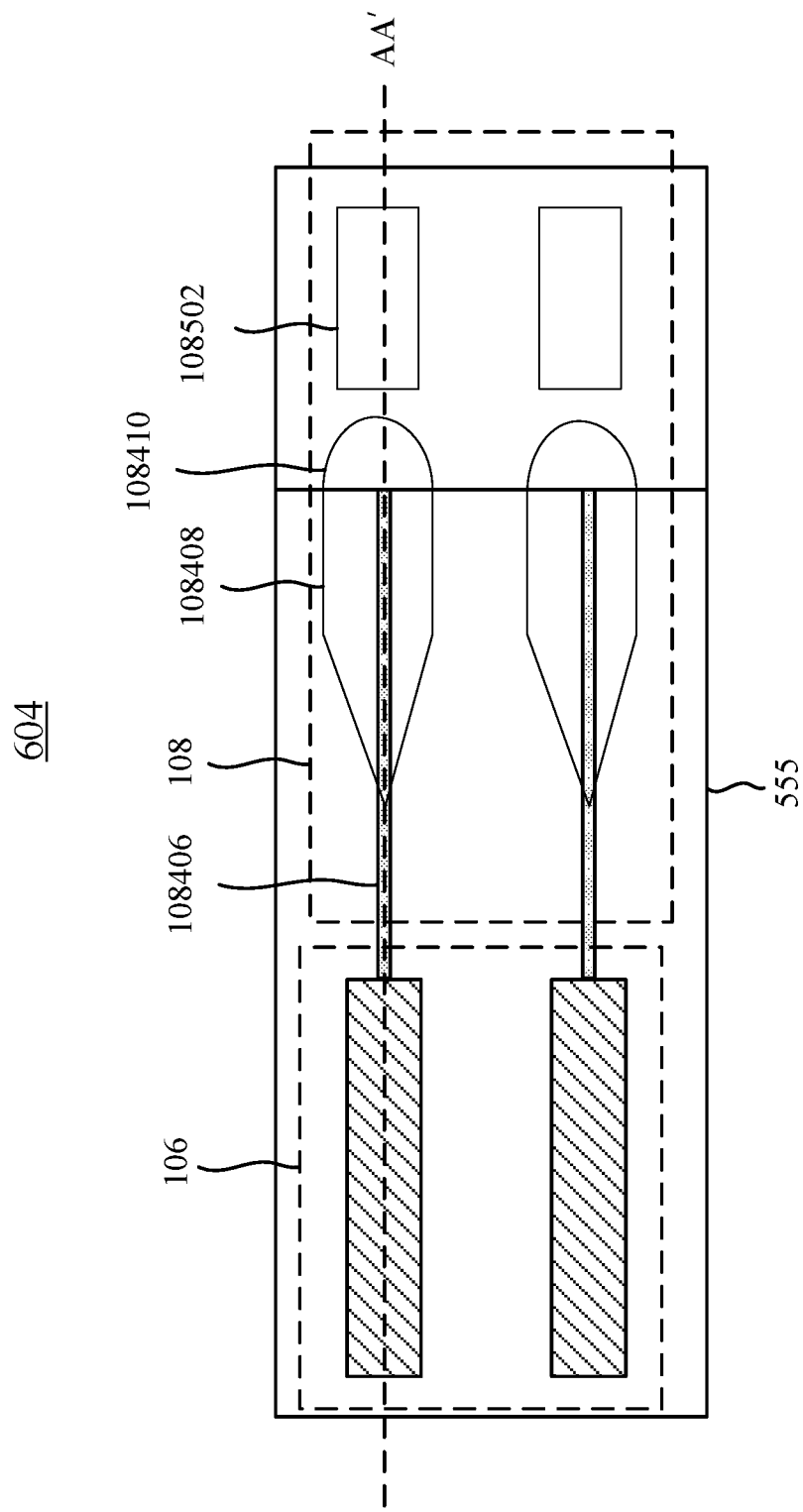

FIG. 6C-1 and FIG. 6C-2 illustrate the alternative embodiment of light emission apparatus 604, which combines on-chip optical element and off-chip optical element. Light emission apparatus 600 includes laser driver 105, laser diode 106, carrier 107, optical module 108 and sub-mount 555. Optical module 108 includes shaped optical element 108408 and shaped optical element 108502, wherein the shaped optical element 108408 is on-chip and shaped optical element 108502 is off-chip. In this embodiment, a portion of the optical module 108 and a portion of the cladding layer 1063N of the laser diode 106 are formed monolithically. Furthermore, this embodiment includes a micro-lens 108410 equipped on shaped optical element 108408. The spatial relationship for each element as shown in the figures, related descriptions are omitted herein.

Figures 1, 6D:
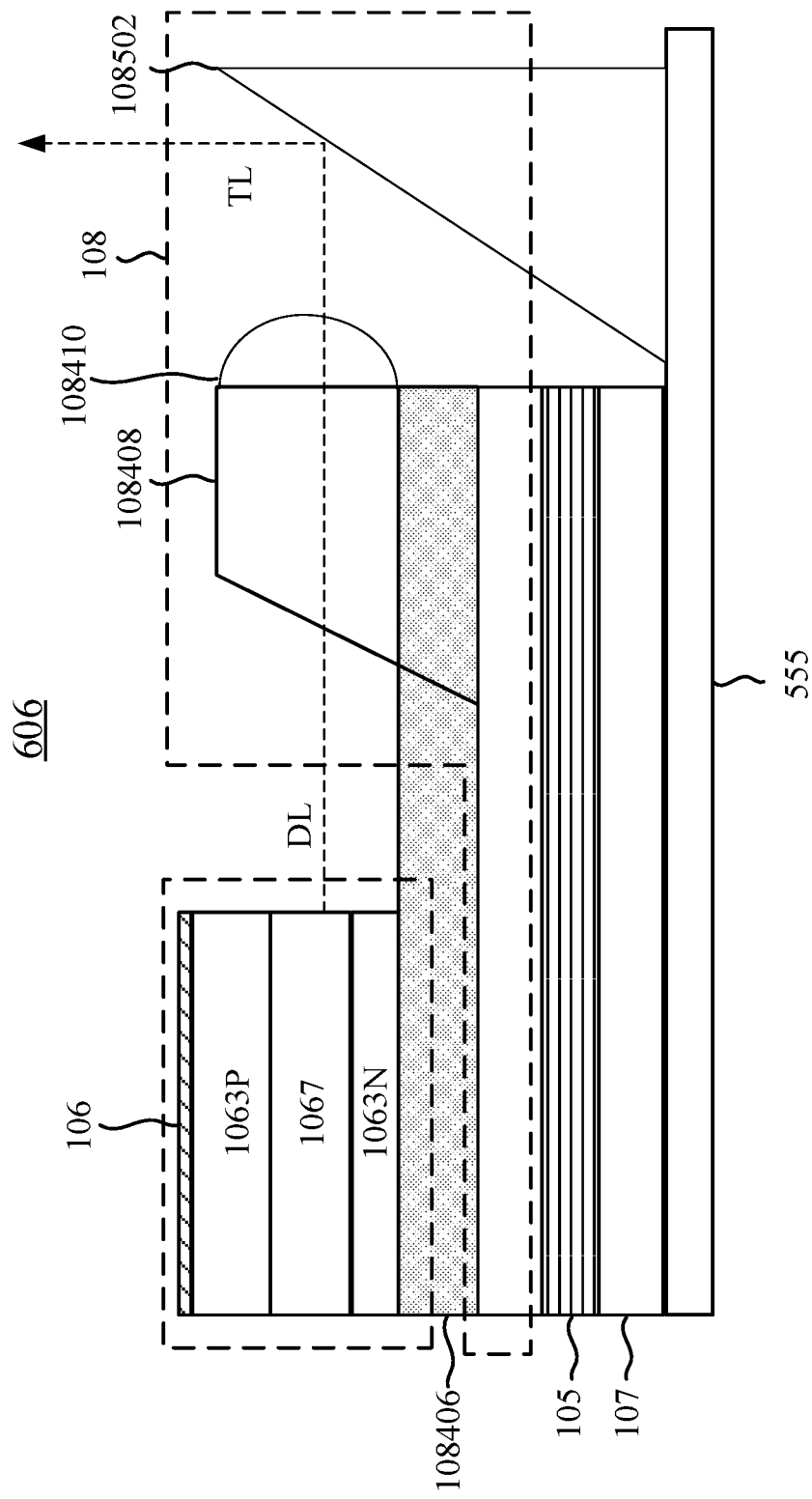
Figures 2, 6D:
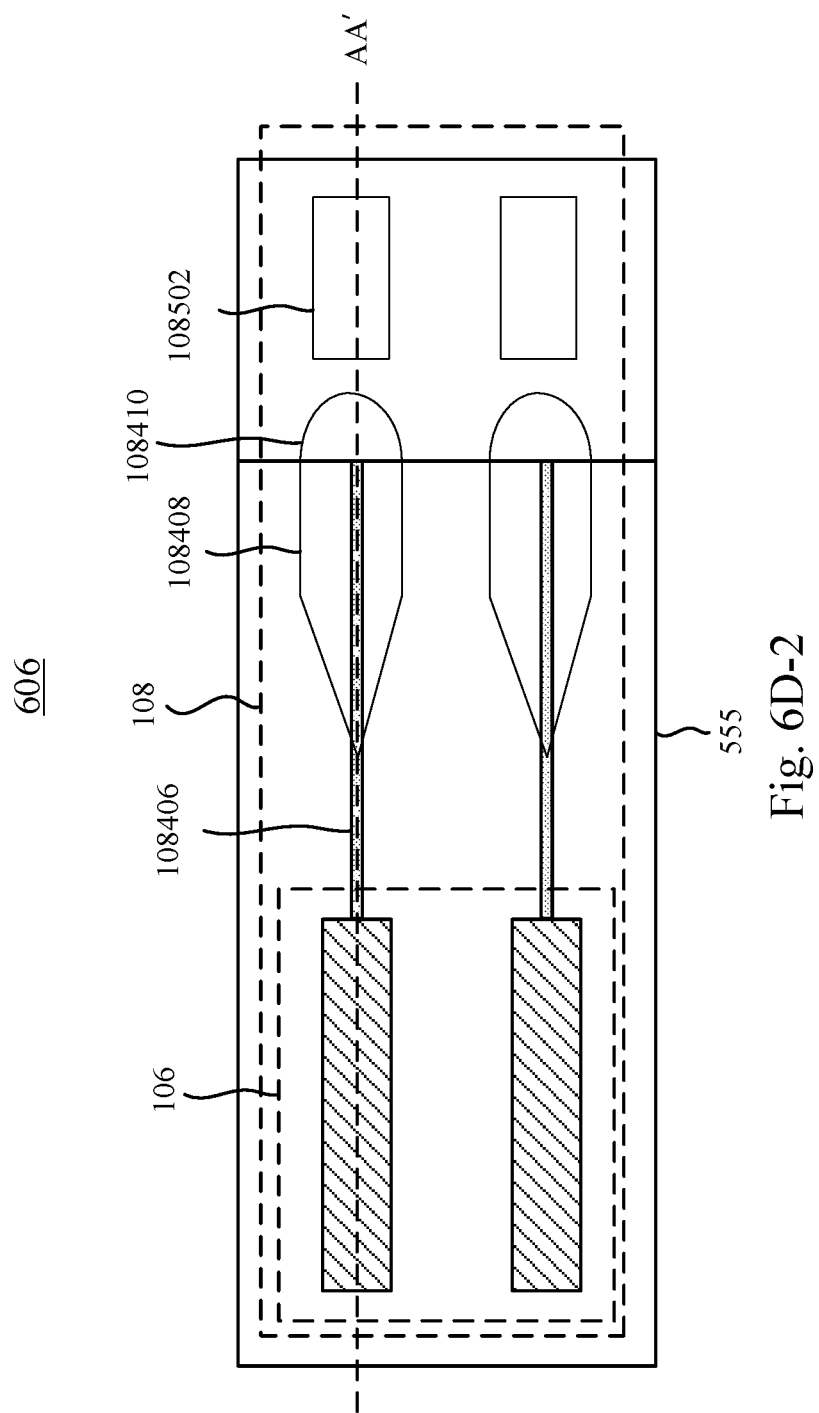

FIG. 6D-1 and FIG. 6D-2 illustrate the alternative embodiment of light emission apparatus 606, which combines on-chip optical element and off-chip optical element. Light emission apparatus 602 includes laser driver 105, laser diode 106, carrier 107, optical module 108 and sub-mount 555. Optical module 108 includes shaped optical element 108408 and shaped optical element 108502, wherein the shaped optical element 108408 is on-chip and shaped optical element 108502 is off-chip. In this embodiment, optical module 108 and laser diode 106 are formed separately. Furthermore, this embodiment includes a micro-lens 108410 equipped on shaped optical element 108408. The spatial relationship for each element as shown in the figures, related descriptions are omitted herein.

Figure 6E:
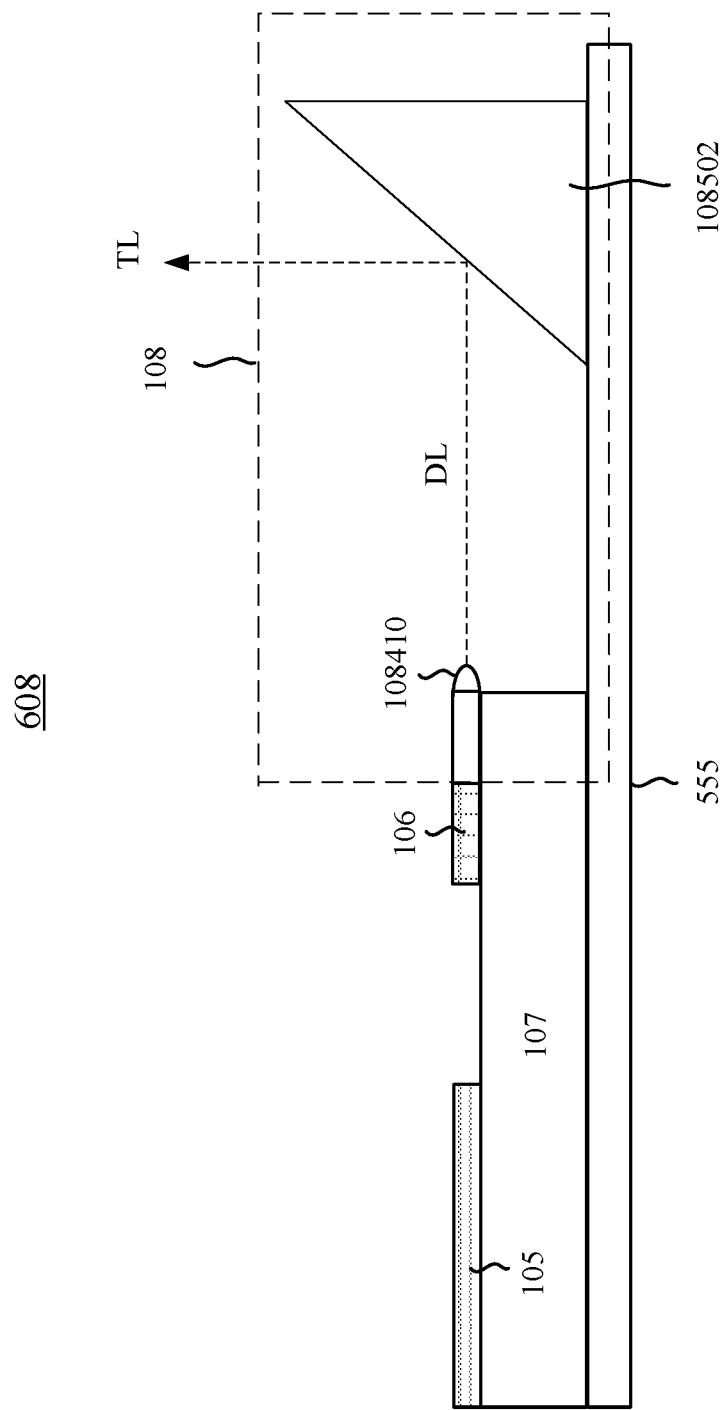

In the embodiments shown in FIG. 6A-1-FIG. 6D-2, laser diode 106 and a portion of optical module 108 are stacked on laser driver 105. In another embodiment, as shown in FIG. 6E, laser driver 105 can be separated from laser diode 106 and optical module 108. Micro-lens 108410 in the light emission apparatus 608 is an optional element, which can be equipped or removed according to the design requirement.

In some embodiments, the shaped optical elements 108500, 108502, 108504, and 108506 can be implemented by micro-electro-mechanical systems (MEMS) so that they may perform movements such as translation, tilt, rotation etc. by the application of external voltages. Consequently, light emission apparatuses illustrated from FIG. 5A to 5H and from FIG. 6A-1 to 6E can also be used for FSC depth map acquisition as shown in FIG. 1A and FIG. 1B.

Figures 2, 7A:
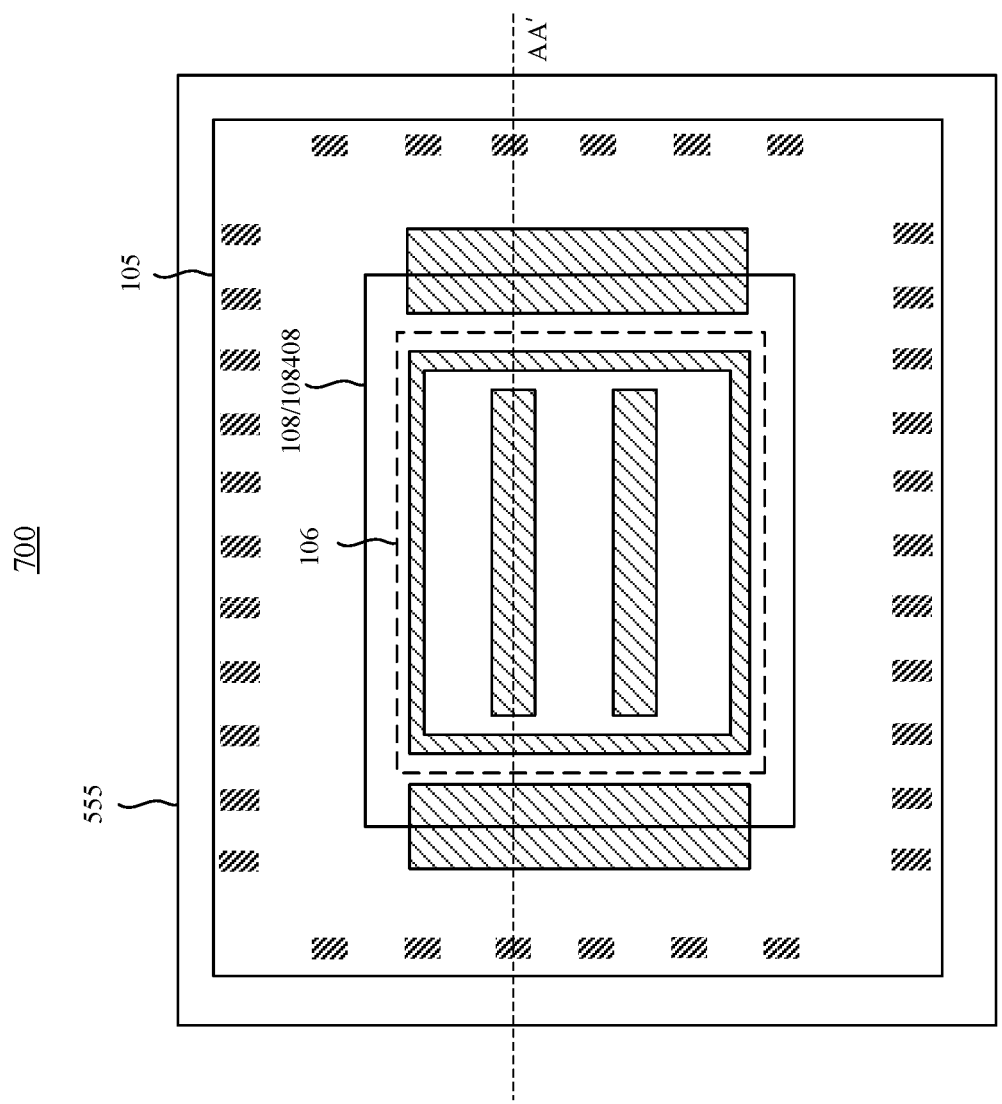

FIG. 7A-1 and FIG. 7A-2 illustrate the alternative embodiment of light emission apparatus 700, where FIG. 7A-1 is the cross-sectional view (Section AA') of the FIG. 7A-2. Light emission apparatus 700 includes laser driver 105, laser diode 106, optical module 108 and sub-mount 555. Optical module 108 includes a shaped optical element 108408, which is an encapsulated-type optical element, able to reflect the light DL generated from the active region 1067 of laser diode 106 with a predetermined angle and output the transmitting light TL. Specifically, the shaped optical element 108408 in this embodiment has a roughen surface and entirely covers the laser diode 106.

Figures 1, 7B:
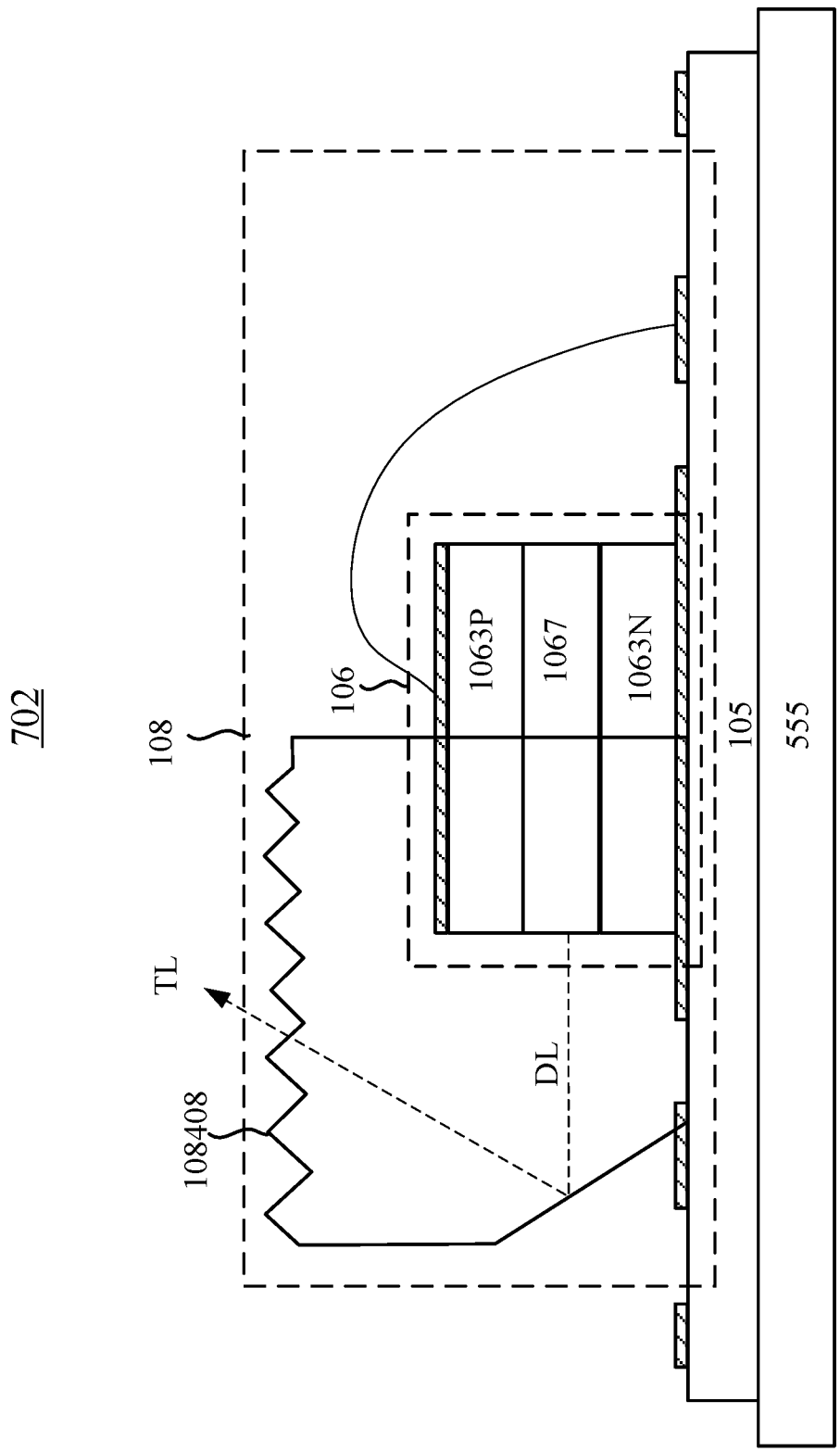
Figures 2, 7B:
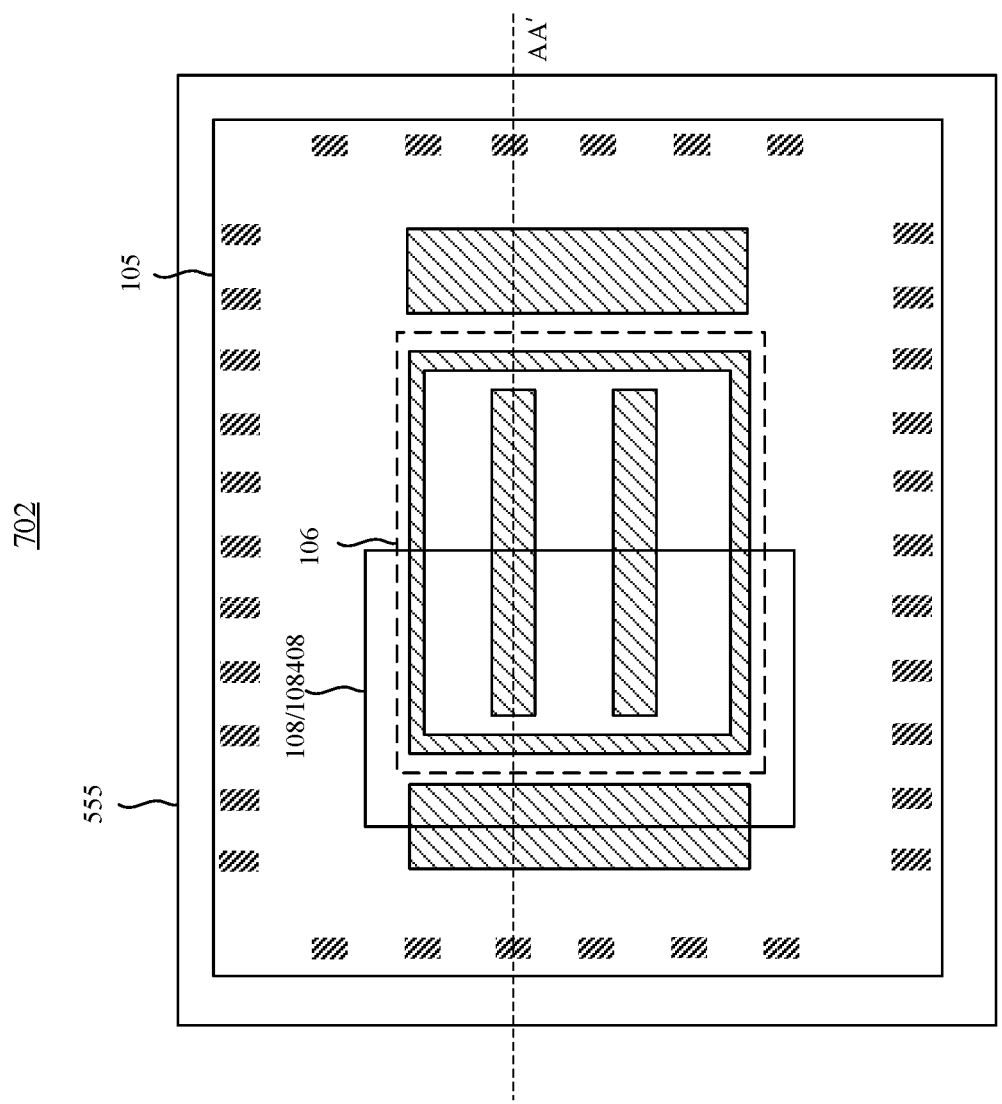

FIG. 7B-1 and FIG. 7B-2 illustrate the alternative embodiment of light emission apparatus 702, where FIG. 7B-1 is the cross-sectional view (Section AA') of the FIG. 7B-2. Light emission apparatus 702 includes laser driver 105, laser diode 106, optical module 108 and sub-mount 555. Optical module 108 includes a shaped optical element 108408, which is able to reflect the light DL generated from the active region 1067 of laser diode 106 with a predetermined angle and output the transmitting light TL. Specifically, the shaped optical element 108408 in this embodiment has a roughen surface and partially covers the laser diode 106.

Figure 8A:
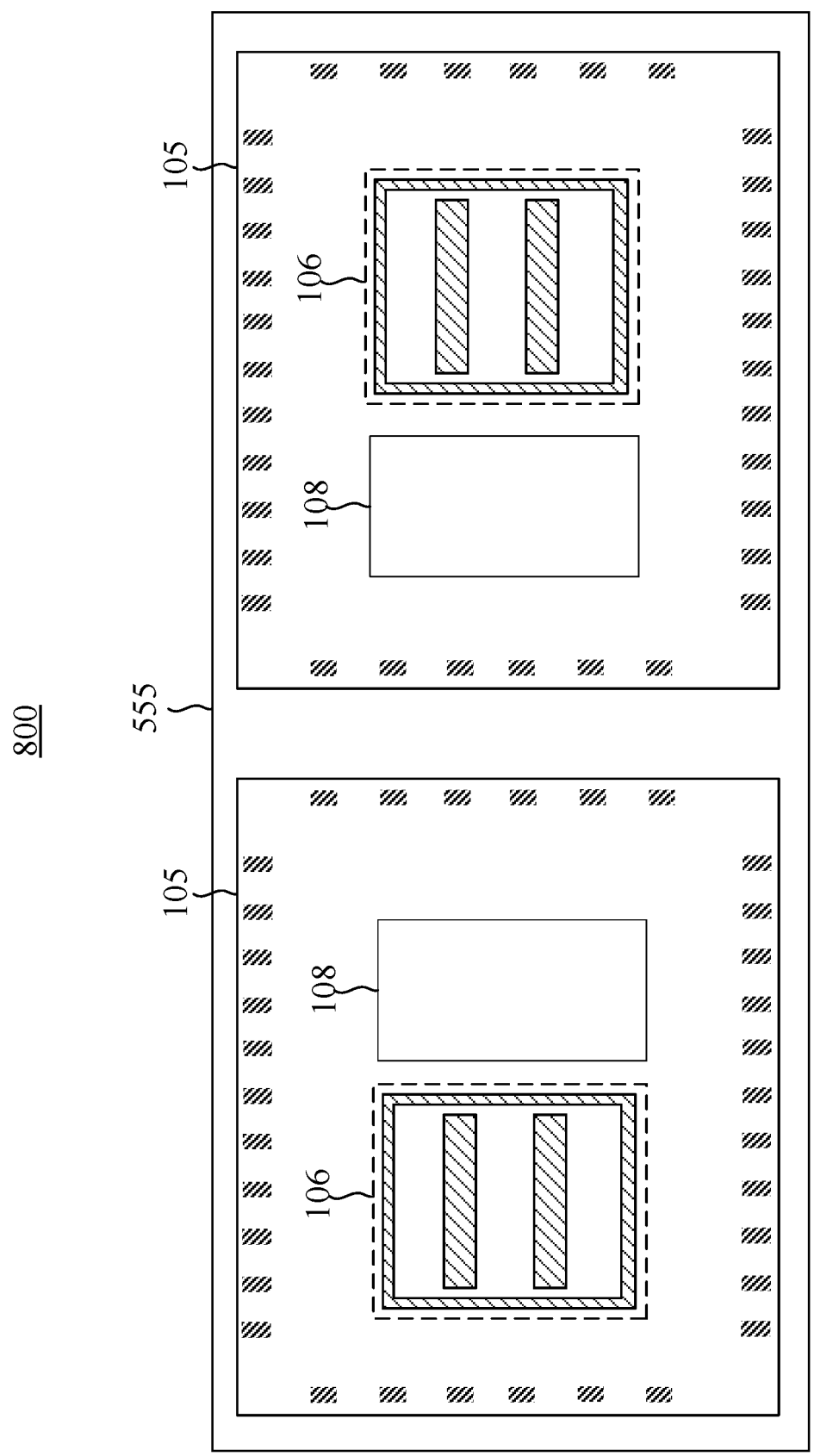

FIG. 8A illustrates the alternative embodiment of light emission apparatus 800. Light emission apparatus 800 includes two laser drivers 105, two laser diodes 106, two optical elements 108 and one sub-mount 555. Laser diodes 106 and optical elements 108 are stacked on laser drivers 105, which are symmetrical and all stacked on sub-mount 555.

Figure 8B:
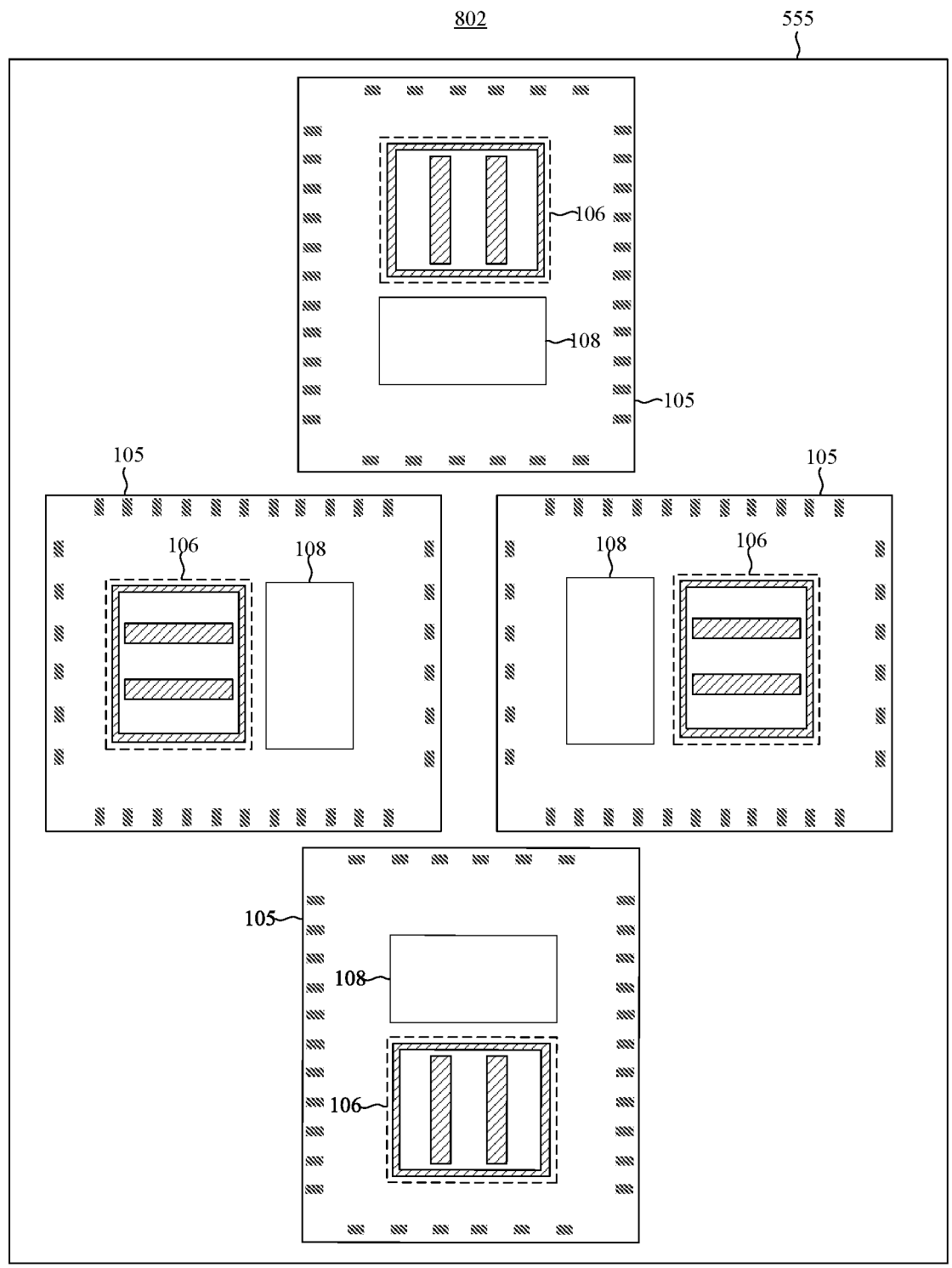

Similarly, FIG. 8B illustrates the alternative embodiment of light emission apparatus 802. Light emission apparatus 802 includes four laser drivers 105, four laser diodes 106, four optical elements 108 and one sub-mount 555. Laser diodes 106 and optical elements 108 are stacked on laser drivers 105, which are symmetrical and all stacked on sub-mount 555.

Figure 8C:
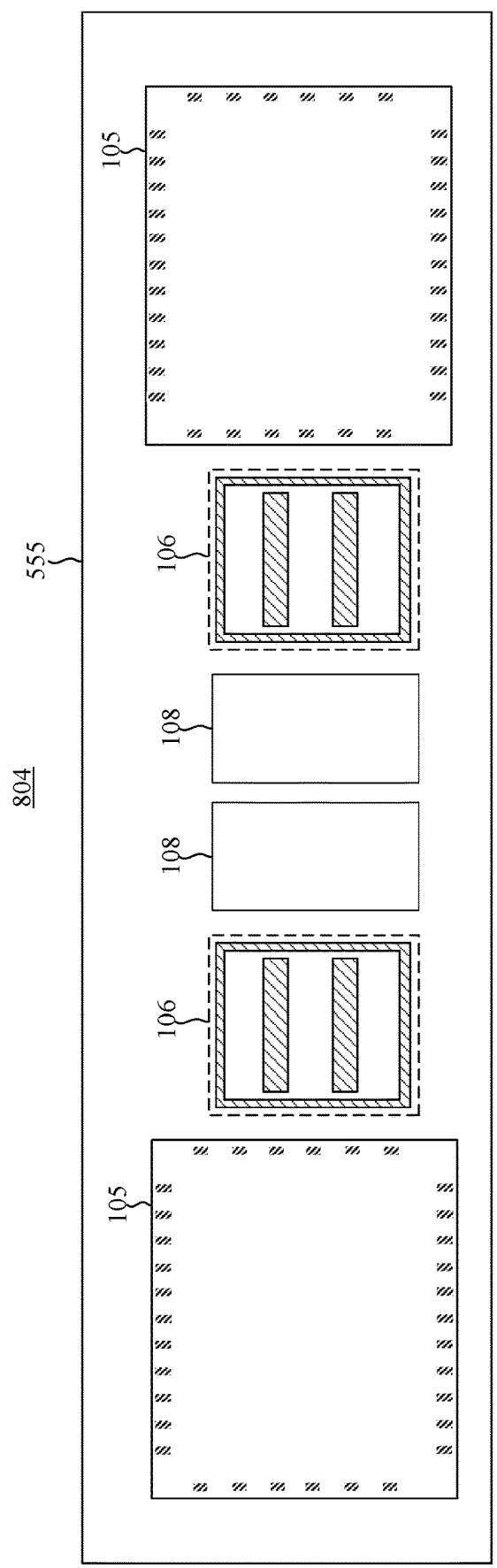

FIG. 8C illustrates the alternative embodiment of light emission apparatus 804. Light emission apparatus 804 includes two laser drivers 105, two laser diodes 106, two optical elements 108 and one sub-mount 555. Laser diodes 106, optical elements 108 and laser drivers 105 are not arranged in a vertical direction. From a top view of the light emission apparatus 804, the optical elements 108 are between the laser diodes 106.

Figure 8D:
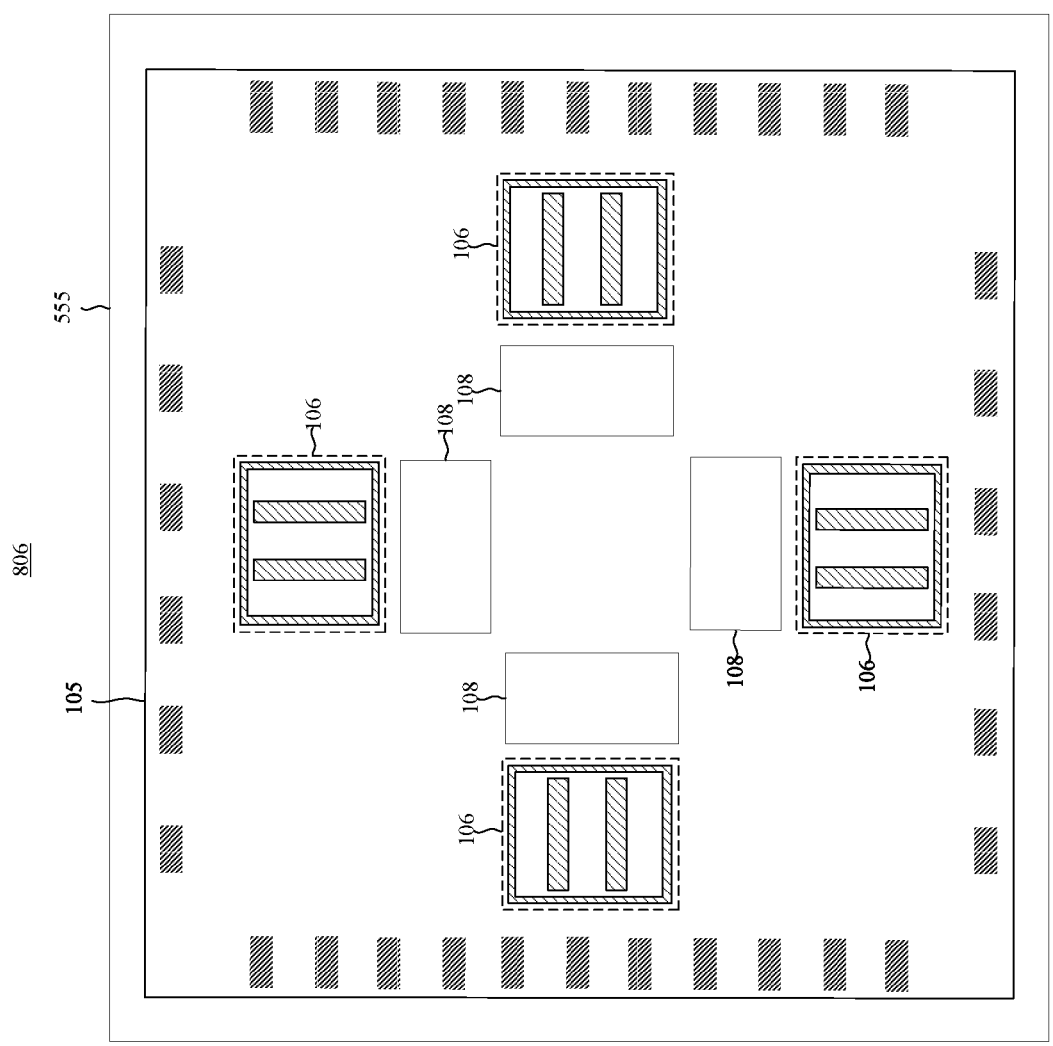

FIG. 8D illustrates the alternative embodiment of light emission apparatus 806. Light emission apparatus 806 includes one laser driver 105, four laser diodes 106, four optical elements 108 and one sub-mount 555. Laser diodes 106 and optical elements 108 are stacked on laser driver 105, where the laser driver 105 is stacked on the sub-mount 555.

FIG. 8E illustrates the alternative embodiment of light emission apparatus 808. Light emission apparatus 808 includes one laser driver 105, four laser diodes 106, four optical elements 108 and one sub-mount 555. Laser diodes 106, optical elements 108 and laser driver 105 are not arranged in a vertical direction, but all of them are stacked on the sub-mount 555. The laser driver is surrounded by the laser diodes 106.

For edge-emitting-based laser diode application, in addition to using optical element to change the light direction to output the transmitting light, mechanical design and arrangement for sub-mount is also an alternative to be used in the light emission apparatus.

Figures 1, 9A:
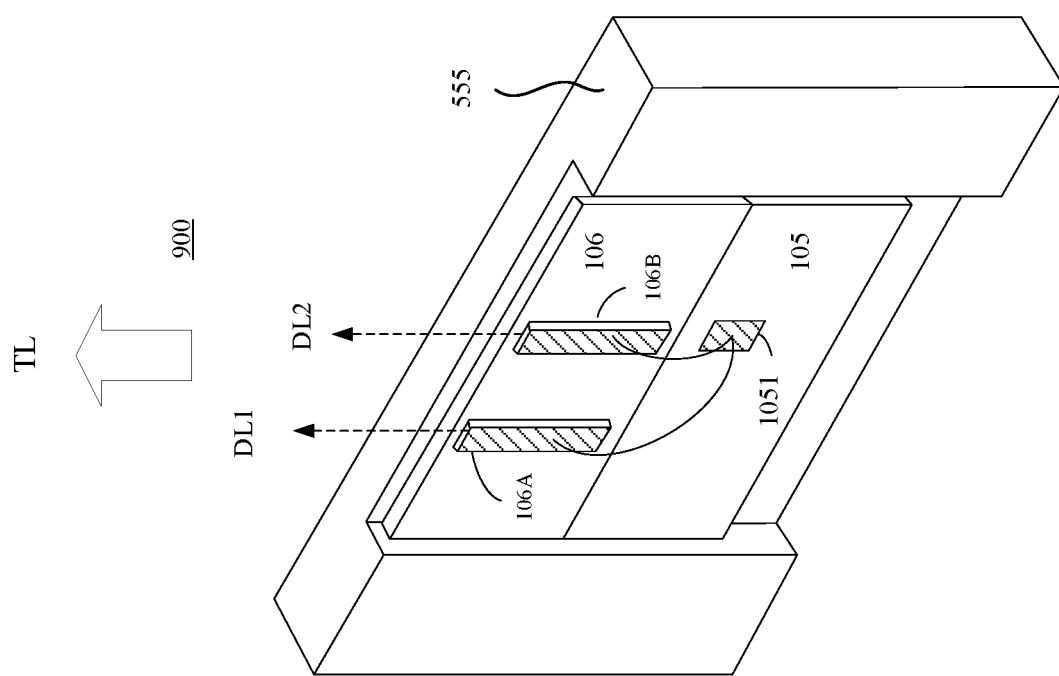
Figures 2, 9A:
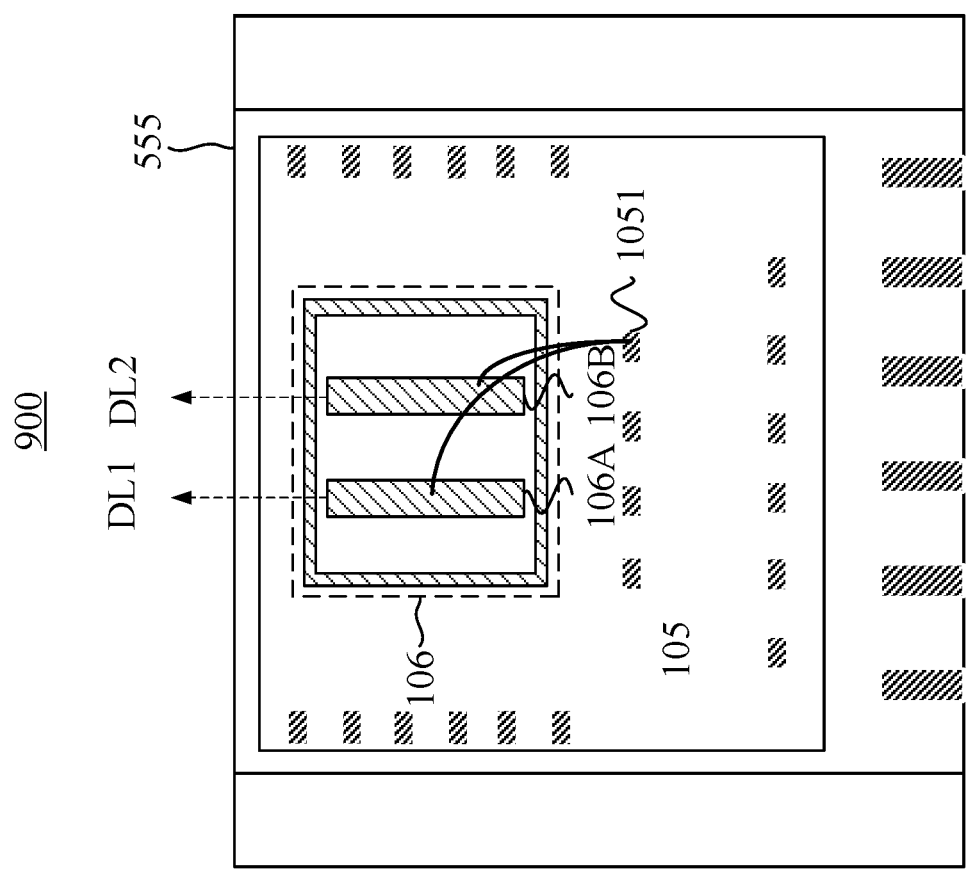

FIG. 9A-1 illustrates the 3-dimensional (3D) view of the optical assembly 900, including laser driver 105, laser diode 106 and sub-mount 555. FIG. 9A-2 is the top view of FIG. 9A-1. Similar to above-mentioned embodiments, this embodiment includes laser bar 106A and laser bar 106B to emit the light DL1 and DL2, and collectively output the transmitting light TL. Laser bar 106A and laser bar 106B forms an array and being droved by the driving signal generated by the laser driver 105 through the pad 1051. The sub-mount 555 provides a platform to mount the laser driver 105 and laser diode 106 and being standing, so that the transmitting light TL can propagate along in vertical direction. In this embodiment, the directions of the light DL1 and DL2 and the direction of the transmitting light TL are the same. In this embodiment, the optical assembly 900 is devoid of an optical element for changing directions of the light DL1 and DL2. In some embodiments, the laser diode 106 can be flipped, the laser bar 106A and laser bar 106B are directly contact with laser driver 105.

Figure 9B:
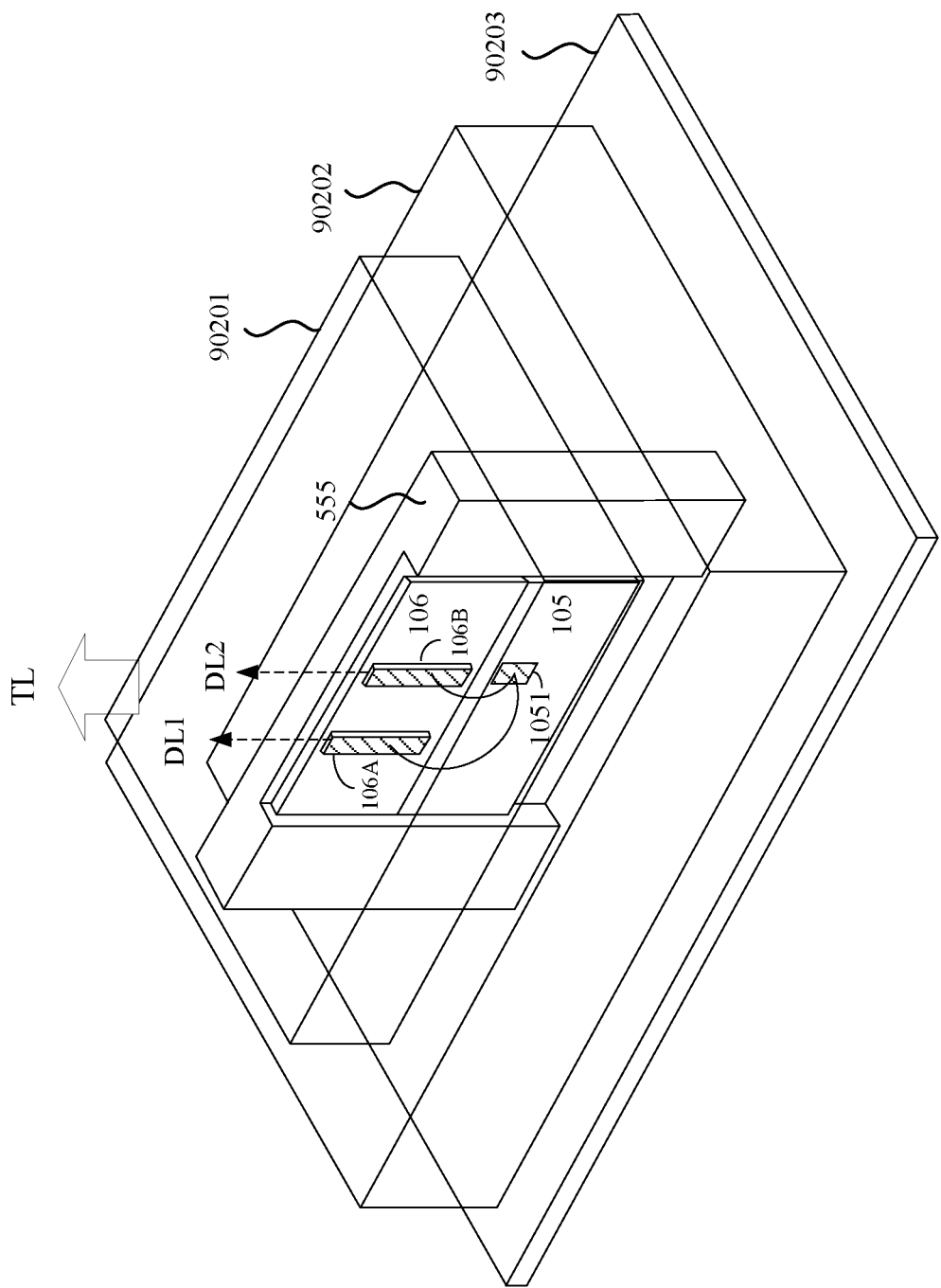

FIG. 9B illustrates the 3-dimensional (3D) view of the light emission apparatus 902. Compared to embodiment of FIG. 9A, this embodiment further includes an optical element 90201, a holder 90202, and a sub-mount 90203. In one embodiment, the optical element is a diffuser. Optical element 90201 is arranged above laser driver 105, laser diode 106 and sub-mount 555, and configured to diffuse or scatter transmitting light TL. Holder 90202 is arranged between the optical element 90201 and sub-mount 90203 to hold the optical element 90201 at a desired position. Sub-mount 90203, in this embodiment, is arranged substantially perpendicular to the sub-mount 555. The sub-mount 90203 is configured to stably support sub-mount 555 so that the transmitting light TL can be emitted in vertical direction.

Figure 9C:
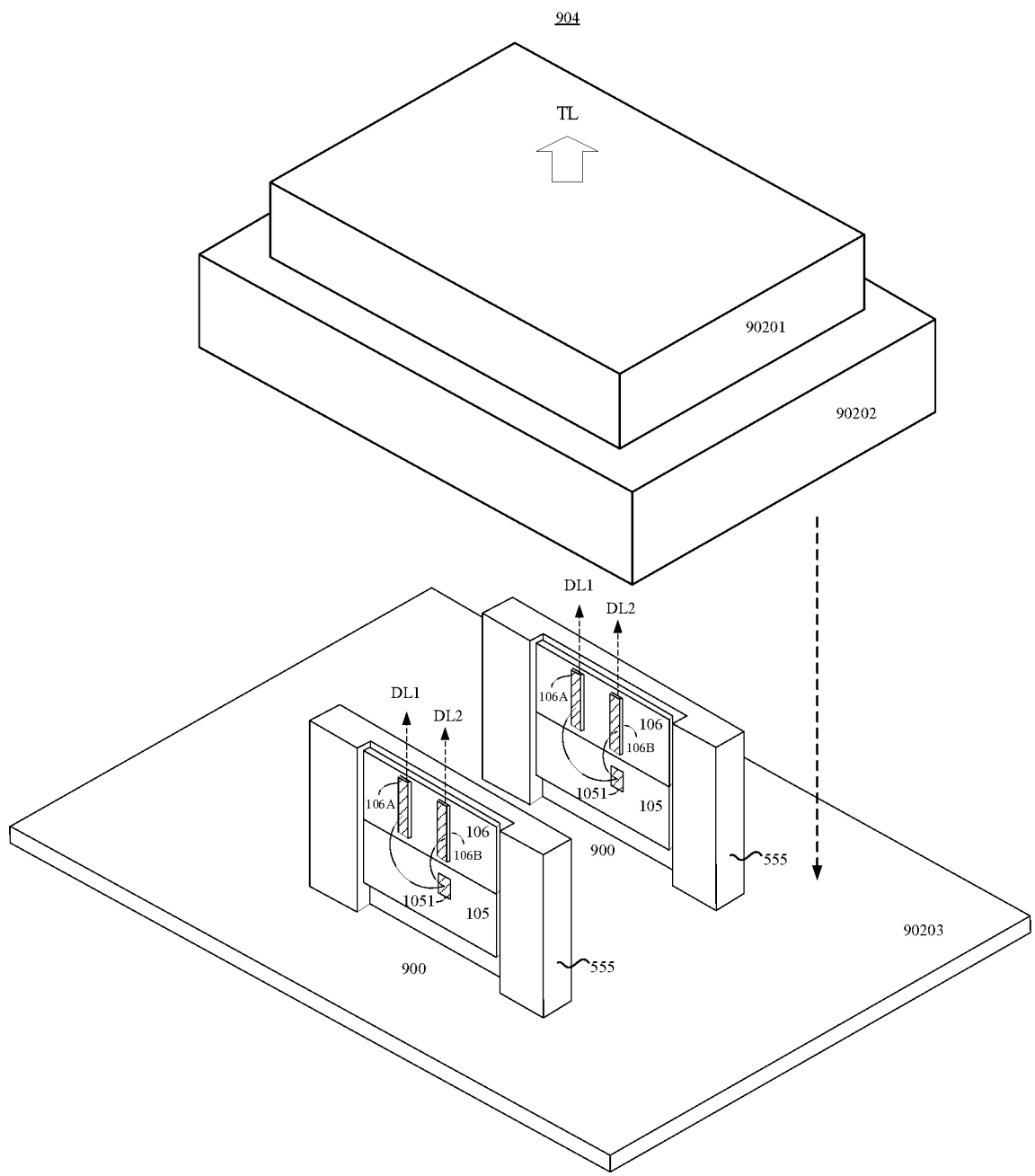

FIG. 9C illustrates the 3-dimensional (3D) view of the light emission apparatus 904. Compared to embodiment of FIG. 9B, this embodiment uses two optical assemblies 900 and both of them stand on sub-mount 90203. In some embodiments, diffuser 90201 and holder 90202 can be added to cover the two optical assemblies 900. This embodiment only shows two optical assemblies 900, however, more optical assemblies 900 can be used to generate the transmitting light TL.

Figure 9D:
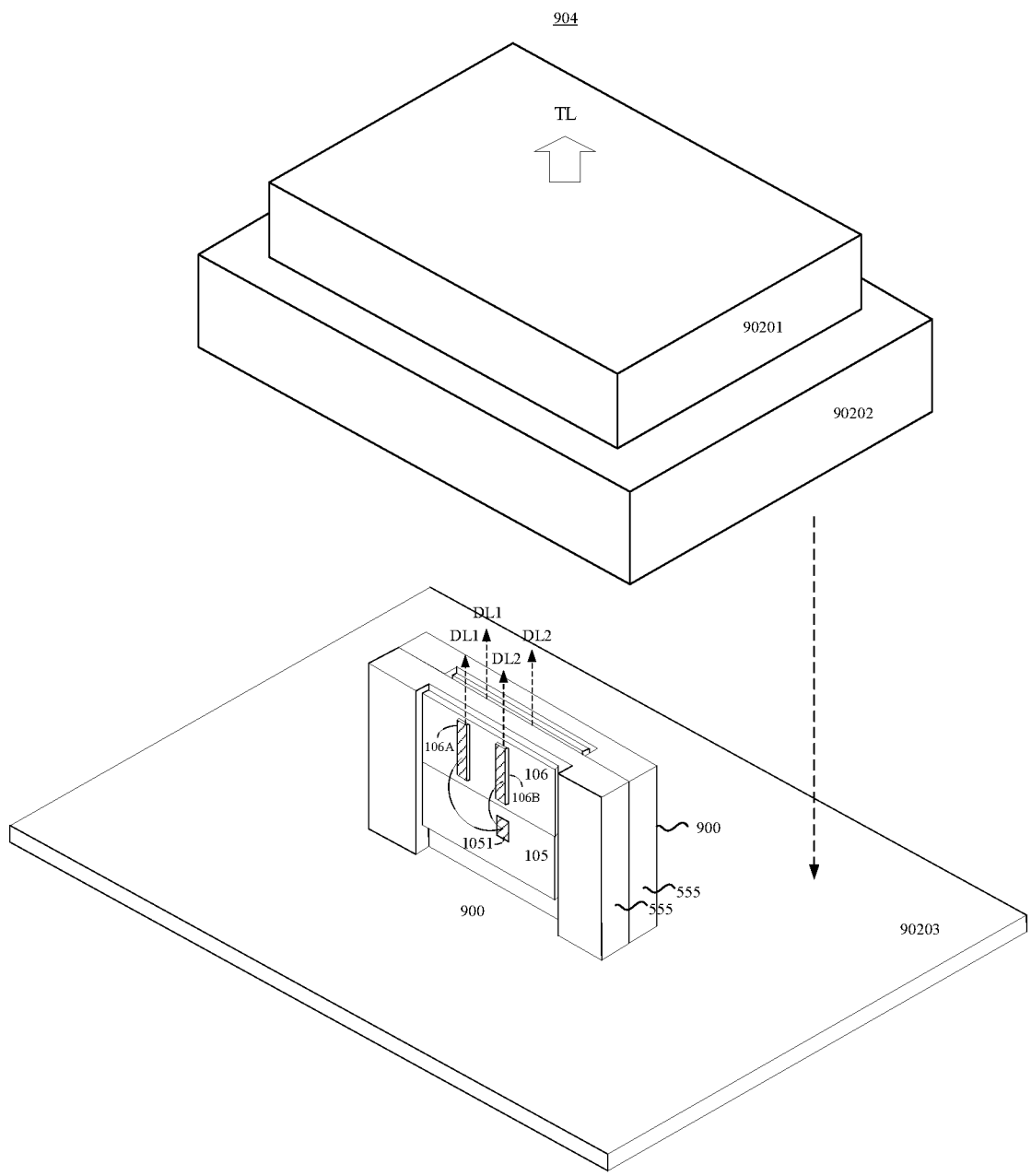

FIG. 9D illustrates the 3-dimensional (3D) view of the light emission apparatus 906. Similar to the embodiment of FIG. 9C, light emission apparatus 906 uses a plurality of optical assemblies 900. The difference is that, in this embodiment, each optical assembly 900 is directly contact to each other. This embodiment only shows two optical assemblies 900, however, more optical assemblies 900 can be used to generate the transmitting light TL.

FIG. 9E illustrates an embodiment of light emission apparatus 908, including four light optical assemblies 900 vertically standing on the sub-mount 90203. This embodiment only shows four optical assemblies 900, however, more optical assemblies 900 can be used to generate the transmitting light TL.

FIG. 9F illustrates an embodiment of optical assembly 910, including laser diode 106 and sub-mount 555. Compared to FIG. 9A-1 and FIG. 9A-2, the driver 105 is not mounted on sub-mount 555. Besides, the driving signal is coming from a metal plate 91002 mounted on the sub-mount 555.

Figures 1, 9G:
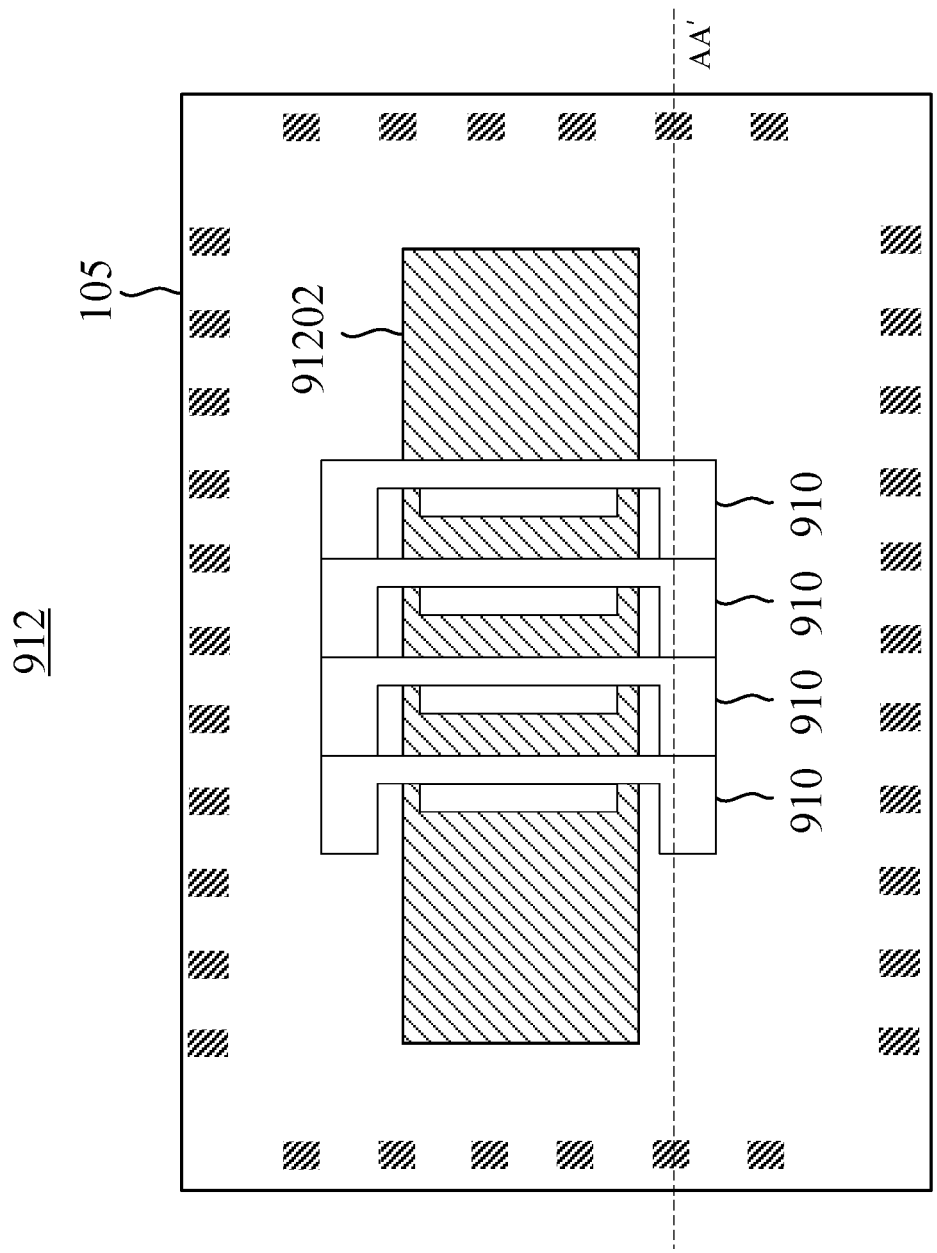
Figures 2, 9G:
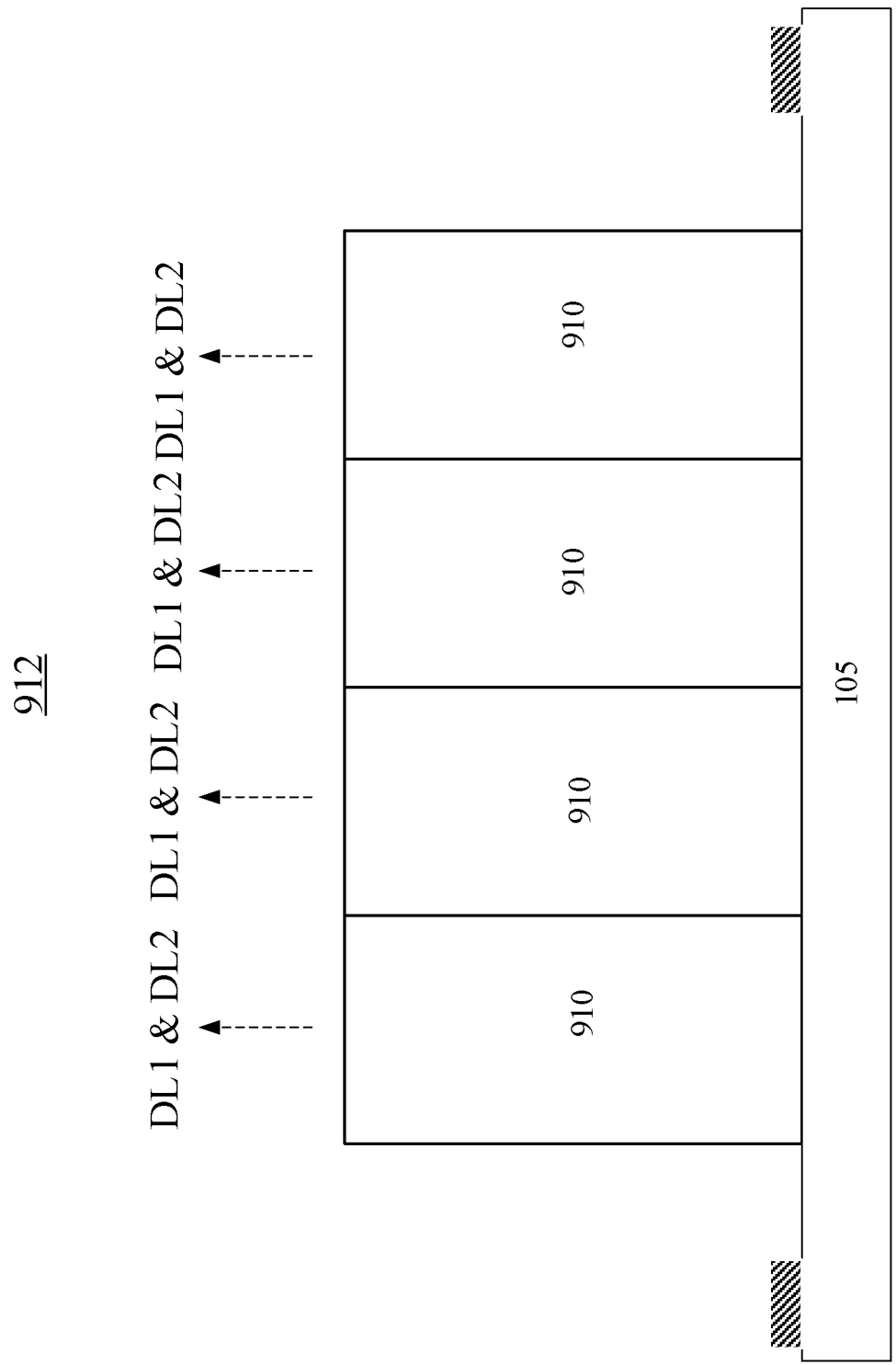

FIG. 9G-1 and FIG. 9G-2 illustrates an embodiment of light emission apparatus 912, including four light optical assemblies 910 vertically standing on the laser driver 105. FIG. 9G-2 is the cross-sectional view (Section AA') of the FIG. 9G-1. Since each optical assembly 910 has the metal plate 91202 mounted on the bottom of the sub-mount 555, the metal plate 91202 can directly contact and electrically coupled with the metal plate 91002, where the driving signal generated by the laser driver 105 is outputted from the metal plate 91002.

Figures 1, 9H:
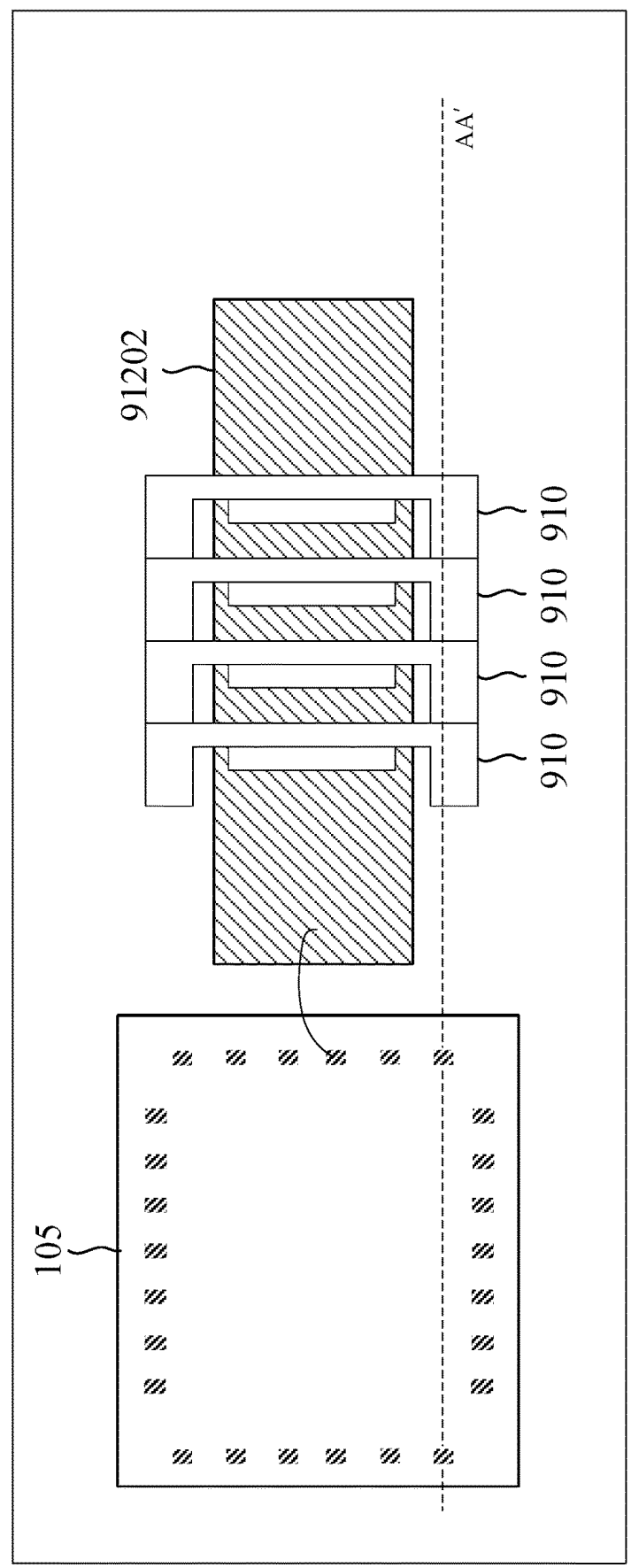
Figures 2, 9H:
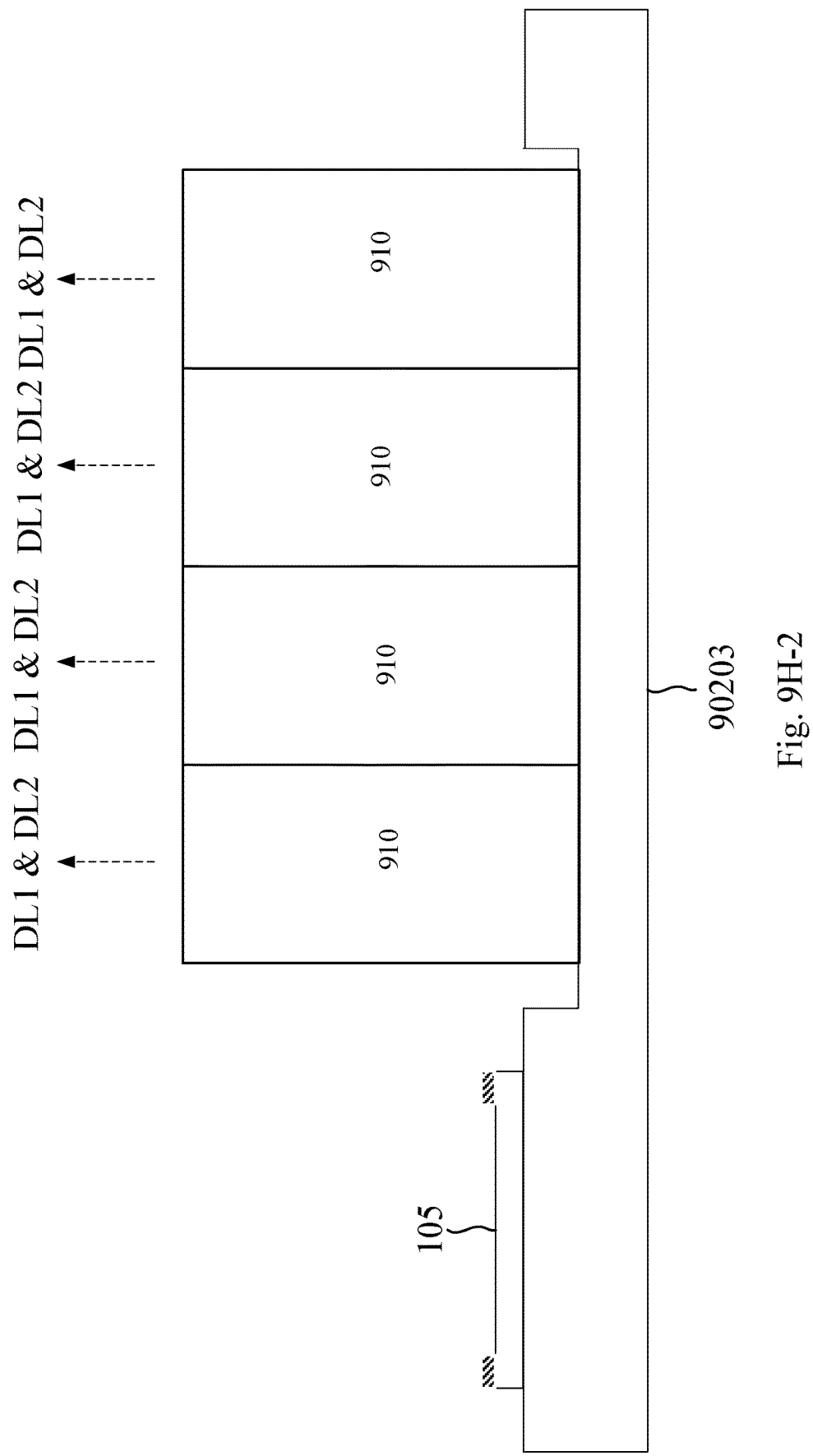

FIG. 9H-1 and FIG. 9H-2 illustrates an embodiment of light emission apparatus 914, including four light optical assemblies 910 vertically standing on the sub-mount 90203. FIG. 9H-2 is the cross-sectional view (Section AA') of the FIG. 9H-1. Since each optical assembly 910 has the metal plate 91202 mounted on the bottom of the sub-mount 90203, the metal plate 91202 can directly contact and electrically coupled with the metal plate 91202, where the driving signal generated by the laser driver 105 is outputted from the metal plate 91202. In this embodiment, laser driver 105 is not arranged underneath the assembly 910, but being arranged aside and supported by the sub-mount 90203.

In addition to using the edge-emitting laser as the component of light emission apparatus, vertical emitting laser is also an alternative implementation. The embodiments shown below applies vertical emitting laser to configure the light emission apparatus and also equips the wavelength conversion or eye-safety mechanisms.

Figures 1, 10A:
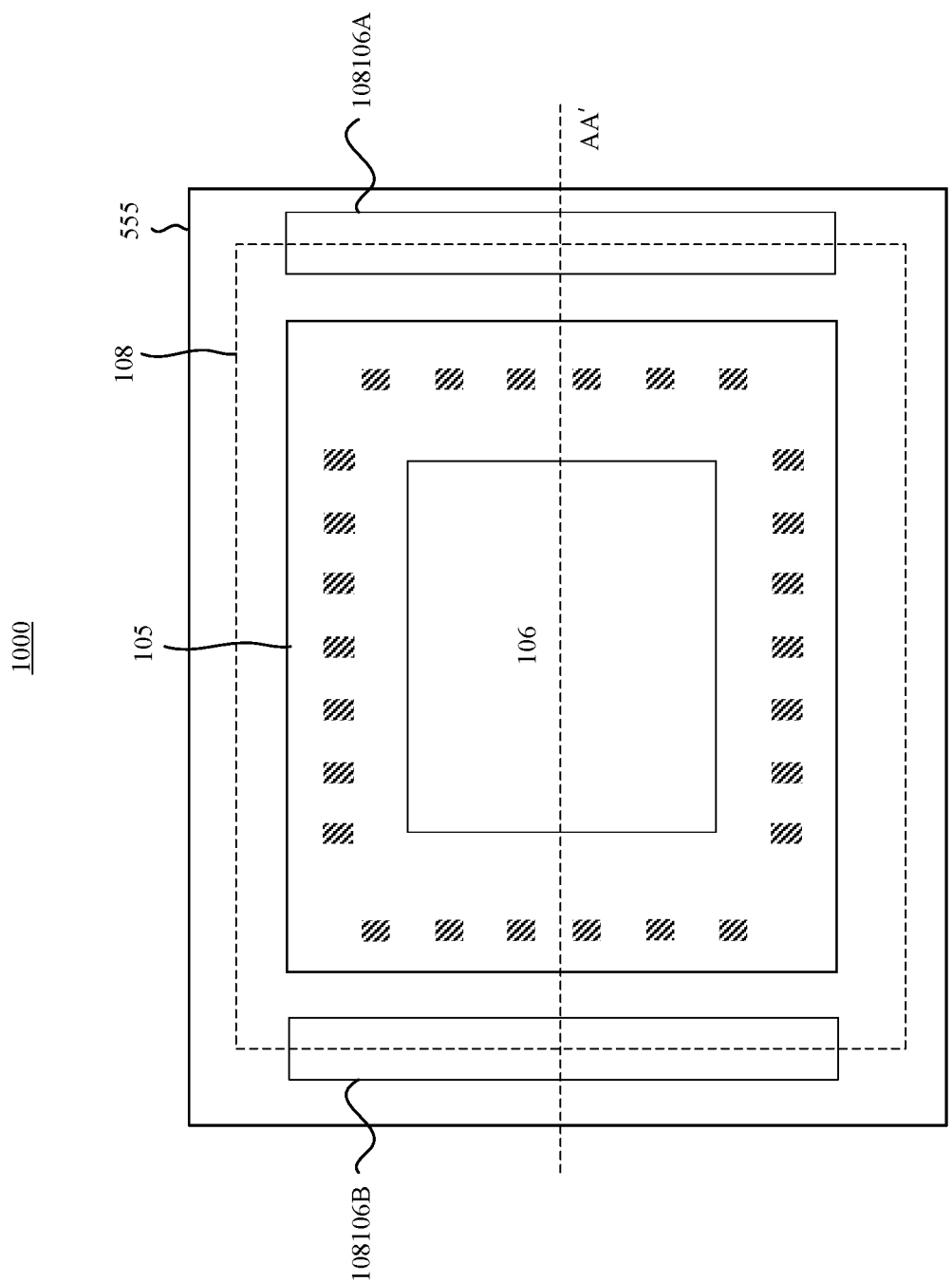
Figures 2, 10A:
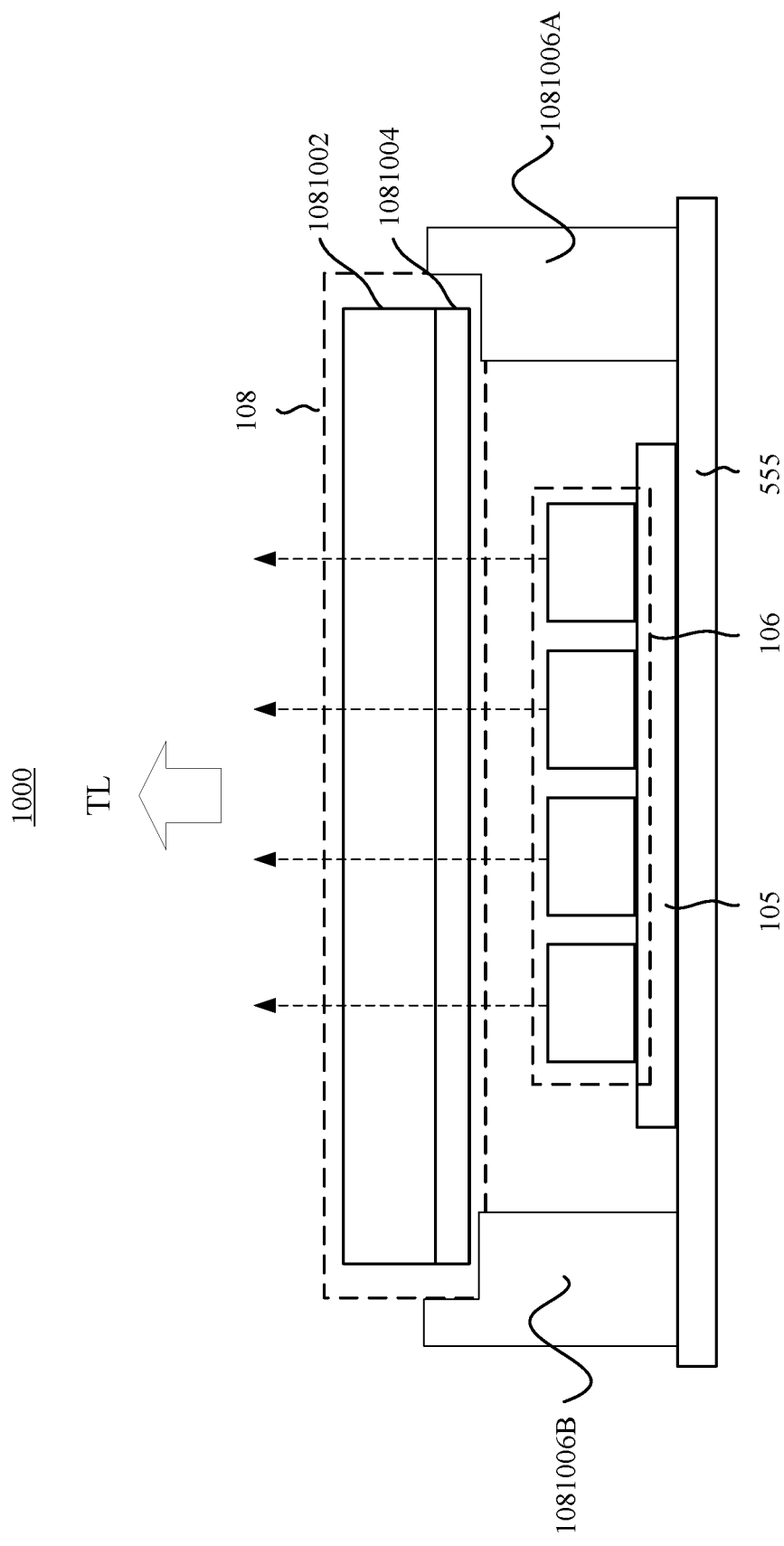

FIG. 10A-1 and FIG. 10A-2 illustrate an embodiment of light emission apparatus 1000, including laser driver 105, laser diode 106, optical module 108 and sub-mount 555. FIG. 10A-2 is the cross-sectional view (Section AA') of the FIG. 10A-1. Specifically, in this embodiment, the laser diode 106 includes a plurality of Vertical-Cavity Surface-Emitting Lasers (VESELs), which is a kind of vertical emitting laser. In another implementation, laser diode 106 can implement with a single VESEL. Optical module 108, in this embodiment, includes optical cover glass 1081002 and quantum dot coating 1081004. Having the quantum dot coating 1081004 between the surface of the optical cover glass 1081002 and the laser diode 106, the peak wavelength of the light emitted from the VSESLs can be converted from a shorter peak wavelength to a longer peak wavelength, which is better for eye protection. Sidewall assemblies 1081006A and 1081006B are configured to support the optical module 108. In this embodiment, laser diode 106 is stacked on laser driver 105.

Figures 1, 10B:
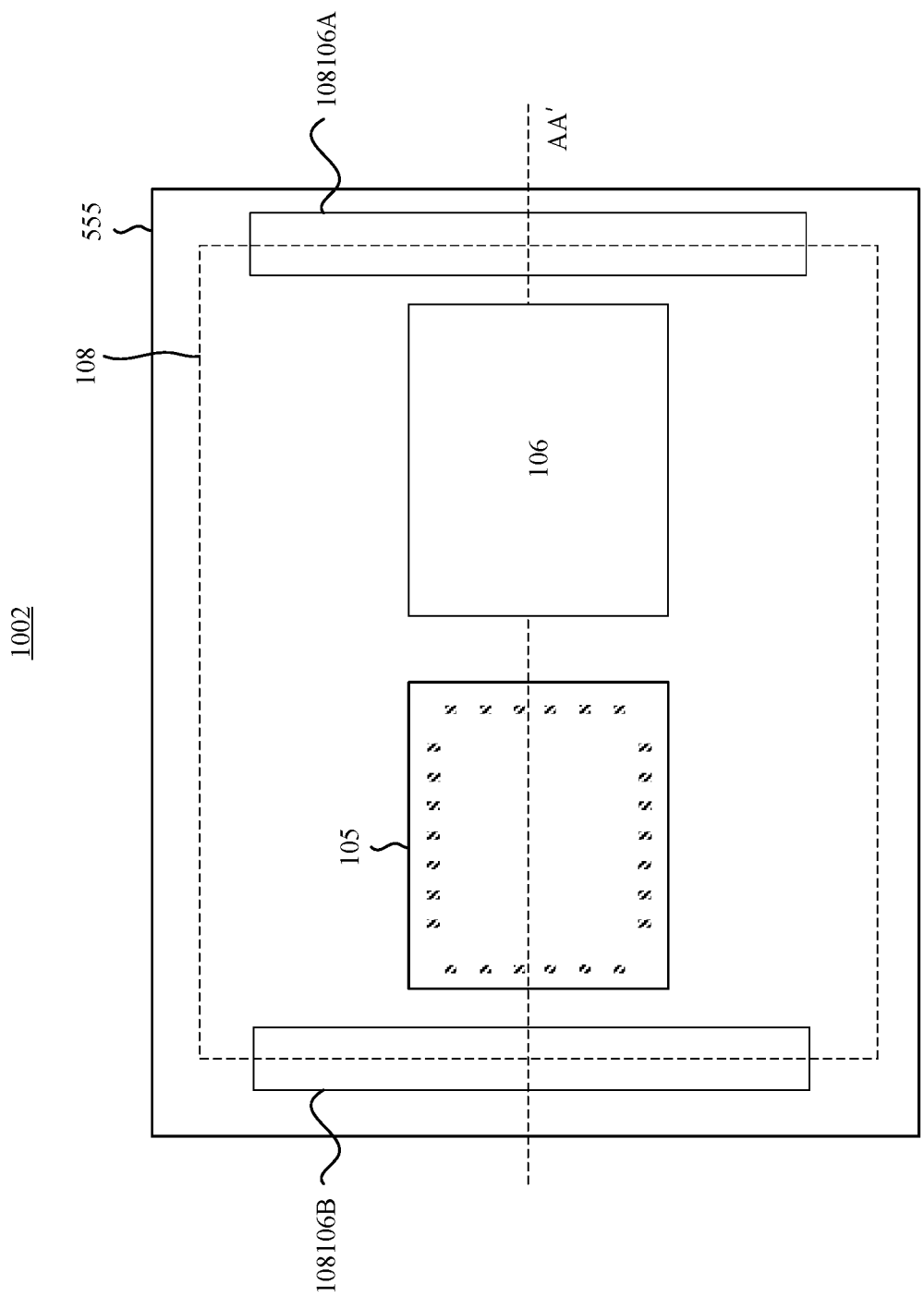
Figures 2, 10B:
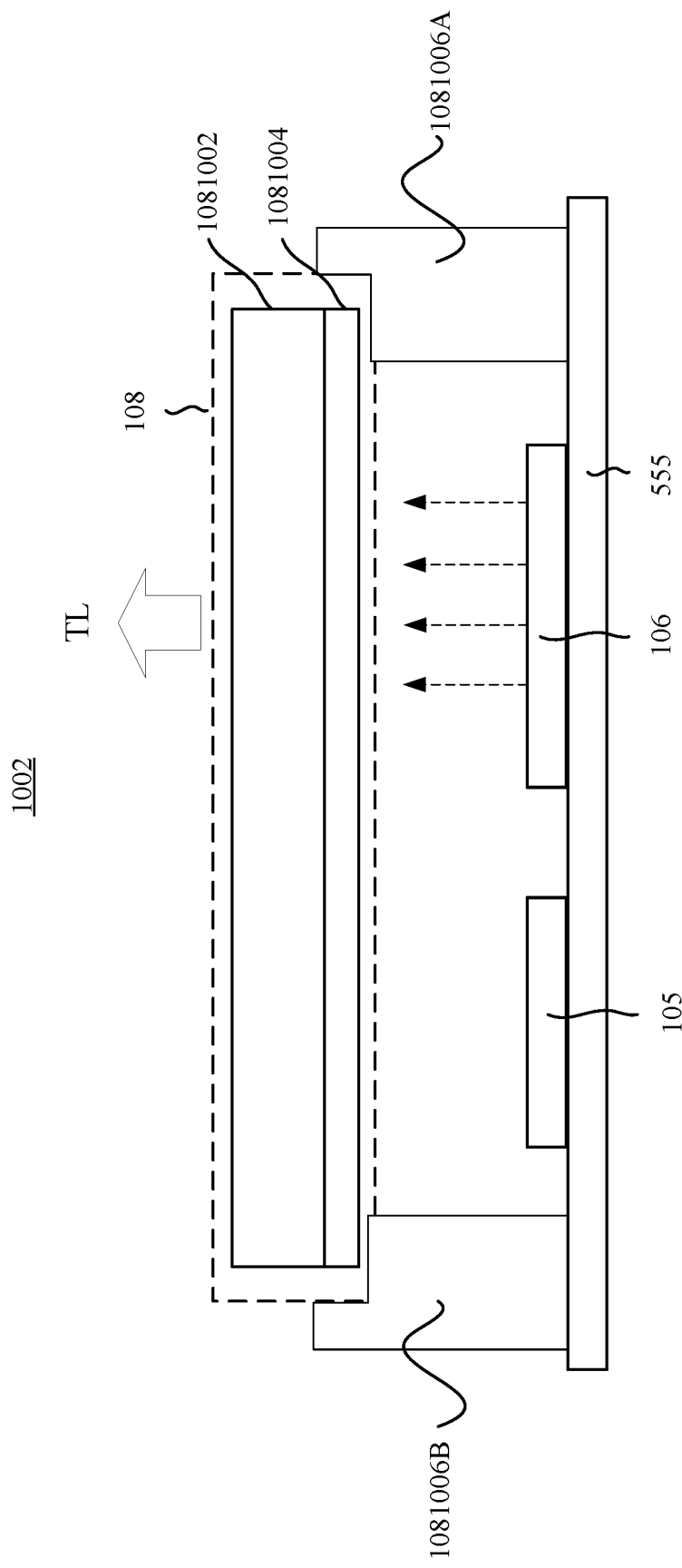

FIG. 10B-1 and FIG. 10B-2 illustrate an embodiment of light emission apparatus 1002, including laser driver 105, laser diode 106, optical module 108 and sub-mount 555. FIG. 10B-2 is the cross-sectional view (Section AA') of the FIG. 10A-1. Specifically, in this embodiment, the laser diode 106 includes a plurality of VESELs, which is a kind of vertical emitting laser. In another implementation, laser diode 106 can implement with single VESEL. Optical module 108, in this embodiment, includes optical cover glass 1081002 and quantum dot coating 1081004. Having the quantum dot coating 1081004 between the surface of the cover glass 1081002 and the laser diode 106, the peak wavelength of the light emitted from the VSESLs can be converted from a shorter peak wavelength to a longer peak wavelength, which is better for eye protection. Sidewall assemblies 1081006A and 1081006B are configured to support the optical module 108. In this embodiment, laser diode 106 is not stacked on laser driver 105, but arranged aside the laser driver 105.

Figure 10C:
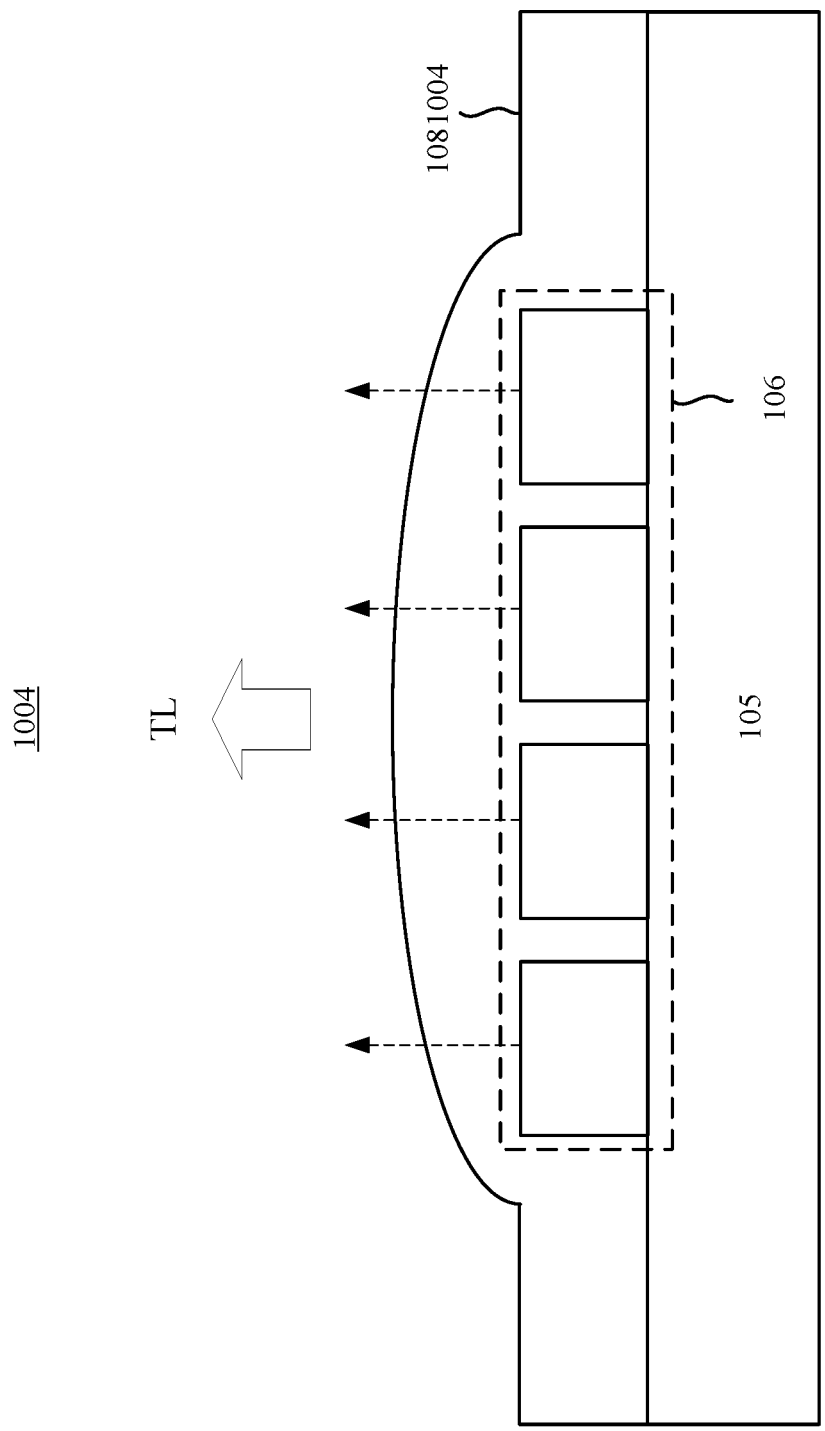

FIG. 10C illustrates an embodiment of light emission apparatus 1004. Further to the light emission apparatuses 1000 and 1002, the quantum dot coating 1081004, in this embodiment, covers on the laser diode 106. Similarly, the laser driver 105 can be arranged underneath the laser diode 106, or be arranged aside the laser diode 106.

Figures 1, 10D:
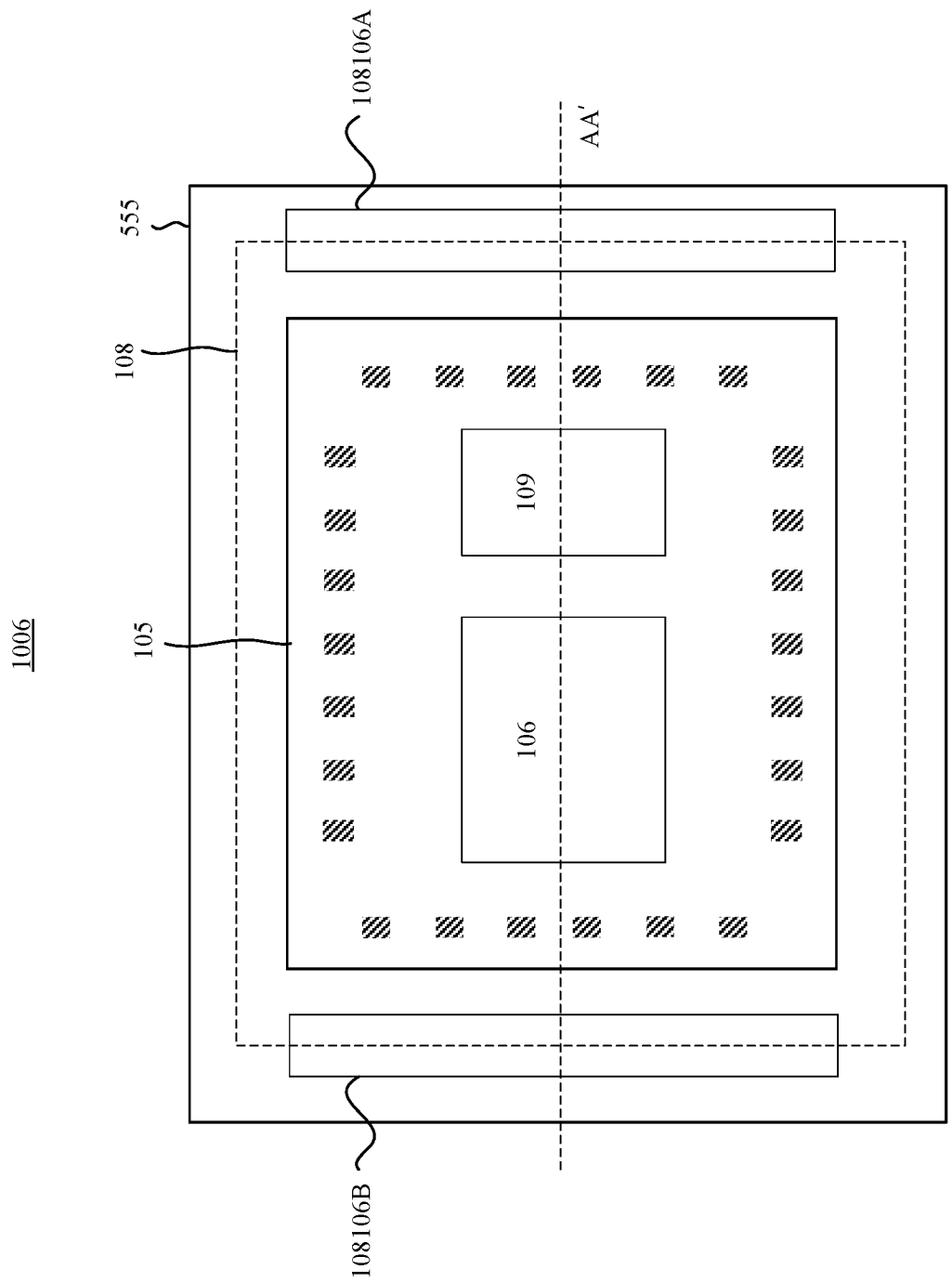
Figures 2, 10D:
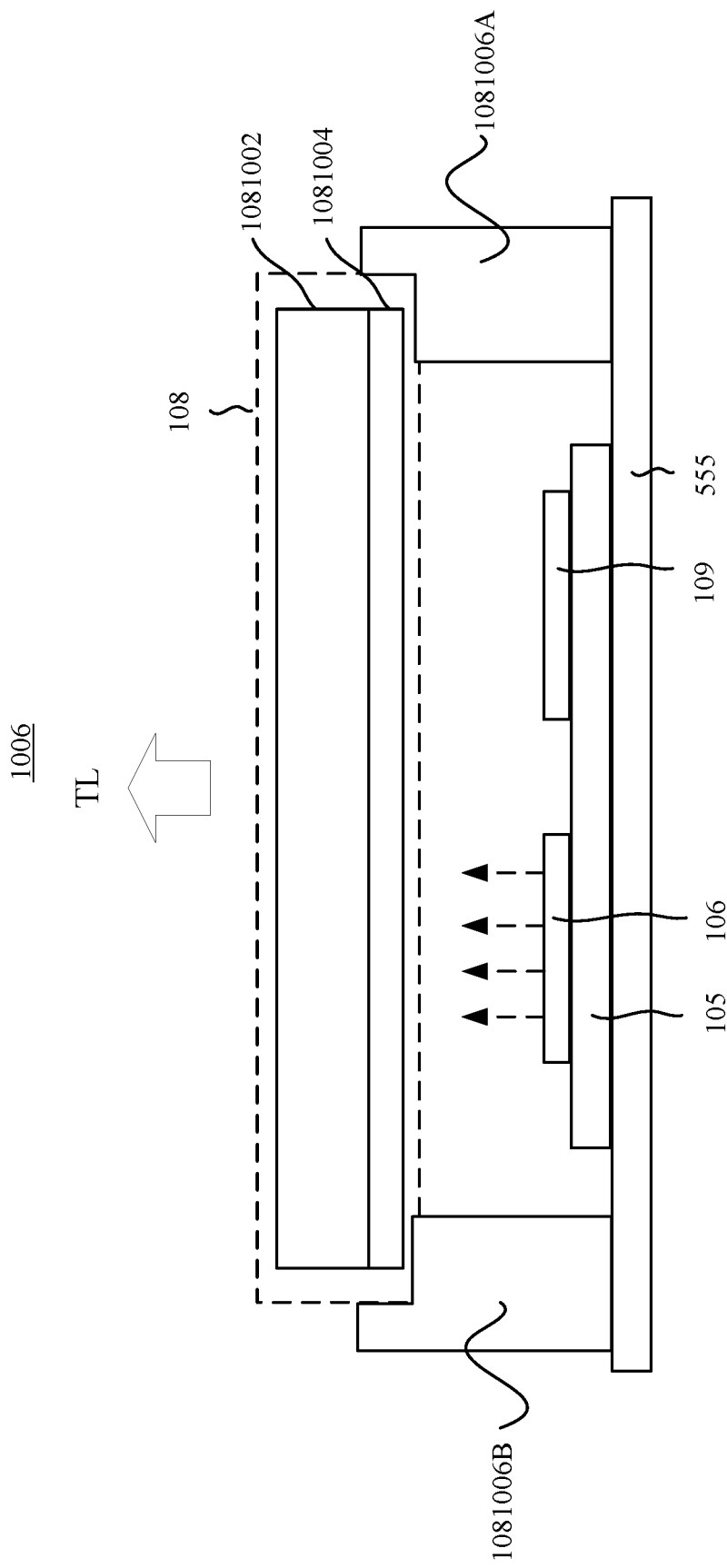

FIG. 10D-1 and FIG. 10D-2 illustrate an embodiment of light emission apparatus 1006, including laser driver 105, laser diode 106, optical module 108, photodetector 109 and sub-mount 555. FIG. 10D-2 is the cross-sectional view (Section AA') of the FIG. 10D-1. Specifically, in this embodiment, the photodetector 109 is introduced for eye-safety. The photodetector 109 is configured to detect if any residual light reflected from the optical module 108 to determine whether the optical module 108 is fallen off. For example, if the optical module 108 is fallen off, the light generated from laser diode 106 will be nearly-all emitted to the air, no light will be reflected to the photodetector 109. On the contrary, if the optical module 108 is not fallen off, most of the light generated from the laser diode 106 will still be transmitted over the optical module 108, but a small portion of the light generated from the laser diode 106 will be reflected by the optical module 108 and will be detected by the photodetector 109. Therefore, the light emission apparatus 1006 may turn off the light or alert the system when detecting the optical module 108 is fallen off.

Figures 1, 10E:
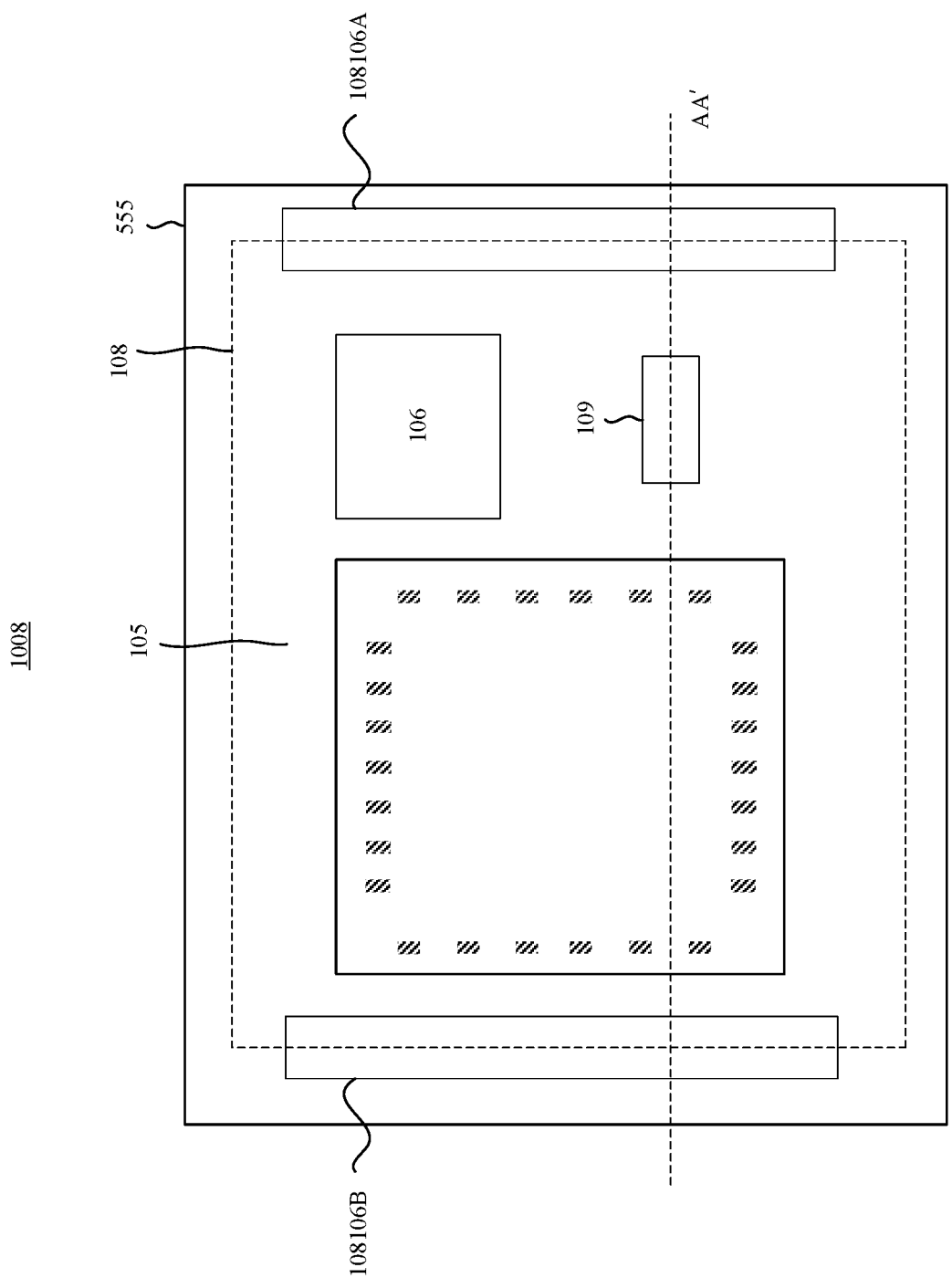
Figures 2, 10E:
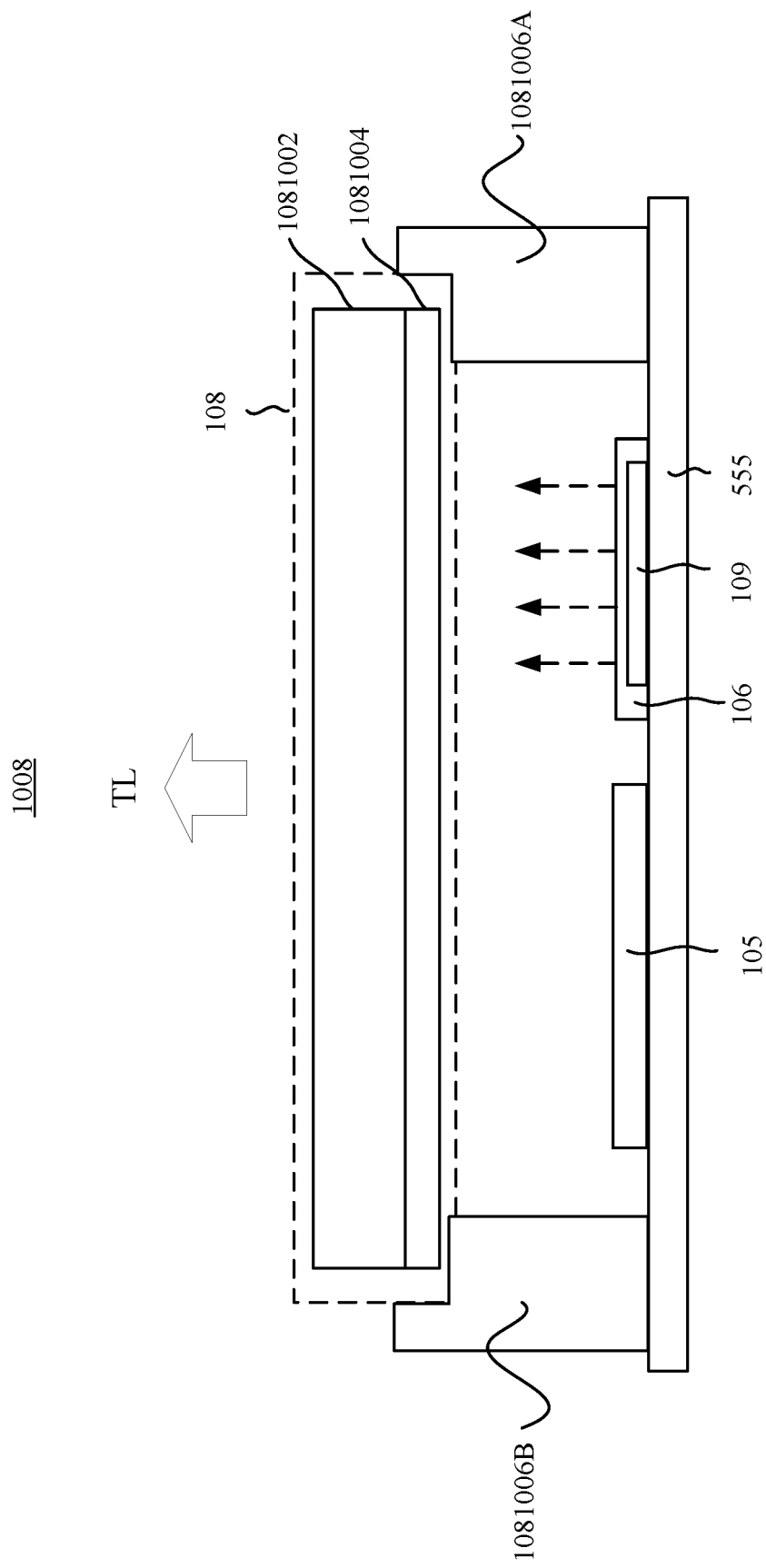

Similar to the light emission apparatus 1006, FIG. 10E-1 and FIG. 10E-2 illustrate an embodiment of light emission apparatus 1008, including photodetector 109 for eye-safety as well. Compared to light emission apparatus 1006, laser driver 105 and laser diode 106 in this embodiment are not stacked. Laser driver 105, laser diode 106 and photodetector 109 are arranged aside to each other as illustrated in FIG. 10E-1 and FIG. 10E-2. In another implementation, the quantum dot coating 1081004 can be removed.

Figure 10F:
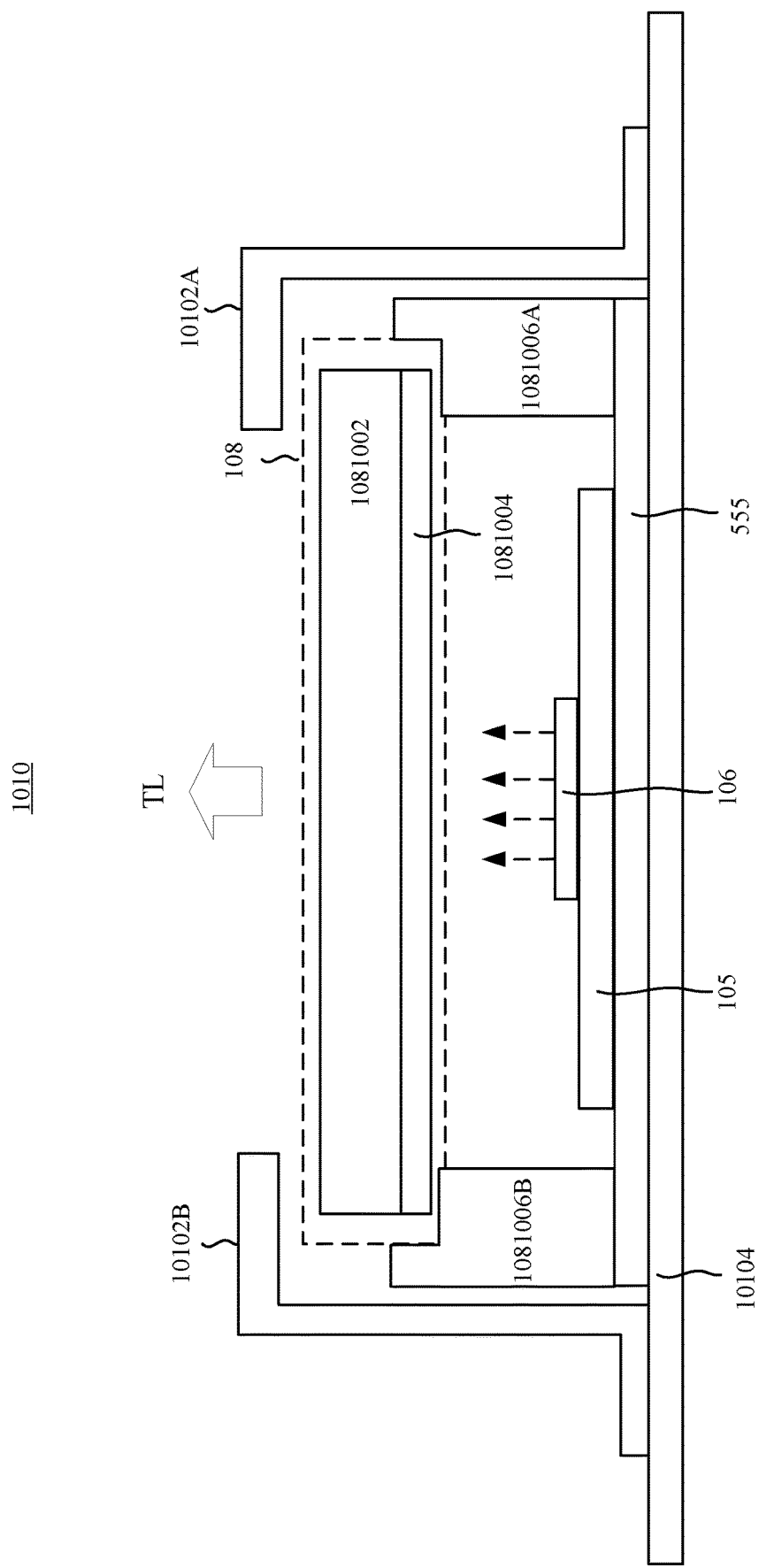

FIG. 10F illustrates an embodiment of light emission apparatus 1010, including laser driver 105, laser diode 106, optical module 108, sub-mount 555, printed circuit board (PCB) 10104, sidewall assemblies 1081006A and 1081006B, conductive cages 10102A and 10102B. In this embodiment, conductive cages 10102A and 10102B are configured to secure the optical module 108. Besides, conductive cages 10102A and 10102B are conductive materials and electrically coupled to the PCB 10104. When optical module 108, conductive cage 10102A or conductive cage 10102B is accidentally fallen off, the detecting circuit on the PCB can detect the resistance change and further to stop the illumination or alert the system. In this embodiment, light emission apparatus 1010 utilizes resistive sensing on mechanical casing to perform eye-safety function.

Figures 2, 10G:
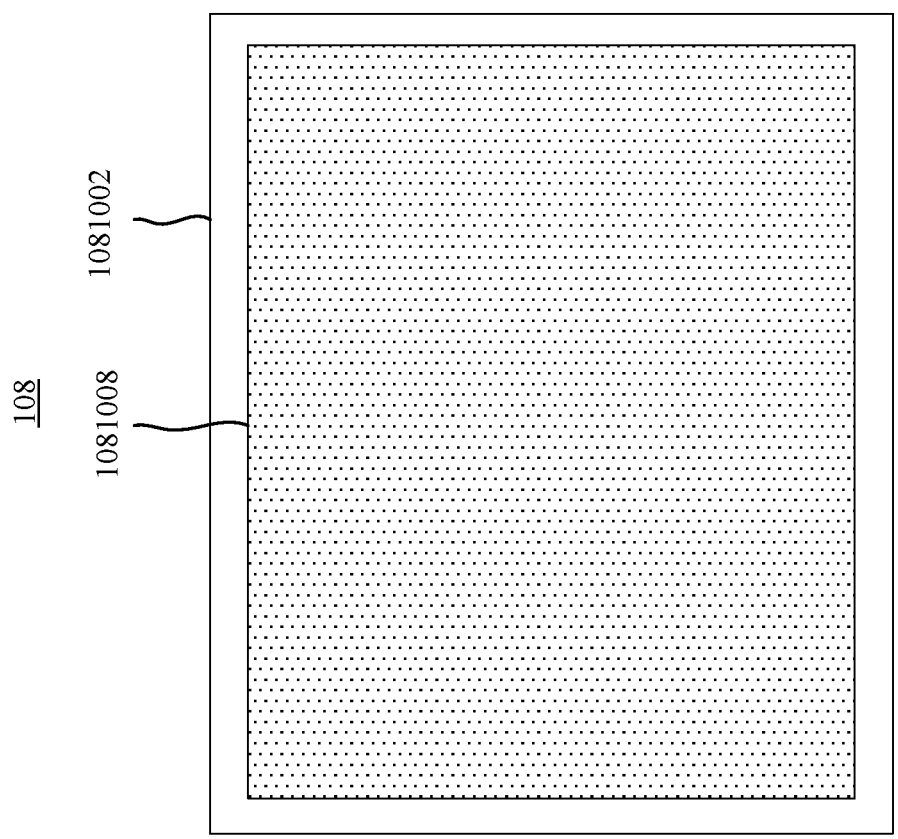

FIG. 10G-1 illustrates an embodiment of light emission apparatus 1012, including laser driver 105, laser diode 106, optical module 108, sub-mount 555, printed circuit board (PCB) 10104, sidewall assemblies 1081006A and 1081006B, wherein optical module 108 includes optical cover glass 1081002 and conductive coating material 1081008. In this embodiment, sidewall assemblies 1081006A and 1081006B are conductive. The conductive coating material 1081008 is transparent to the light emitted from the laser diode 106 and does not absorb light emitted from the laser diode. The conductive coating material 1081008 could be indium tin oxide (ITO), fluorine doped tin oxide (FTO), doped zinc oxide, doped semiconductor, transparent conductive polymer, etc. Due to the sidewall assemblies 1081006A and 1081006B and conductive coating material 1081008 are conductive and electrically coupled to each other, once the optical module 108, sidewall assembly 1081006A or sidewall assembly 1081006B is accidentally fallen off, the detecting circuit on PCB can detect the resistance change and further to stop the illumination or alert the system. In this embodiment, light emission apparatus 1010 utilizes resistive sensing on glass coating to perform eye-safety function.

Figures 3, 10G:
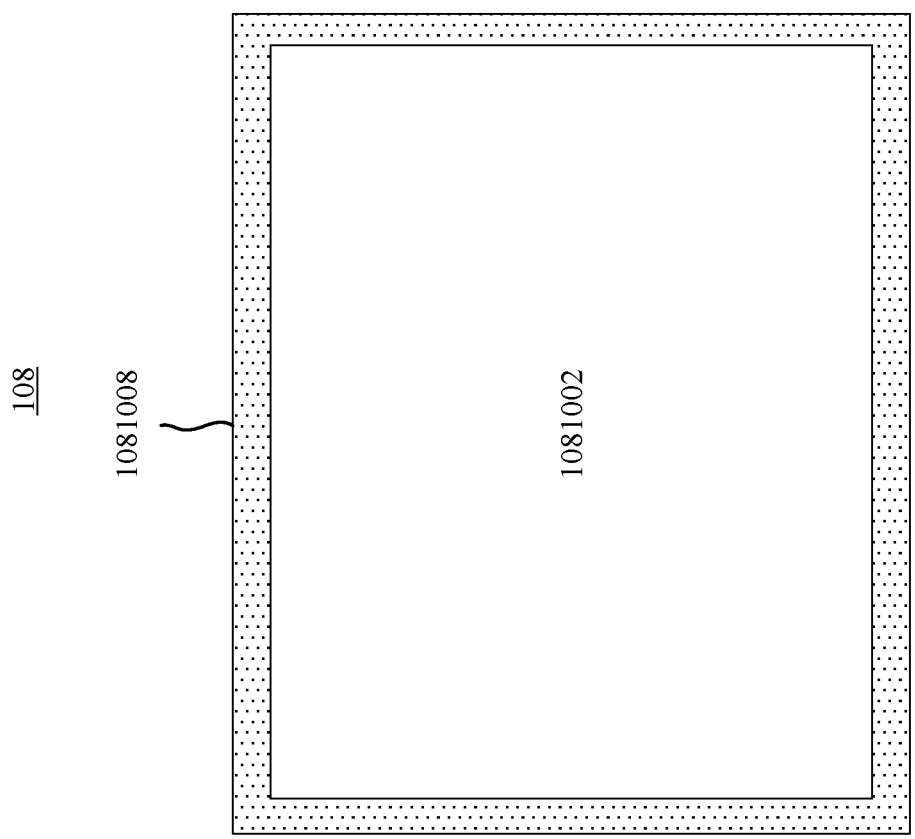

FIG. 10G-2 illustrates the alternative embodiment of optical module 108, which is depicted from the bottom view. In FIG. 10G-2, the pattern of conductive coating material 1081008 is a plane and coating on the optical cover glass 1081002. The pattern of conductive coating material 1081008 could be other shapes, such as, FIG. 10G-3, the pattern is a ring surrounding the optical cover glass 1081002. In other implementation, the pattern can be a mesh coating on the optical cover glass 1081002.

As above-mentioned eye-safety approaches, it contains using photodetector, resistance change detection on cages or conductive coating material. Furthermore, below embodiments illustrate the combination thereof.

FIG. 10H illustrates an embodiment of light emission apparatus 1014. This embodiment combines the features of light emission apparatuses 1006, 1010 and 1012, which integrates photodetector 109, conductive cages 10102A and 10102B and conductive coating material 1081008. These elements are used for implementing eye-safety function. Its operations have been described in aforementioned embodiments; the relevant descriptions are omitted for sake of brevity.

FIG. 10I illustrates an embodiment of light emission apparatus 1016. This embodiment also combines the features of light emission apparatuses 1006, 1010 and 1012, which integrates photodetector 109, conductive cages 10102A and 10102B and conductive coating material 1081008. These elements are used for implementing eye-safety function. Compared to the light emission apparatus 1014, the conductive coating material 1081008 in this embodiment is coated on the top surface of the optical cover glass 1081002, rather than the bottom surface of the optical cover glass 1081002.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emission apparatus, comprising:
   a first sub-mount comprising a platform;
   a laser diode arranged on the platform and configured to emit a light;
   a laser driver arranged on the platform and electrically coupled to the laser diode, the laser driver being configured to drive the laser diode to generate the light;
   a second sub-mount configured to support the first sub-mount; and
   an optical module arranged to receive the light emitted by the laser diode, the optical module comprising at least one optical element and being configured to adjust the light and a transmitting light with an illumination angle, wherein the optical module is configured to adjust the light to vary the illumination angle, wherein the laser driver is programmed to either entirely or partially flash and scan a three-dimensional (3D) target with the emitted light.

2. The light emission apparatus of claim 1, wherein the optical module further comprises:
an optical power splitter arranged to receive the light emitted by the laser diode, to split the received light along two or more paths, the optical element of the optical module being arranged in a corresponding one of the paths;
two or more phase shifters each arranged in a corresponding one of the two or more paths, each phase shifter being configured to adjust a phase delay of each the light propagating along the corresponding one of the two or more paths; and
two or more optical elements including the at least one optical element, the two or more optical elements being vertical grating couplers each arranged to receive a light from a corresponding one of the phase shifters, each vertical grating coupler being configured to direct the light received from the corresponding phase shifter along a predetermined direction, thereby adjusting the illumination angle of the light emission apparatus.

3. The light emission apparatus of claim 2, wherein each vertical grating coupler receives light from the corresponding first optical element at a first edge and the optical module further comprises two or more reflectors, each reflector corresponding to one of the vertical grating couplers and arranged at a second edge of the vertical grating coupler opposite the first edge, each reflector being configured to reflect a residual light transmitted by the vertical grating coupler back to a grating region of the vertical grating coupler.

4. The light emission apparatus of claim 3, wherein the reflectors are corner reflectors or distributed Bragg reflectors.

5. The light emission apparatus of claim 1, wherein the laser diode is an edge-emitting laser diode.

6. The light emission apparatus of claim 5, wherein the at least one optical element of the optical module further comprises:
a waveguide configured to guide the light emitted from the laser diode;
a grating coupler arranged to receive light from the waveguide and configured to adjust a direction of the light received from the waveguide; and
a phase shifter arranged between the laser diode and the grating coupler and configured to adjust a phase delay of guided light inside the waveguide.

7. The light emission apparatus of claim 5, wherein the edge-emitting laser diode and the optical module are parts of an integrated photonic circuit.

8. The light emission apparatus of claim 5, wherein the edge-emitting laser diode and the optical module are separate components.

9. The light emission apparatus of claim 5, wherein the at least one optical element of the optical module further comprises a shaped optical element including a 45-degree mirror or a concave mirror.

10. The light emission apparatus of claim 9, wherein the at least one optical element of the optical module further comprises a micro-lens.

11. The light emission apparatus of claim 1, wherein the laser diode comprises a cladding layer formed based on a material, and wherein the at least one optical element of the optical module is formed based on the material.

12. The light emission apparatus of claim 11, wherein the material comprises InGaAlP.

13. The light emission apparatus of claim 1, wherein the laser diode comprises a cladding layer formed based on a first material, and wherein the at least one optical element of the optical module is formed based on a second material.

14. The light emission apparatus of claim 13, wherein the second material comprises silicon.

* * * * *